(12) United States Patent
Su et al.

(10) Patent No.: US 12,278,273 B2
(45) Date of Patent: Apr. 15, 2025

(54) SEMICONDUCTOR DEVICE WITH BACKSIDE GATE ISOLATION STRUCTURE AND METHOD FOR FORMING THE SAME

(71) Applicant: Taiwan Semiconductor Manufacturing Company, Ltd., Hsin-Chu (TW)

(72) Inventors: Huan-Chieh Su, Changhua County (TW); Chun-Yuan Chen, Hsinchu (TW); Li-Zhen Yu, New Taipei (TW); Lo-Heng Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/520,730

(22) Filed: Nov. 28, 2023

(65) Prior Publication Data

US 2024/0096996 A1    Mar. 21, 2024

Related U.S. Application Data

(63) Continuation of application No. 17/464,146, filed on Sep. 1, 2021, now Pat. No. 11,901,428.

(Continued)

(51) Int. Cl.
*H01L 29/423* (2006.01)
*H01L 21/8234* (2006.01)
(Continued)

(52) U.S. Cl.
CPC .......... *H01L 29/42392* (2013.01); *H01L 21/823418* (2013.01); *H01L 29/0649* (2013.01);
(Continued)

(58) Field of Classification Search
CPC ......... H01L 21/02603; H01L 21/76224; H01L 21/823418; H01L 21/823431;
(Continued)

(56) References Cited

U.S. PATENT DOCUMENTS 9,754,840 B2   9/2017 Lin et al.
9,818,872 B2   11/2017 Ching et al.
(Continued)

*Primary Examiner* — David C Spalla
(74) *Attorney, Agent, or Firm* — HAYNES AND BOONE, LLP

(57) ABSTRACT

A semiconductor device includes a first dielectric layer, a stack of semiconductor layers disposed over the first dielectric layer, a gate structure wrapping around each of the semiconductor layers and extending lengthwise along a direction, and a dielectric fin structure and an isolation structure disposed on opposite sides of the stack of semiconductor layers and embedded in the gate structure. The dielectric fin structure has a first width along the direction smaller than a second width of the isolation structure along the direction. The isolation structure includes a second dielectric layer extending through the gate structure and the first dielectric layer, and a third dielectric layer extending through the first dielectric layer and disposed on a bottom surface of the gate structure and a sidewall of the first dielectric layer.

20 Claims, 48 Drawing Sheets

Related U.S. Application Data

(60) Provisional application No. 63/151,405, filed on Feb. 19, 2021.

(51) Int. Cl.
  *H01L 29/06* (2006.01)
  *H01L 29/66* (2006.01)
  *H01L 29/786* (2006.01)

(52) U.S. Cl.
  CPC .... *H01L 29/0665* (2013.01); *H01L 29/66742* (2013.01); *H01L 29/78618* (2013.01); *H01L 29/78696* (2013.01)

(58) Field of Classification Search
  CPC ..... H01L 21/823821; H01L 21/823481; H01L 21/823878; H01L 21/845; H01L 27/0886; H01L 27/0924; H01L 27/1211; H01L 29/0649; H01L 29/0665; H01L 29/0669; H01L 29/0673; H01L 29/41791; H01L 29/42392; H01L 29/66439; H01L 29/66545; H01L 29/66742; H01L 29/66795; H01L 29/775; H01L 29/785; H01L 29/7851; H01L 29/7853; H01L 29/7855; H01L 29/78618; H01L 29/78696; H01L 2029/7858

See application file for complete search history.

(56) References Cited

U.S. PATENT DOCUMENTS

| | | |
|---|---|---|
| 10,032,627 B2 | 7/2018 | Lee et al. |
| 10,242,920 B2 | 3/2019 | Guillorn et al. |
| 10,290,546 B2 | 5/2019 | Chiang et al. |
| 10,475,902 B2 | 11/2019 | Lee et al. |
| 10,679,906 B2 | 6/2020 | Cheng et al. |
| 10,950,731 B1 | 3/2021 | Peng et al. |
| 11,031,292 B2 | 6/2021 | Ju et al. |
| 2020/0043802 A1 | 2/2020 | Cheng et al. |
| 2020/0266192 A1* | 8/2020 | Ju ................... H01L 21/823431 |
| 2021/0020644 A1* | 1/2021 | Paul ................ H01L 21/28123 |
| 2021/0242331 A1* | 8/2021 | You ................ H01L 21/823431 |
| 2021/0328010 A1* | 10/2021 | Kim ................ H01L 29/42392 |
| 2022/0093474 A1* | 3/2022 | Mishra ................. B82Y 10/00 |
| 2022/0399373 A1* | 12/2022 | Guler ................ H01L 29/0673 |

* cited by examiner

120
SEMICONDUCTOR DEVICE WITH BACKSIDE GATE ISOLATION STRUCTURE AND METHOD FOR FORMING THE SAME

PRIORITY DATA

This application is a continuation of U.S. Non-Provisional patent application Ser. No. 17/464,146, filed on Sep. 1, 2021, and entitled "Semiconductor Device with Backside Gate Isolation Structure and Method for Forming the Same," which claims priority to U.S. Provisional Patent Application No. 63/151,405, filed on Feb. 19, 2021, and entitled "Semiconductor Device with Backside Gate Isolation Structure and Method for Forming the Same," each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor fabrication, cut metal gate (CMG) process refers to a process for forming an isolation structure to divide a continuous gate electrode that spans over multiple active regions into more than one segment. Such an isolation structure may be referred to as a gate cut feature, a cut feature, or a CMG feature. In some existing CMG processes, a gate cut feature is formed on a dielectric fin (or a hybrid fin (HF)). With the gate cut feature on top and the dielectric fin on bottom, they collectively segregate the gate electrode into segments. In some example processes, the gate cut feature is formed using photolithography and etch processes from a front side of a substrate (such as a wafer). As the scaling down of semiconductor device continues, the use of such dielectric fins has been increasingly restricting the ability to further reduce cell heights and/or to maintain a reasonable processing window. Accordingly, although existing CMG processes are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 19B, 20B, 21B, 22B, 23B, 24B, 25B, 25B-1, 25B-2, 25B-3, 25B-4, 26B, and 26B-1 are fragmentary cross-sectional views of a workpiece along the B-B' line of the respective FIGS. 19A, 20A, 21A, 22A, 23A, 24A, 25A, and 26A during a fabrication process according to the method of FIGS. 1A-1C, according to one or more aspects of the present disclosure.

FIGS. 24C, 25C, 25C-1, 25C-2, 25C-3, 26C, and 27 are fragmentary cross-sectional views of a workpiece along the C-C' line of the respective FIGS. 19A, 20A, 21A, 22A, 23A, 24A, 25A, and 26A during a fabrication process according to the method of FIGS. 1A-1C, according to one or more aspects of the present disclosure.

DETAILED DESCRIPTION

Figure 1A:
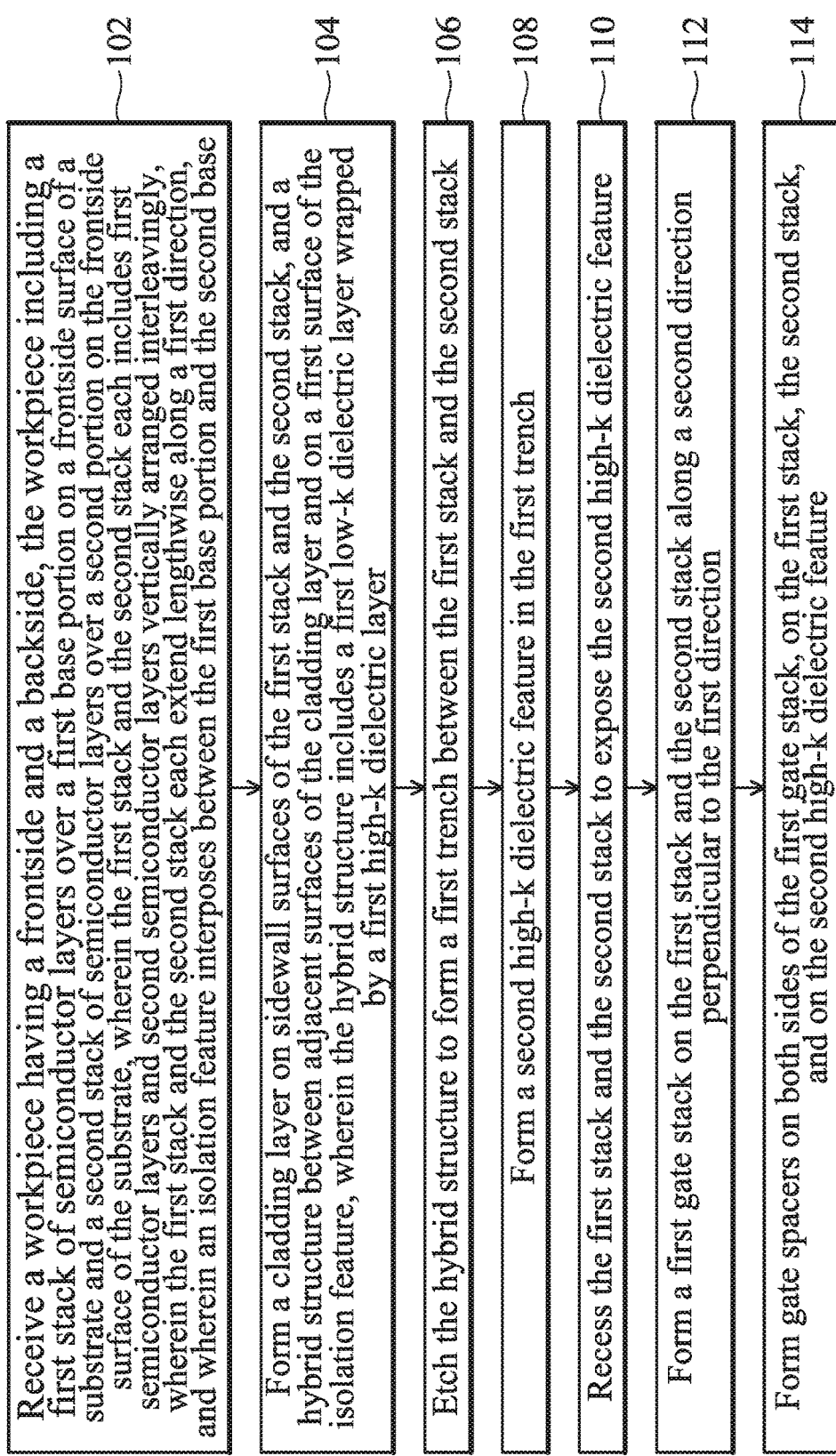
FIGS. 1A, 1B, and 1C illustrate a flow chart of a method for forming a semiconductor device with a gate cut feature formed from a backside of the semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to ICs and semiconductor devices as well as methods of forming the same. More particularly, the present disclosure is related to gate isolation structures for ICs and semiconductor devices. In semiconductor fabrication, cut metal gate (CMG) process refers to a process for forming a dielectric feature to divides a continuous gate structure that spans over more than one active region into two or more segments. Such a dielectric feature may be referred to as a gate cut feature or a cut feature. In some existing CMG processes, a gate cut feature is formed on a dielectric fin (or a hybrid fin (HF)). With the gate cut feature on top and the dielectric fin on bottom, they work in synergy to separate a gate structure into two segments. In some example processes, the gate cut feature is formed using photolithography and etch processes from a front side (or frontside) of a substrate (such as a wafer). As the scaling down of semiconductor device continues, the use of such dielectric fins has been increasingly restricting the ability to further reduce cell heights and/or to maintain a reasonable processing window. Accordingly, although existing CMG processes are generally adequate for their intended purposes, they are not satisfactory in all aspects.

The present disclosure provides CMG processes that, unlike existing technologies, forms a cut feature from a back side (or backside) of the substrate. Additionally, the cut feature according to the present disclosure extends from the backside of the substrate through the gate structure. That is, the cut feature of the present disclosure alone divides the gate structure into segments without help from a dielectric fin or a hybrid fin. In some instances, the cut feature of the present disclosure may even extend horizontally through more than one gate structures or extend vertically through one or more dielectric features or layers over the gate structure. Processes of the present disclosure are not only formed from the backside but are also self-aligned to avoid defects associated with mask misalignment. Embodiments of the present disclosure may continue the scaling down of cell heights while maintaining or increasing the process window.

In one example, the present disclosure may be implemented in nanosheet-based semiconductor devices. In that regard, nanosheet-based devices (sometimes interchangeably referred to as gate-all-around (GAA) devices, multi-bridge-channel (MBC) devices, surrounding gate transistor (SGT), or other similar names) include a plurality of channel layers stacked one on top of another. The channel layers of a nanosheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nanosheet-based devices broadly encompasses devices having channel layers in nanowire, nano-bars, and any other suitable shapes. The channel layers connect a pair of source/drain features such that the charge carriers may flow from the source region to the drain region through the channel layers during the operation (such as when the transistors are turned on). Additionally, inner spacers are formed between the source/drain features and the gate electrodes such that the source/drain features may be shielded from the operations targeting the gate electrodes.

The nanosheet-based devices may include a plurality of fin structure on top (or the front side) of a piece of semiconductor substrate, where each of the plurality of fin structure include the channel layers, the source/drain features, as well as the inner spacers formed thereon. Dielectric fins of low-k dielectric materials are formed between adjacent fin structure. Gate electrodes are formed over and between the channel layers of the fin structure, as well as over the dielectric fins. In some approaches, these dielectric fins serve as the base for subsequently formed gate cut features that, collectively with the dielectric fins, isolate each gate electrode into multiple segments. However, the mere presence of these dielectric fins, due to their close proximity to sidewalls of the channel layers, may restrict the material flows designed to reach the channel layers or sacrificial layers therebetween. For example, during a channel release process, etching chemicals are expected to flow around the top portions of the dielectric fin and reach the sacrificial layers between the channel layers; and byproduct from the etching process is expected to flow around the top portions of the dielectric fin and exit the system. Such restrictions may cause certain areas of the sacrificial layers to remain even after the completion of the channel release process. For another example, in a gate layer deposition process, gate layer precursor materials are expected to flow around the top portions of the dielectric fin in order to reach the spacing between the channel layers and form the gate layers therebetween. Such restrictions may similarly cause areas of spaces to not be completely filled and instead leaving voids. Ultimately, these defects may cause work function shifts and results in undesirable change to the designed threshold voltages.

One route to address the above-described issues associated with the gate isolation scheme is to configure the dielectric fins to be far apart from the sidewalls of the channel layers, which unfortunately impedes with the scaling-down of the cell height. Another route is to trim the dielectric fins to reduce their widths. However, in approaches where the dielectric fins serve as part of the gate isolation structure, such reduced lateral width may lead to degraded time-dependent dielectric breakdown (or TDDB) performances. Accordingly, the present disclosure provides alternative approaches where the gate cut features are formed independent from the dielectric fins. More specifically, the dielectric fins are entirely replaced by new gate cut features, from the backside of the substrate (or from beneath of the substrate). Accordingly, the dielectric fins may be trimmed to allow for further scaling-down, without the concerns over TDDB failures or over those defects described above. Additional advantages are also available, which may include increased processing window, improved performance, and easy integration with power rail on the backside of the cell.

The nanosheet based devices presented herein may be a complementary metal-oxide-semiconductor (CMOS) device, a p-type metal-oxide-semiconductor (PMOS) device, or an n-type metal-oxide-semiconductor (NMOS) device. One of ordinary skill may recognize other examples of semiconductor devices that may benefit from aspects of the present disclosure. Moreover, although the disclosure uses nanosheet-based devices as an example, one of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figure 1B:
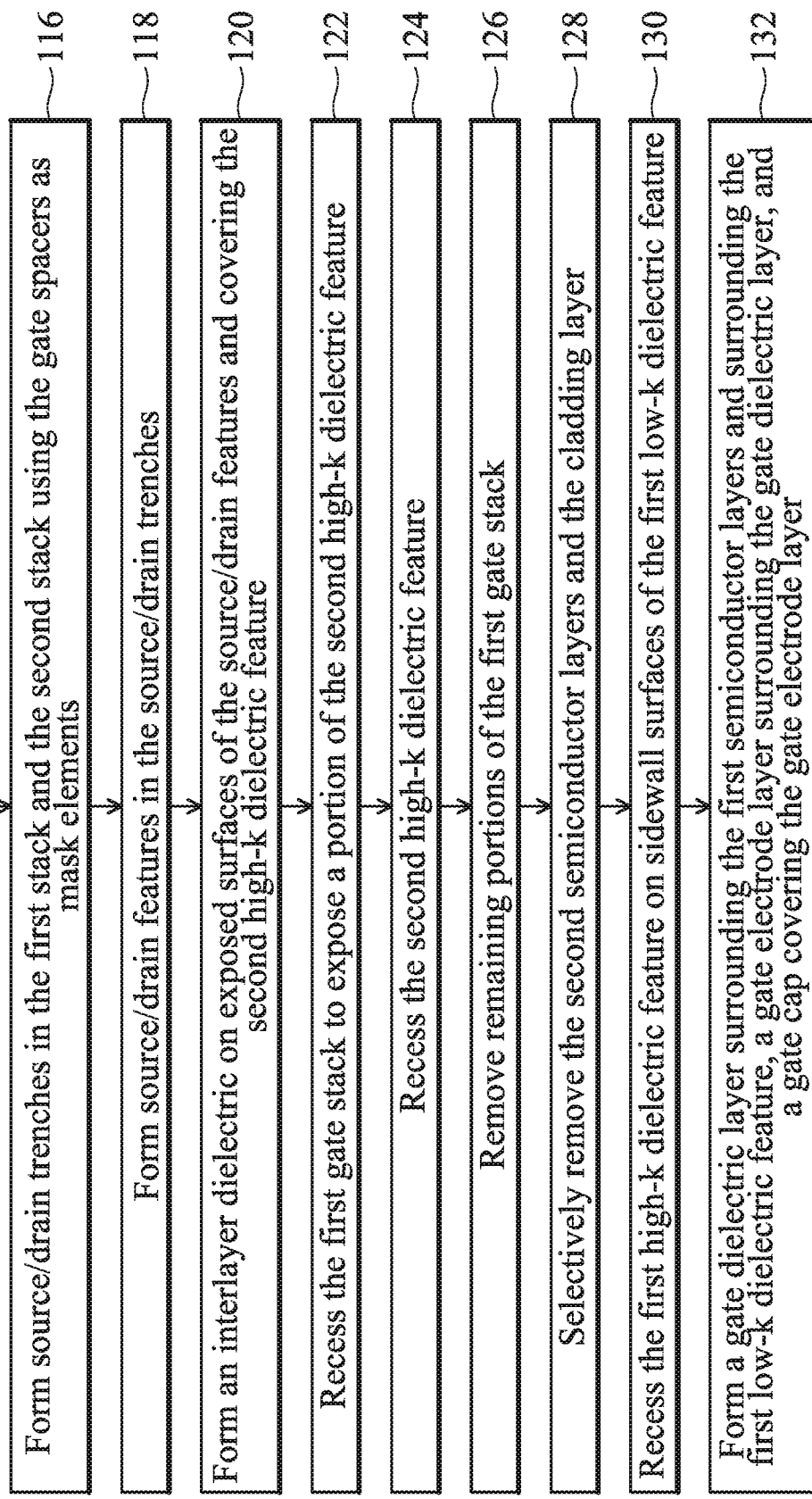
Figure 1C:
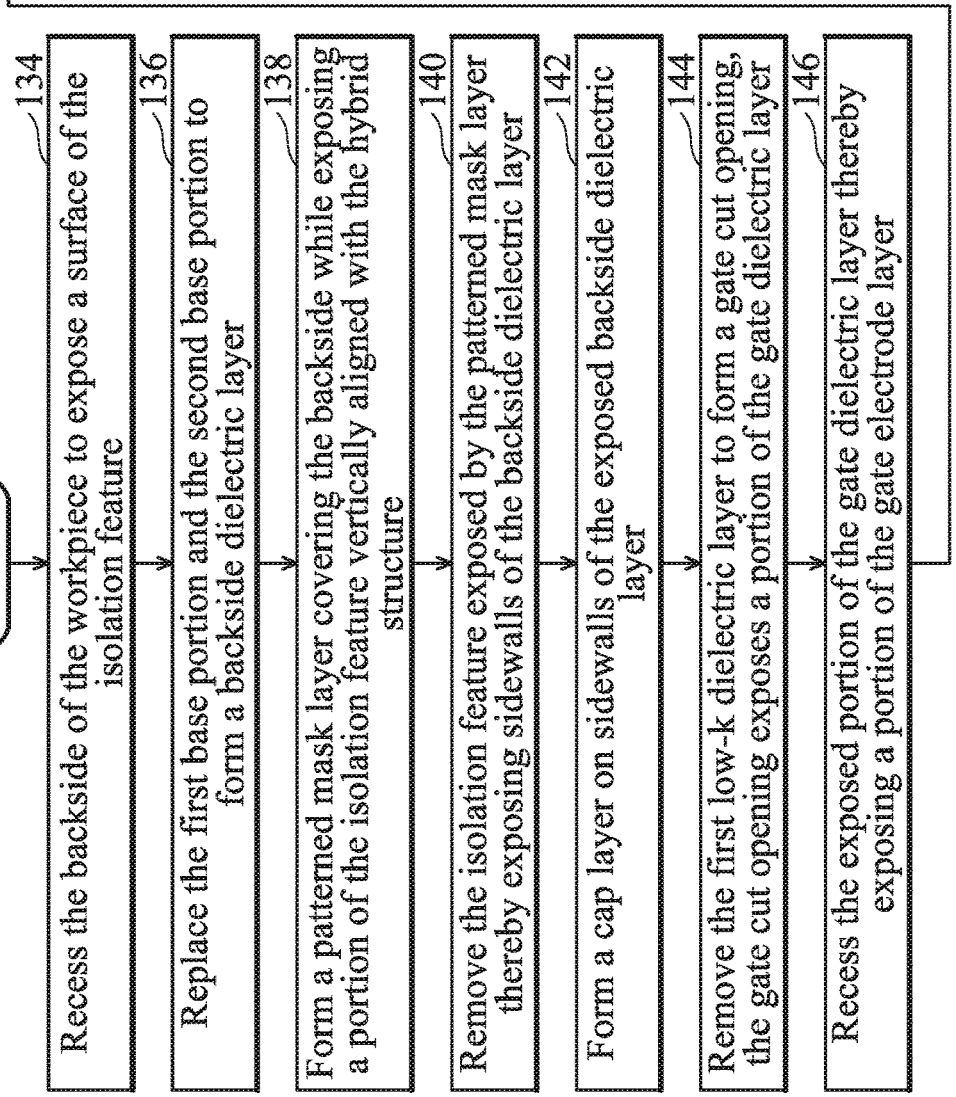

The various aspects of the present disclosure will now be described in more details with reference to the figures. In that regard, FIGS. 1A-1C illustrate a flowchart of method 100 of forming a semiconductor device according to embodiments of the present disclosure. Method 100 is merely an example and is not intended to limit the present disclosure to what is explicitly illustrated in method 100. Additional steps may be provided before, during, or after method 100, and some steps described can be replaced, eliminated, or moved around for additional embodiments of the method. Not all steps are described herein in detail for reasons of simplicity. Method 100 is described below in conjunction with FIGS. 2-18, and 19A-26A are three dimensional (3D) views of a workpiece 200 at different stages of fabrication according to embodiments of method 100. FIGS. 19B-25B, 25B-1. 25B-2, 25B-3. 25B-4, 26B, and 26B-1 are cross-sectional views of the workpiece 200 along the B-B' line of FIGS. 19A-26A, respectively; FIGS. 24C, 25C, 25C-1. 25C-2, 25C-3. 26C, and 27 are cross-sectional views of the workpiece 200 along the C-C' line of FIGS. 25A-26A, respectively. Because the workpiece 200 will be fabricated into a semiconductor device upon conclusion of the fabrication processes, the workpiece 200 may be referred to as the semiconductor device (or device) 200 as the context requires. Additionally, throughout the present application, like reference numerals denote like features, unless otherwise provided.

The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Figure 2:
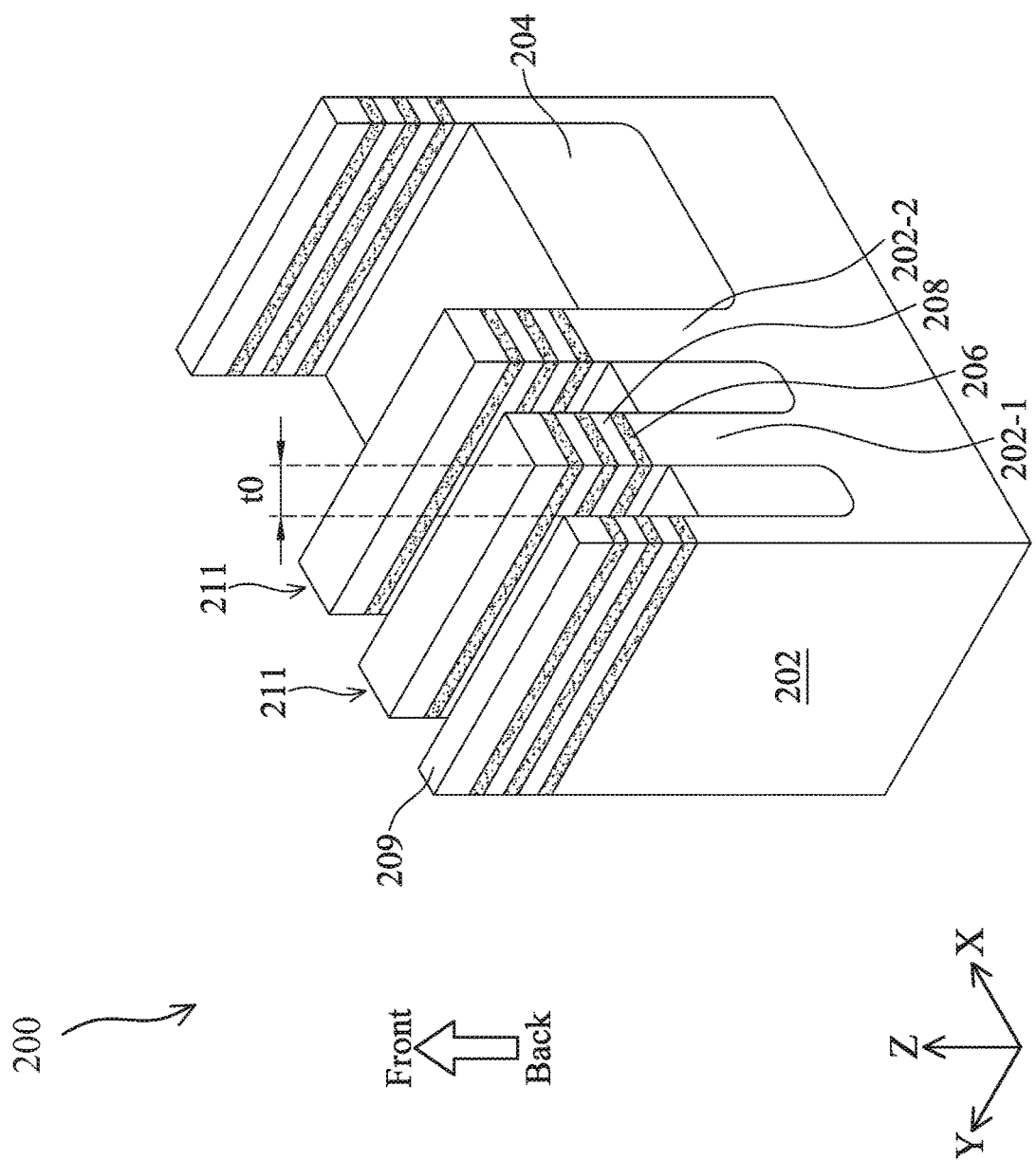
FIGS. 2, 3, 4, 5, 6, 7, 8, 9, 10, 11, 12, 13, 14, 15, 16, 17, 18, 19A, 20A, 21A, 22A, 23A, 24A, 25A, and 26A are three-dimensional (3D) views of a workpiece during a fabrication process according to the method of FIGS. 1A, 1B, and 1C, according to one or more aspects of the present disclosure.

Referring to FIGS. 1A and 2, method 100 includes a block 102 where a workpiece 200 is received. FIG. 2 illustrates the workpiece 200 with its frontside facing up. That is, no backside processes have been yet performed to the workpiece 200 shown in FIG. 2. The workpiece 200 includes a substrate 202. In one embodiment, the substrate 202 includes silicon (Si). In other embodiments, the substrate 202 may also include other semiconductor materials such as germanium (Ge), silicon carbide (SiC), silicon germanium (SiGe), or diamond. The workpiece 200 includes a first base portion 202-1 and a second base portion 202-2, each of which is patterned from the substrate 202 and may share the same composition as the substrate 202. In some embodiments, the base portions 202-1 and 202-2 are spaced apart by a distance t0. In some embodiments, the distance t0 is about 14 nm to about 50 nm. If the distance t0 is too small, such as less than about 14 nm, the isolation between adjacent fins may be insufficient; while if the distance t0 is too large, such as greater than about 50 nm, it may impede with the down-scale process. In some embodiments, distance between different pairs of adjacent fins may be different, as illustrated in FIG. 2. As described later, the distance t0 determines the width of the hybrid fin structure formed therein, along the X-direction. While the substrate 202 is shown in FIG. 2, it may be omitted from at least some of the other figures for simplicity. The first base portion 202-1 and the second base portion 202-2 are spaced apart from one another by an isolation feature 204. In some embodiments, the isolation feature 204 is deposited in trenches between the base portions 202-1 and 202-2 and surrounds the base portions 202-1 and 202-2. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

The workpiece 200 includes a plurality of vertically stacked channel layers 208 over the first base portion 202-1 and another plurality of vertically stacked channel layers 208 over the second base portion 202-2. In the depicted embodiments, two (2) vertically stacked channel layers 208 are disposed over each of the first base portion 202-1 and the second base portion 202-2, which is for illustrative purposes only and not intended to be limiting beyond what is specifically recited in the claims. The channel layers 208 may be formed of a semiconductor material that is similar to the material of the substrate 202. In one embodiment, the channel layers 208 may include silicon (Si). The channel layers 208 are vertically spaced apart from one another, and further spaced apart from the substrate 202, by sacrificial layers 206. The material composition of the sacrificial layers 206 are such that an etching selectivity may be achieved in a subsequent channel release process. For example, in such channel release process, the sacrificial layers 206 may be removed entirely without substantially affecting the channel layers 208. In some embodiments, the sacrificial layers 206 includes silicon germanium (SiGe). In some embodiments, the channel layers 208 each have a thickness that is about 4 nm to about 12 nm. If the thickness of the channel layer is too small, the resistances may be too high; if the thickness is too large, gate control of the middle portions of the channel layers may be weak. The channel layers 208, the sacrificial layers 206, and the base portions 202-1 or 202-2 collectively form fin structures 211. The fin structures 211 are partially separated from each other by the isolation feature 204. Moreover, in some embodiments, the fin structures 211 each further include a layer 209 on top surface of the topmost sacrificial layer 206. The layer 209 may protect the topmost channel layers 208 in subsequent processing.

Figure 3:
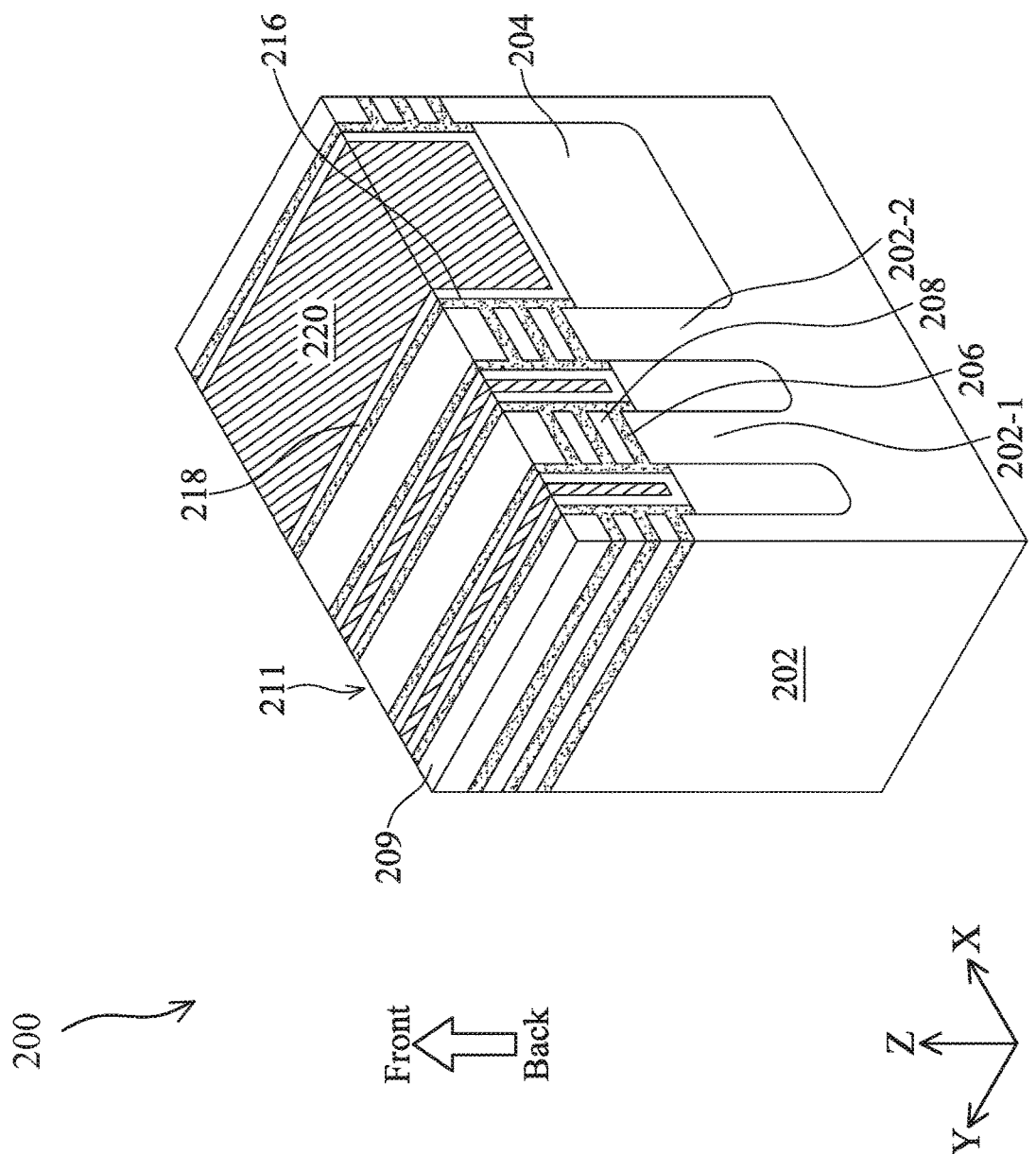

Referring to FIGS. 1A and 3, the method 100 includes a block 104, where cladding layer 216 is formed on sidewall surfaces of the channel layers 208 and the sacrificial layers 206. In some embodiments, the cladding layer 216 may have a composition similar to that of the sacrificial layers 206. This common composition allows efficient selective removal of the sacrificial layers 206 and the cladding layer 216 without adversely affect the channel layers 208 (such as formed of Si) in a subsequent process. In one example, the cladding layer 216 may be formed of SiGe. In some embodiments, the cladding layer 216 may be conformally and epitaxially grown using VPE or MBE, and subsequently etched back to remove portions on top of the fin structures 211 as well as on top of the isolation features 204. In some alternative embodiments, the cladding layer 216 may be deposited using CVD, ALD, other suitable deposition method, or combinations thereof. An example etch back process may be a dry etch process that includes use of plasma of hydrogen bromide (HBr), oxygen ($O_2$), chlorine ($Cl_2$), or mixtures thereof. In some instances, the cladding layer 216 may have a thickness between about 5 nm and about 10 nm.

Moreover, a dielectric layer 218 is formed on sidewall surfaces of the cladding layer 216, as well as on top surfaces of the isolation features 204. In some embodiments, the dielectric layer 218 may include a material having a k value greater than that of the silicon dioxide. In some embodiments, the dielectric layer 218 may include a material having a k value that is greater than about 7. Accordingly, the dielectric layer 218 may alternatively be referred to as the high-k dielectric layer 218. In some embodiments, the dielectric layer 218 may include hafnium oxide (HfO$_2$), hafnium zirconium oxide (HfZrO), tantalum oxide (Ta$_2$O$_5$), hafnium silicon oxide (HfSiO$_x$), hafnium aluminum oxide (HfAlO$_x$), zirconium oxide (ZrO$_2$), aluminum oxide (Al$_2$O$_3$), other suitable high-k materials, or combinations thereof. In some embodiments, the dielectric layer 218 is formed by conformally depositing the high-k dielectric material on top surfaces of the workpiece 200. In some embodiments, the dielectric layer 218 may have a thickness of about 2 nm to about 6 nm.

Furthermore, another dielectric layer 220 is formed on and between portions of the dielectric layers 218. In some embodiments, the dielectric layer 220 may include a material having a k value that is less than about 7, and may therefore be interchangeably referred to as the low-k dielectric layer 220. For example, in some embodiments, the dielectric layer 220 may include silicon carbonitride (SiCN), silicon oxycarbide (SiOC), silicon oxycarbonitride (SiOCN). In some embodiments, a chemical mechanical polishing operation (CMP) is conducted to remove materials on and above the top surfaces of the layer 209, and planarize the top surface of the workpiece 200. Accordingly, portions of the dielectric layer 218 on top surfaces of the layer 209 is removed.

Figure 4:
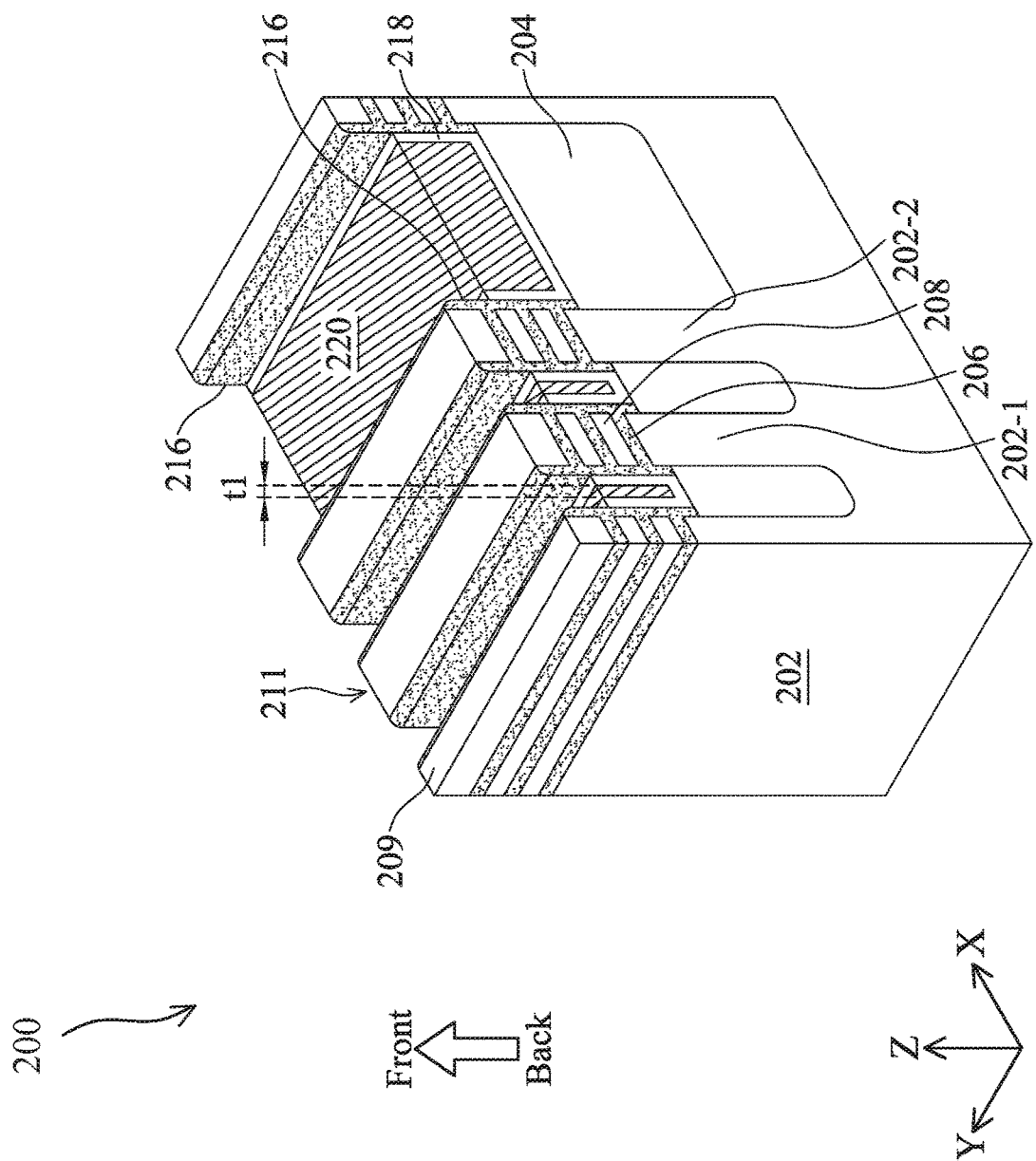

Referring to FIGS. 1A and 4, the method 100 includes a block 106 wherein dielectric layers 218 and 220 are vertically recessed such that top surfaces of the dielectric layers 218 and 220 extend lower than the top surfaces of the layer 209, thereby forming trenches therebetween. In some embodiments, the recessed surfaces of the dielectric layers 218 and 220 extend below a bottom surface of the layer 209 but above a bottom surface of the topmost sacrificial layer 206. For example, in the depicted embodiments, the recessed surfaces of the dielectric layers 218 and 220 extend approximately along a top surface of the topmost channel layer 208 and the bottom surface of the topmost sacrificial layer 206. As will be described, a dielectric material different from that of the dielectric layer 220 are subsequently formed on the top surface thereby forming a hybrid fin structure. In some circumstances, having the material interface at this height level relative to the channel layers allow proper formation of gate cut features from this combination of dielectric materials without complicated processing.

Figure 5:
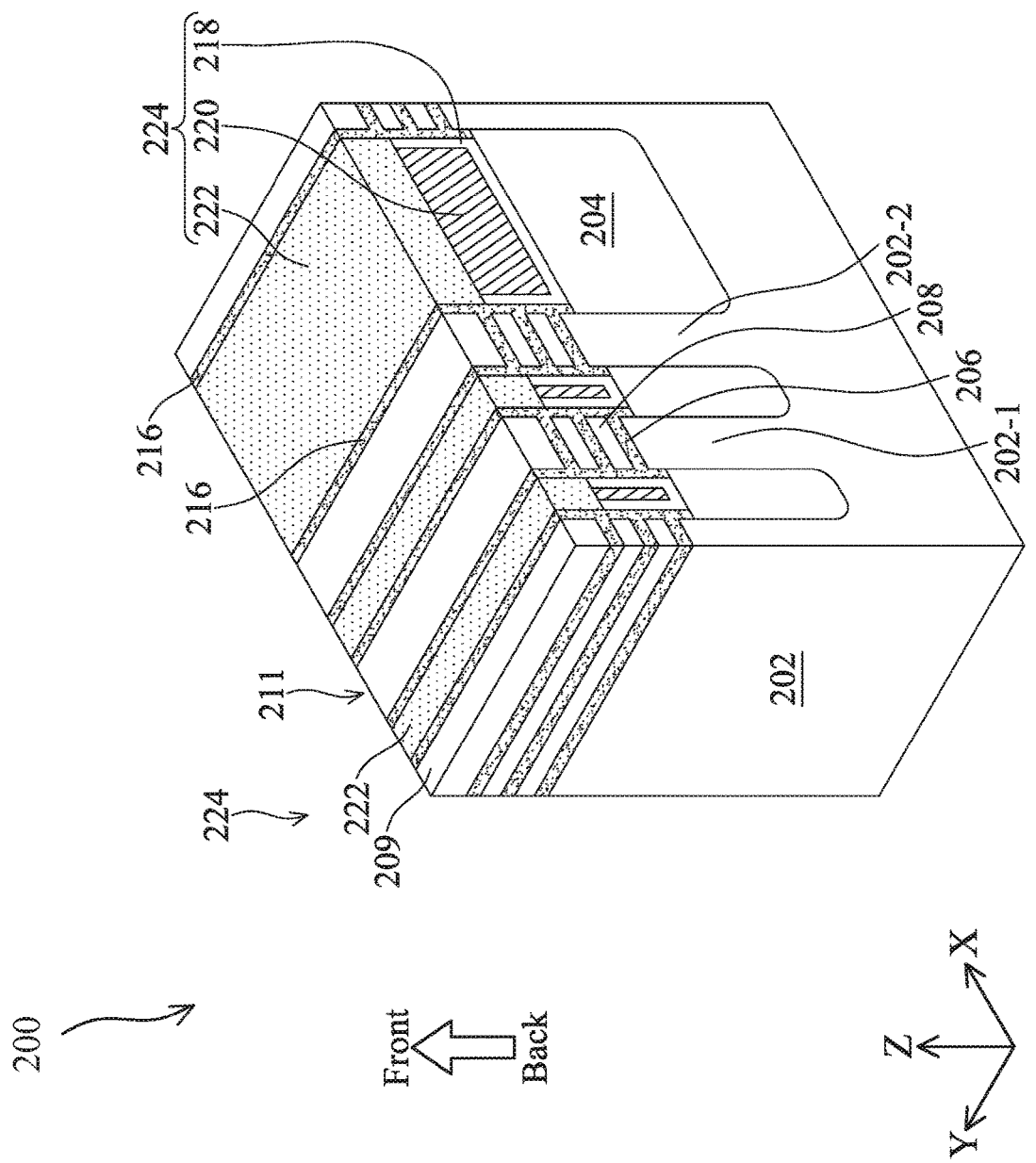

Referring to FIGS. 1A and 5, the method 100 includes a block 108 where another dielectric layer 222 is formed within the trenches between the adjacent layers 209 (such as between portions of the cladding layer 216). In some embodiments, the dielectric layer 222 may include hafnium oxide (HfO$_2$), hafnium zirconium oxide (HfZrO), tantalum oxide (Ta$_2$O$_5$), hafnium silicon oxide (HfSiO$_x$), hafnium aluminum oxide (HfAlO$_x$), zirconium oxide (ZrO$_2$), aluminum oxide (Al$_2$O$_3$), other suitable high-k materials, or combinations thereof. In other words, the dielectric layer 222 may also be a high-k dielectric layer. In some embodiments, the materials of the dielectric layer 222 may be the same as or similar to that of the dielectric layer 218, but different from that of the dielectric layer 220. In some embodiments, the dielectric layer 222 protects the dielectric layer 220 therebeneath during subsequent etching operations (e.g. during a source/drain trench formation process) thereby prevent bridging between adjacent features (such as adjacent source/drain features). A CMP operation may be conducted to planarize the top surface of the workpiece 200. At this processing stage, the dielectric layers 218, 220, and 222 collectively form the hybrid fins 224. The hybrid fins 224 are formed on sidewall surfaces of cladding layers 216 and on top surface of the isolation features 204. In some embodiments, the dimension of the dielectric layer 220 along the X-direction is thickness t1. As described above, fin structures 211 may have different spacing from each other. Accordingly, the thickness t1 may be different in different areas. In some embodiments, the thickness t1 is about 5 nm to about 40 nm. For example, thickness t1 in a first region may be about 5 nm to about 15 nm; while the thickness t1 in a second region may be about 10 nm to about 40 nm.

Figure 6:
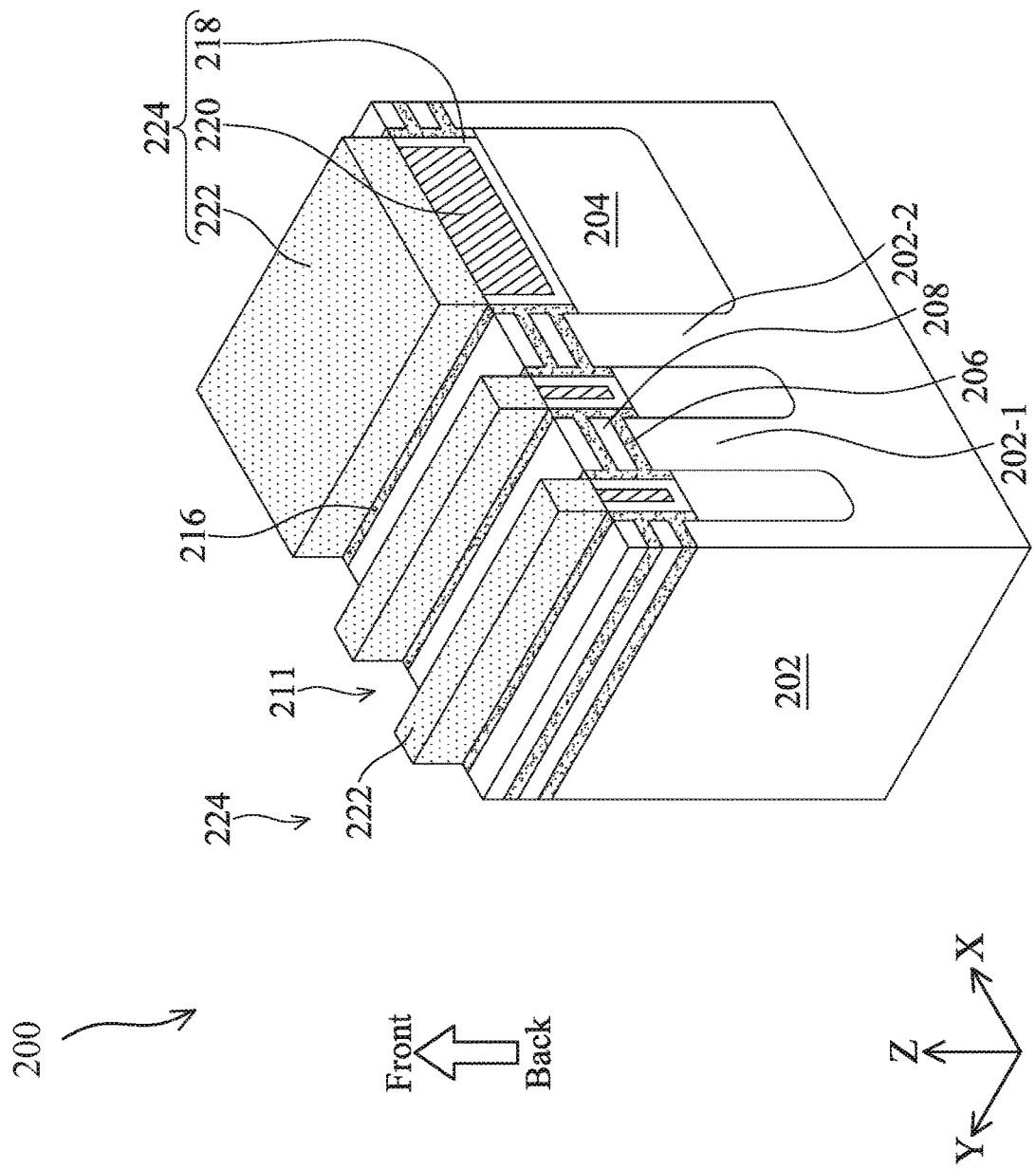

Referring FIGS. 1A and 6, the method 100 includes a block 110 where the layer 209 and the topmost sacrificial layer 206 are removed, thereby exposing the topmost channel layer 208. Accordingly, a top portion of the dielectric layer 222 protrudes above a top surface of the workpiece 200 (and a top surface of the topmost channel layer 208).

Figure 7:
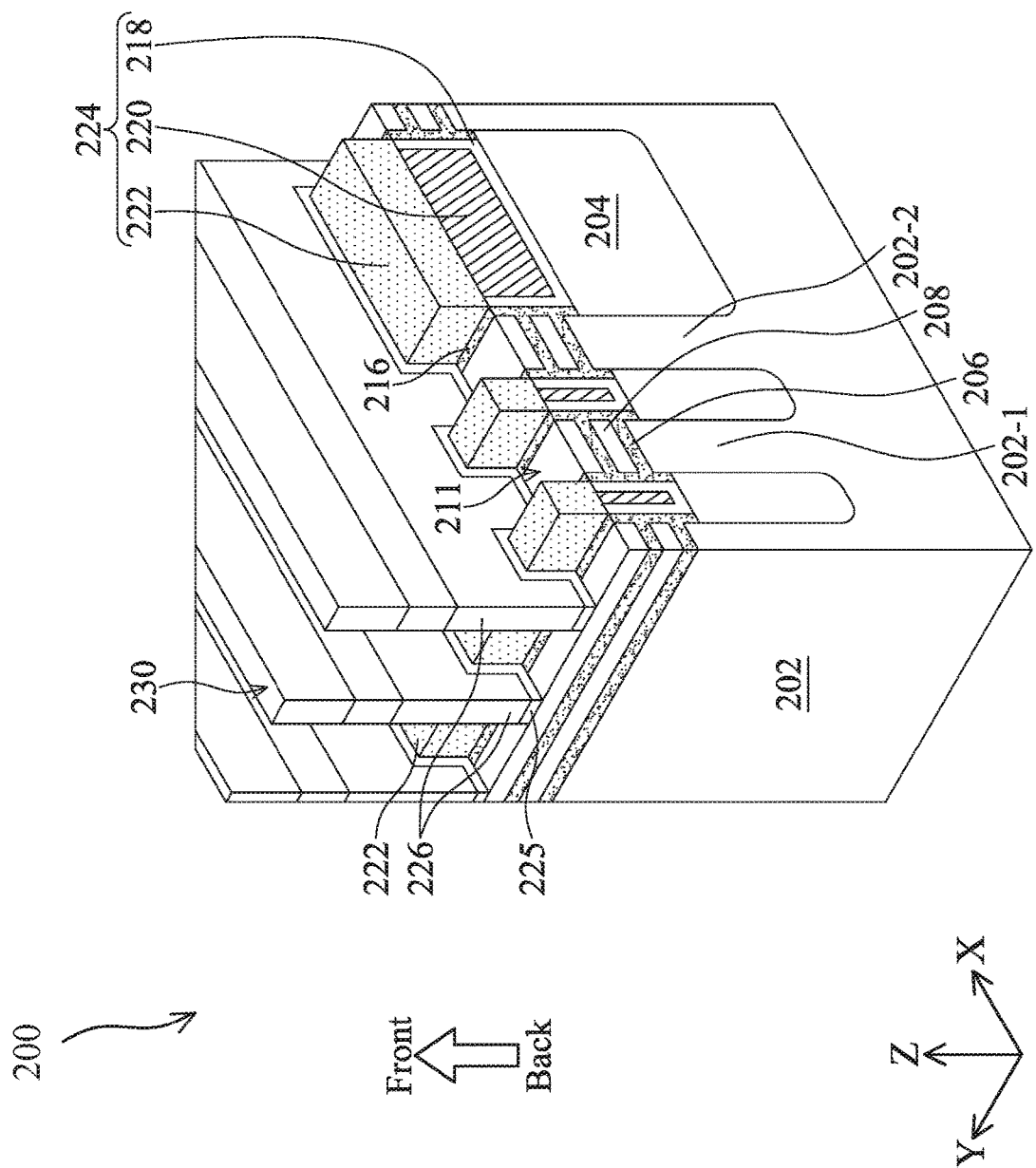

Referring to FIGS. 1A and 7, the method 100 includes a block 112 where dummy gate stacks 230 are formed on the fin structures 211. In some embodiments, the dummy gate stacks 230 extend orthogonally to the lengthwise direction of the fin structures 211. For example, in the depicted embodiments, the fin structures 211 extends along the Y-direction; and the dummy gate stacks 230 extends along the X-direction. In some embodiments, a gate replacement process (or gate-last process) is later implemented where the dummy gate stacks 230 serve as placeholders for subsequently formed functional gate structures. Other processes and configuration are possible. Each of the dummy gate stacks 230 include a dummy gate electrode layer 226 (such as including polycrystalline silicon (polysilicon) and a dummy gate dielectric layer 225. In some embodiments, the dummy gate stack 230 may further include other layers such as interfacial layers, hard mask layers, other suitable layers or combinations thereof. Layers for the dummy gate stacks 230 may be formed by any suitable methods, such as CVD.

Figure 8:
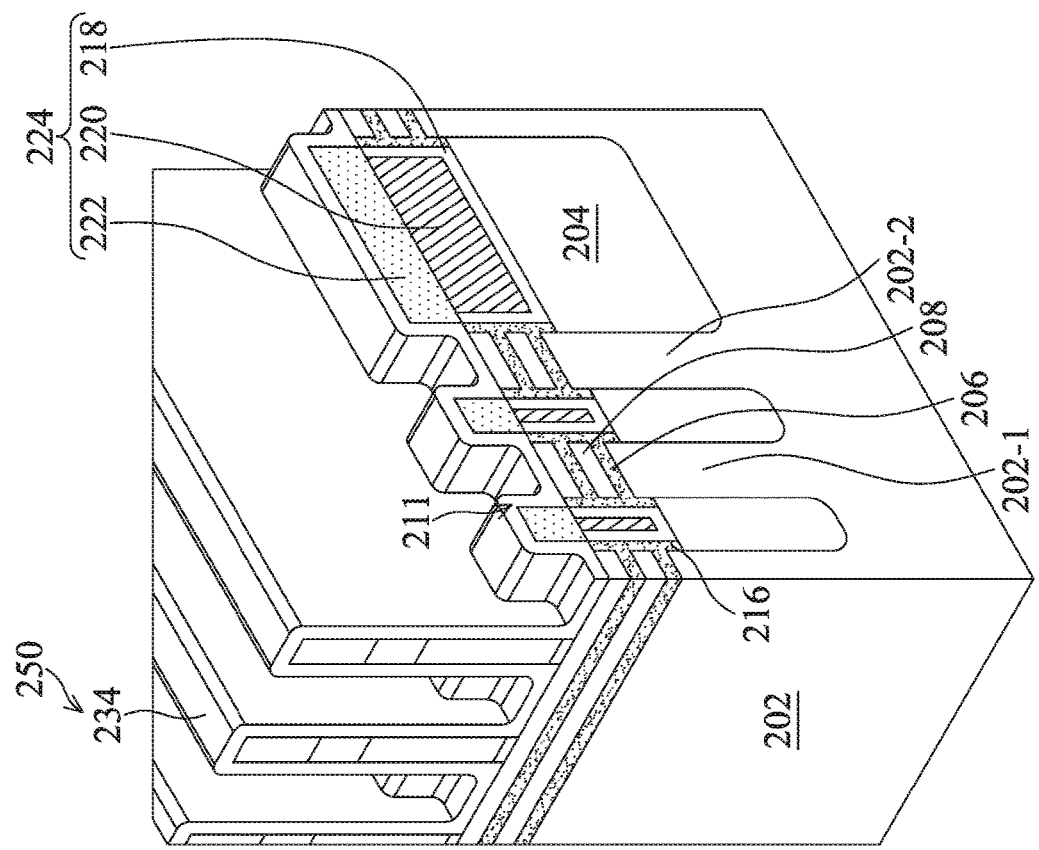
Figure 9:
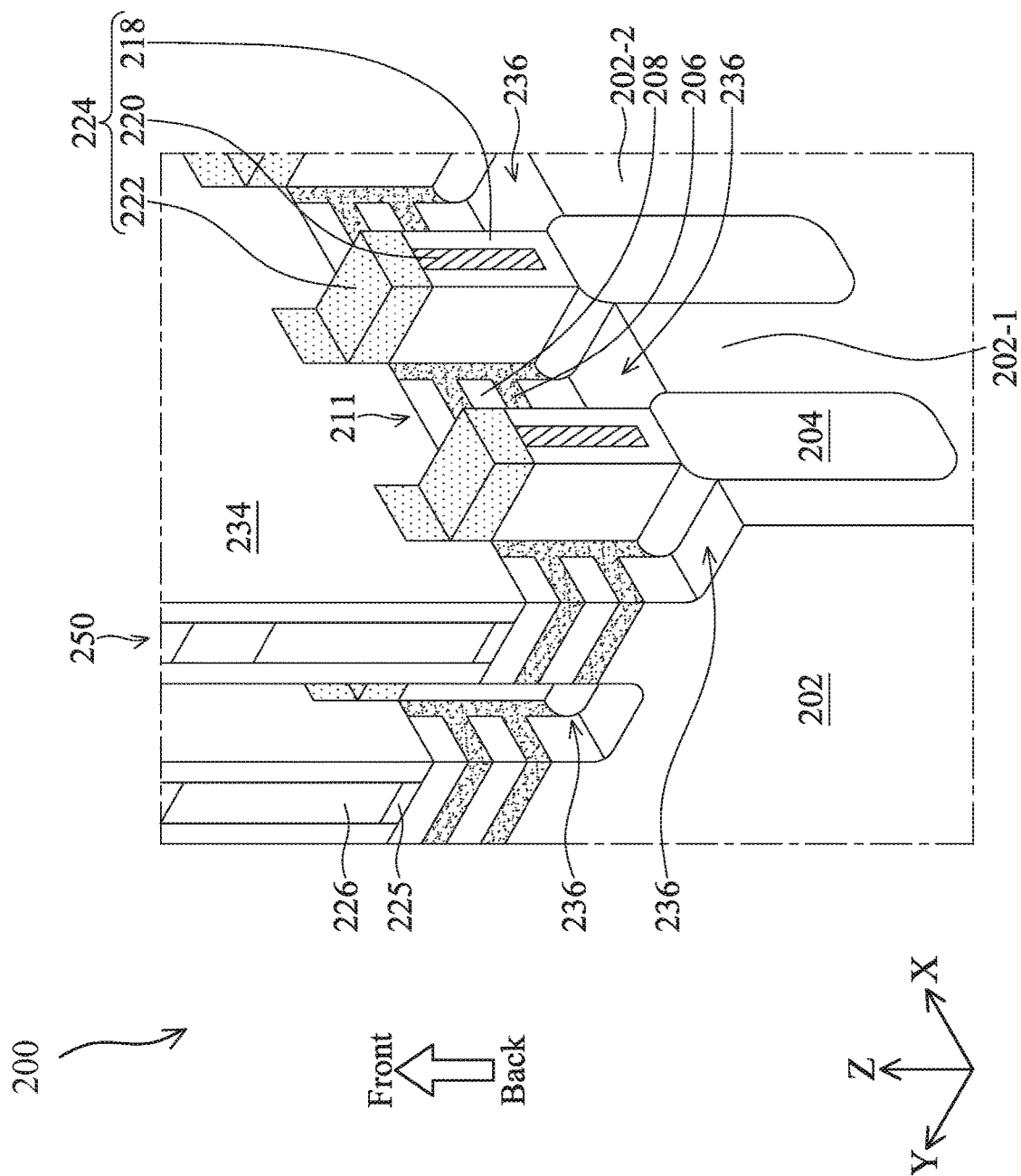

Referring to FIGS. 1A and 8, the method 100 includes a block 114 where gate spacer 234 is formed wrapping around the top and sidewall surfaces of the dummy gate stacks 230. The gate spacer 234 may include one or more gate spacer layers, where each of the gate spacer layers include a dielectric material, such as a dielectric material that allows selective removal of the dummy gate stacks 230 without affecting the gate spacer 234. Suitable dielectric materials may include SiON, SiCN, SiOC, SiOCN, SiN, other low-k dielectric materials, or combinations thereof. The gate spacer 234 may be conformally deposited over the workpiece 200 using CVD, subatmospheric CVD (SACVD), or ALD. In some embodiments, the gate spacers 234 are etched back. The gate spacers 234 and the dummy gate stack 230 collectively form the gate structures 250. Referring to FIGS. 1B and 9, method 100 includes a block 116 where source/drain trenches 236 are formed on both sides of the dummy gate stacks 230 using an anisotropic etch with the dummy gate stacks 230 and the gate spacers 234 serving as an etch mask. In some embodiments as illustrated in FIG. 9, operations at block 116 may substantially remove the channel layers 208 and sacrificial layers 206 in the respective region in their entirety, and further recessing into the base portions 202-1 and 202-2. Accordingly, the source/drain trenches 236 each extend below a top surface of the isolation features 204. The anisotropic etch may include a dry etch process or a suitable etch process. For example, the dry etch process may implement an oxygen-containing gas, hydrogen, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, other suitable gases and/or plasmas, and/or combinations thereof. During the anisotropic etch, the presence of the dielectric layers 222 protects the low-k dielectric materials of the dielectric layer 220 beneath. In the depicted embodiments, the dielectric layers 222 substantially remain, although in some other embodiments (not depicted), the dielectric layers 222 are partially or entirely removed.

Figure 10:
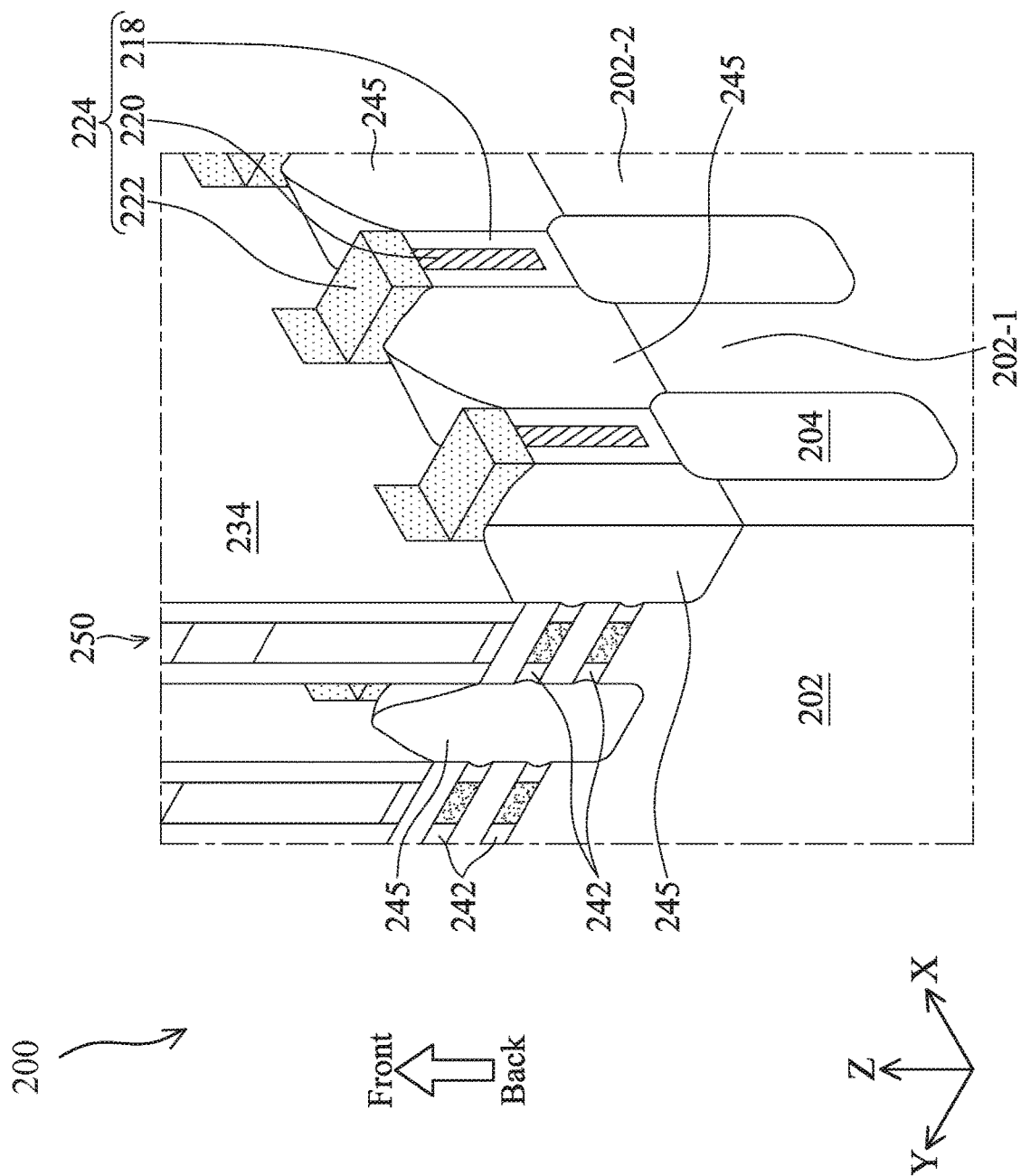

The source/drain trenches 236 expose sidewall surfaces of the channel layers 208 and the sacrificial layers 206. Referring to FIG. 10, the method 100 includes forming inner spacer features 242. For example, the sacrificial layers 206 exposed in the source/drain trenches 236 are first selectively and partially recessed to form inner spacer recesses, while the exposed channel layers 208 are substantially unetched due to the etching selectivity. Moreover, a portion of the cladding layer 216 is also etched during the process, for example, because the cladding layer 216 has the same or similar material (e.g. SiGe) as the sacrificial layer 206. An inner spacer material is then deposited using CVD or ALD over the workpiece 200, including over and into the inner spacer recesses 238. The inner spacer material may include SiON, SiCN, SiOC, SiOCN, SiN, other low-k dielectric materials, or combinations thereof. Subsequently, inner spacer materials outside the inner spacer recesses are etched back, thereby forming the inner spacer features 242.

Referring to FIGS. 1B and 10, method 100 includes a block 118 to form source/drain features 245 in the source/drain trenches 236 as well as the remaining portions of the inner spacer recesses (if any). In some embodiments, the source/drain features 245 may be formed by an epitaxial process, such as vapor-phase epitaxy (VPE), ultra-high vacuum CVD (UHV-CVD), molecular beam epitaxy (MBE), and/or other suitable processes. The source/drain features 245 may be either n-type or p-type. N-type source/drain features 245 may include silicon (Si) and may be doped with an n-type dopant, such as phosphorus (P) or arsenic (As). P-type source/drain features 245 may include silicon germanium (SiGe) or germanium (Ge) and may be doped with a p-type dopant, such as boron (B) or gallium (Ga). In some embodiments, overgrowth of the epitaxy material may cause the source/drain features 245 to merge over the inner spacer features 242. However, the source/drain features 245 may terminate before it covers side surfaces of the dielectric layers 222. In some embodiments, the presence of the dielectric layers 222 prevents adjacent source/drain features 245 to merge (or bridge) with one another. In some embodiments, the dielectric layers 222 may be partially or entirely removed. For example, a remaining height along the Z-direction of the dielectric layer 222 may be up to about 16 nm.

Figure 11:
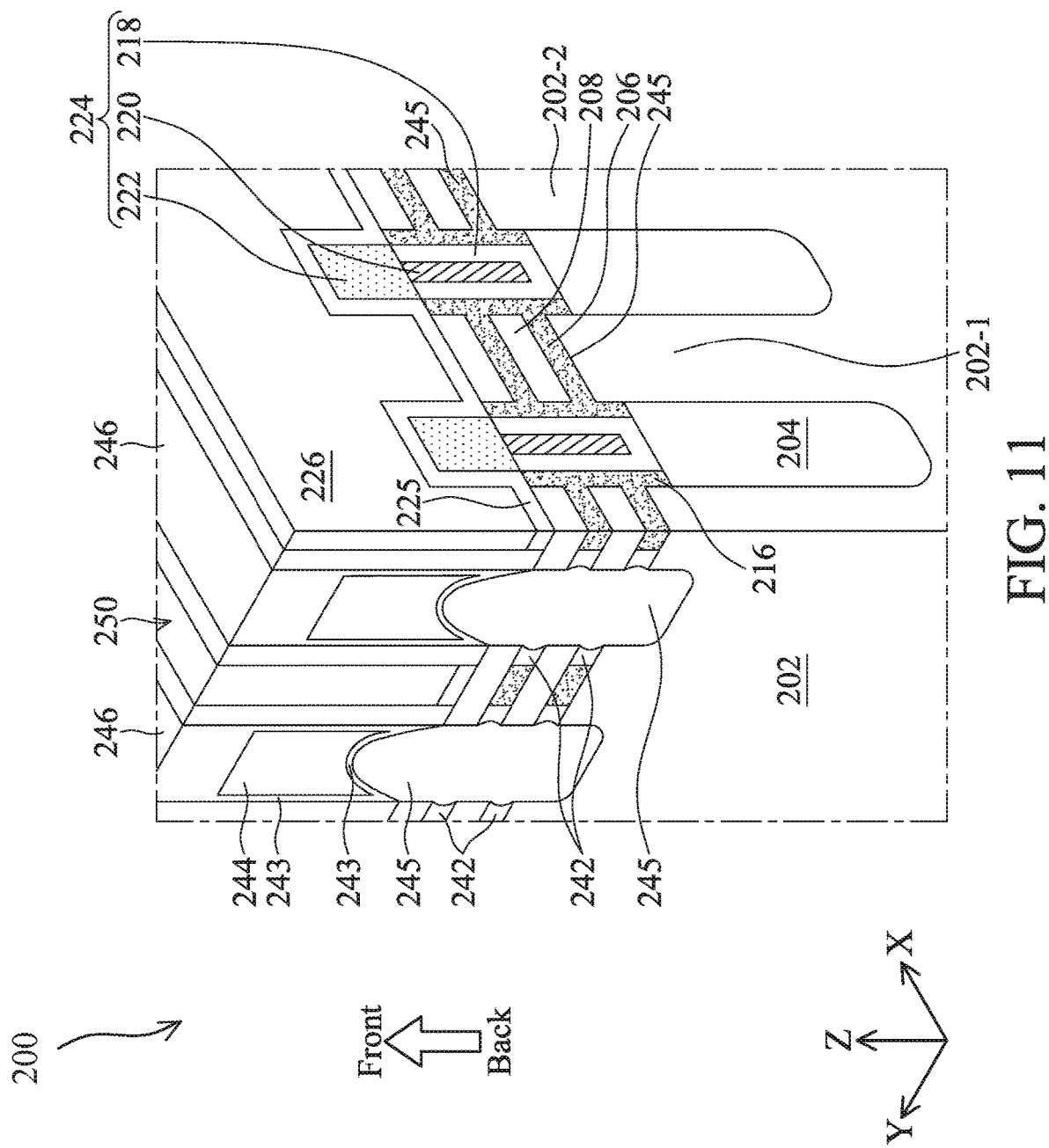

Referring to FIGS. 1B and 11, method 100 includes a block 120 where a contact etch stop layer (CESL) 243 and an interlayer dielectric (ILD) layer 244 are deposited. In an example process, the CESL 243 is first conformally deposited over the workpiece 200 (including, e.g. on the surfaces of the source/drain features 245, as on sidewall surfaces and top surfaces of the dielectric layers 222) and then the ILD layer 244 is blanketly deposited over the CESL 243. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. To remove excess materials and to expose top surfaces of the dummy gate electrodes 226 of the dummy gate stacks 230, a planarization process (such a chemical mechanical polishing (CMP) process) may be performed to the workpiece 200 to provide a planar top surface. Moreover, in the depicted embodiments, the ILD layer 244 is recessed to reduce its height. In some embodiments, a hard mask layer 246 is formed on top surfaces of the ILD layer 244 which serves to protect the ILD in subsequent processing. The ILD layer 244 and the hard mask layer 246 are formed on and between side surfaces of the gate spacers 234 of the gate structures 250. In some embodiments, a gate definition step is conducted, e.g. using a cut-on-poly-oxide-definition-edge (CPODE) procedure, to define the length of the subsequently formed gate structures 250'. At this processing stage, in some embodiments, top surfaces of the dummy gate electrodes 226 are exposed on the planar top surface.

Figure 12:
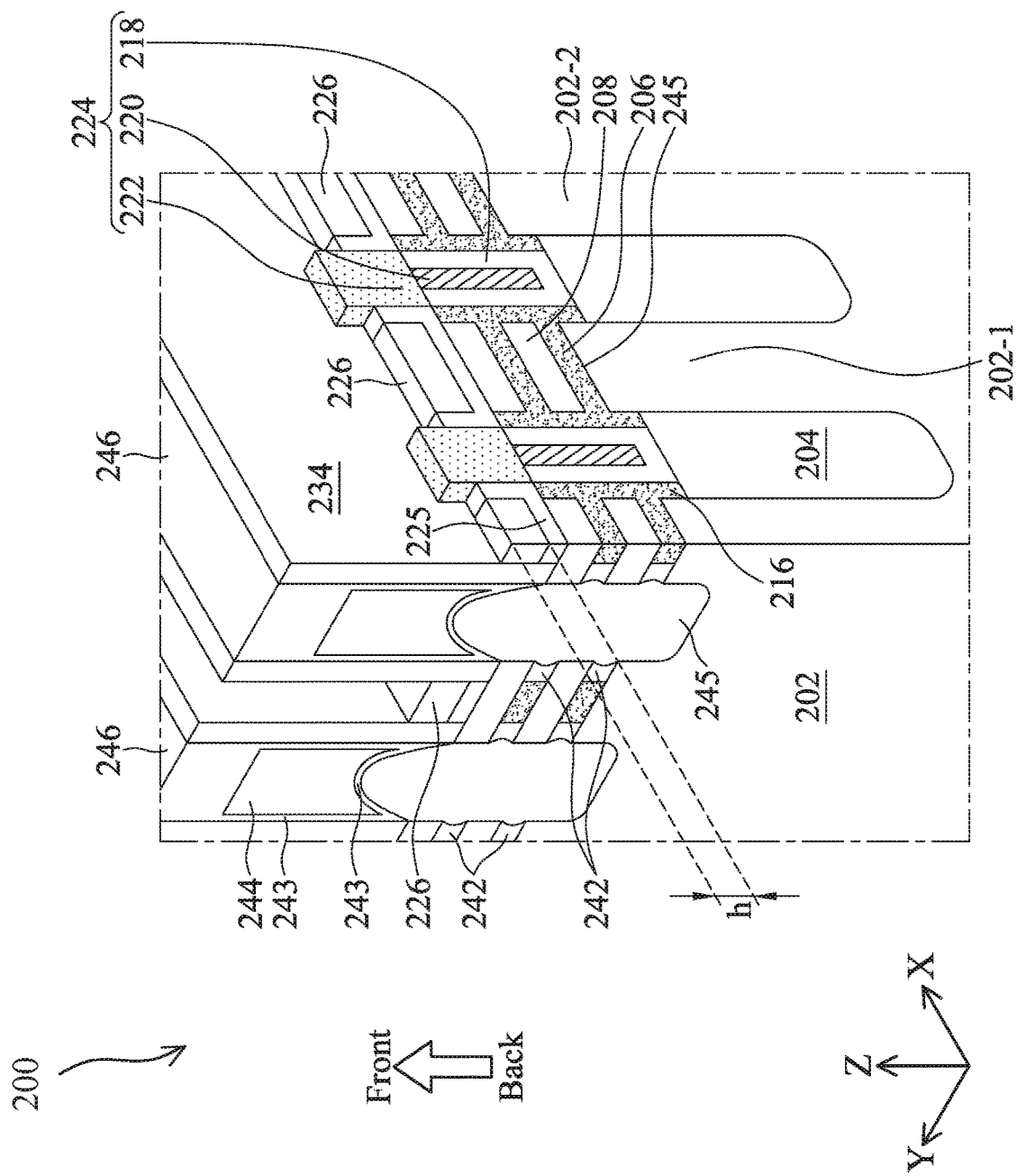

Referring to FIGS. 1B and 12, the method 100 includes a block 122 where the dummy gate stacks 230 (e.g. the dummy gate electrode layer 226 and the dummy gate dielectric layer 225) are recessed, but not entirely removed. Accordingly, gate trenches are formed on top of the recessed dummy gate electrode 226 and between adjacent gate spacers 234. In some embodiments, the remaining portions of the dummy gate electrode 226 protects the channel layers 208 beneath the dummy gate electrode 226 in subsequent recessing of the dielectric layers 222. Without the protection, the channel layers 208 may be compromised. The recessing of the dummy gate electrode 226 may be by any suitable methods without damaging the gate spacers 234. In some embodiments, an etching time duration is adjusted to control the amount of the dummy gate electrode 226 recessed and the height of the dummy gate electrode 226 that remain. In some embodiments, the remaining portions of the dummy gate electrode may have a height h. In some embodiments, the height h may be about 3 nm to about 30 nm. In some embodiments, a ratio of the height h to the thickness of the channel layer may be about 1:1 to about 1:18. If the height h is too small or the ratio is too small, the protection functionality may not be substantial; if the height h is too large or the ratio is too large, subsequent etching of the dielectric layer 222 may be impeded undesirably. In some embodiments, the dielectric layer 222 may be simultaneously etched. Alternatively, the dielectric layer 222 may be substantially preserved in the process.

Figure 13:
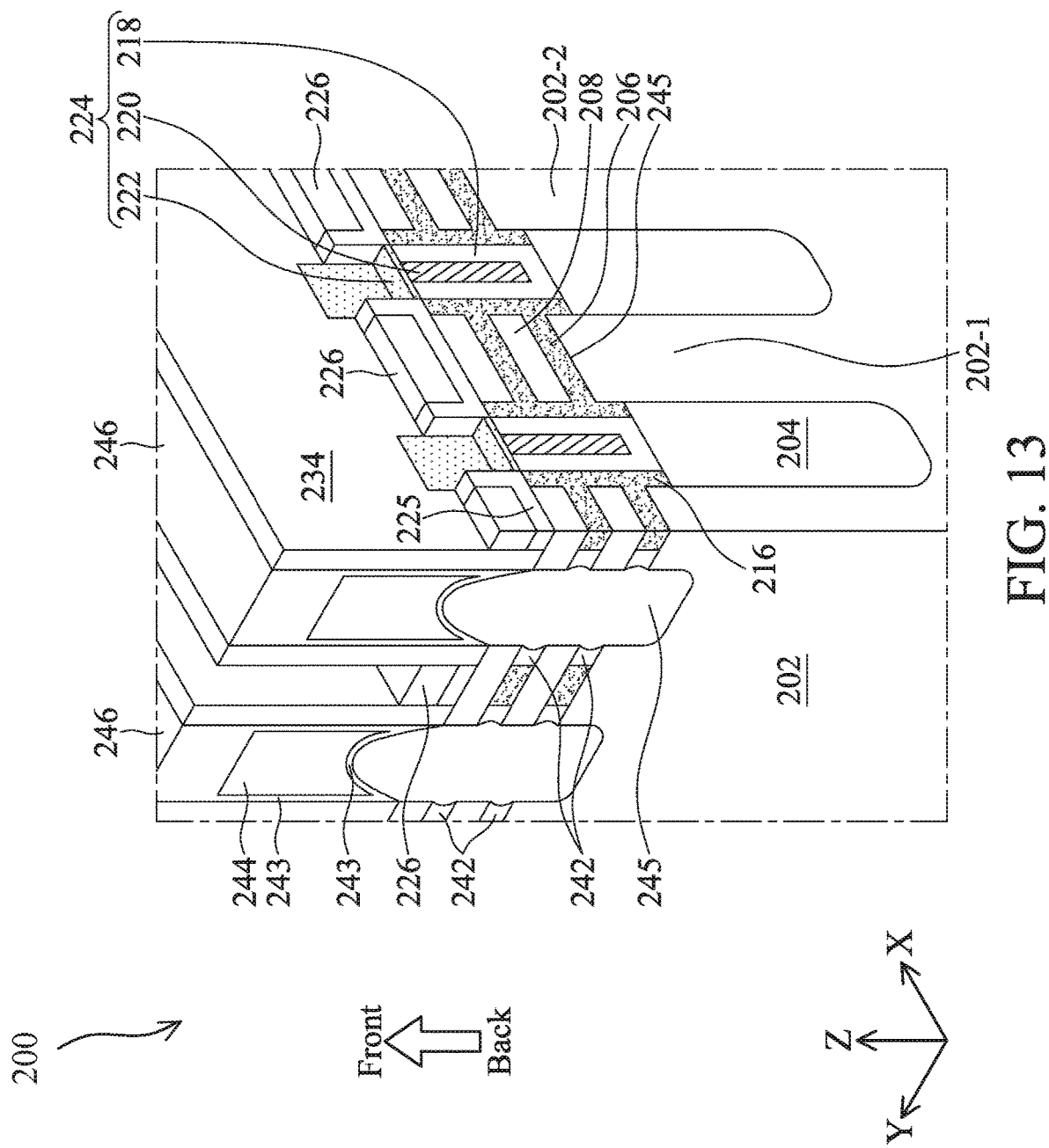
Figure 14:
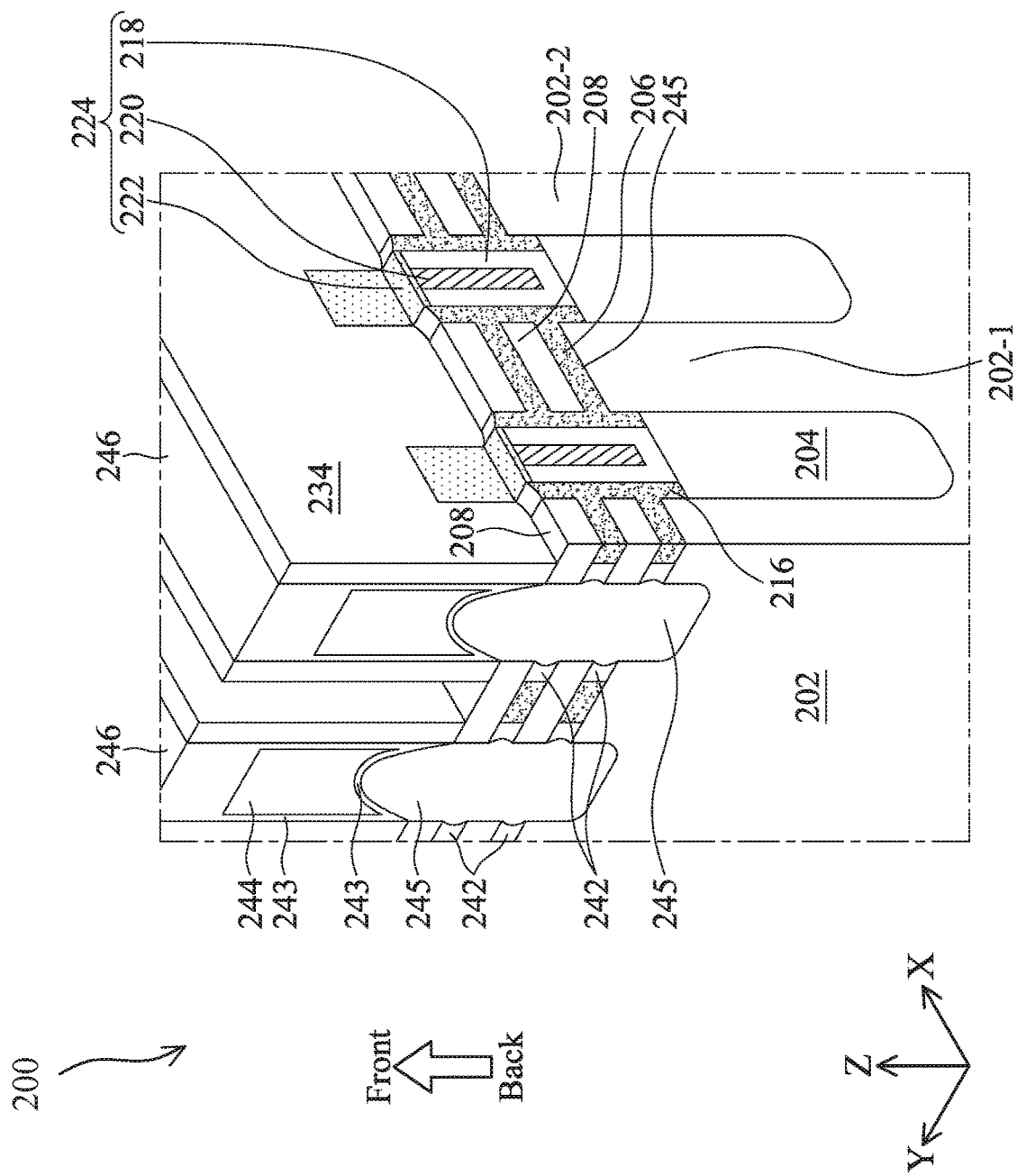

Referring to FIGS. 1B and 13, the method 100 includes a block 124 where the dielectric layers 222 are selectively recessed without substantially damaging the remaining portions of the dummy gate dielectric layer 225 or the dummy gate electrode layer 226. In some embodiments, the dielectric layers 222 are not removed in their entireties. In other words, a portion of the dielectric layer 222 remain, which serve to protect the remaining part of the hybrid fins 224 in subsequent processing. Without the protections, the dielectric layers 220 may be substantially damaged due to its reduced etching selectivity relative to the materials of the dummy gate stacks 230, the cladding layers 216, and/or the sacrificial layers 206. This may cause challenges in subsequent processes that replace the dielectric layers 220 with gate cut features. For example, the profile and/or dimensions of such gate cut features may be more difficult to control. In some embodiments, the remaining portions of the dielectric layer 222 may have a thickness of about 0.5 nm to about 5 nm. If the thickness is too small, the protection afforded to the dielectric layer 220 as described here may not be satisfactory in all instances; while if the thickness is too large, it may unnecessarily occupy spaces otherwise available to accommodate the gate electrode layer, thereby leading to unnecessary resistance increase. In some other approaches not implementing the present disclosure, the dielectric layer 222 is removed in a substantially later processing stage. As compared to such other approaches, removing the dielectric layer 222 may be more efficient and less technically challenging_at this processing stage due to the absence of other subsequently formed dielectric features (such as dielectric features 270 and/or 284 described later) that may require protection during the removing. Referring to FIGS. 1B and 14, after the etching of the dielectric layer 222 is completed, the recessed dummy gate electrode 226 and the recessed dummy gate dielectric 225 are removed to expose the top surface of the channel layers 208 (block 126 of FIG. 1).

Figure 15:
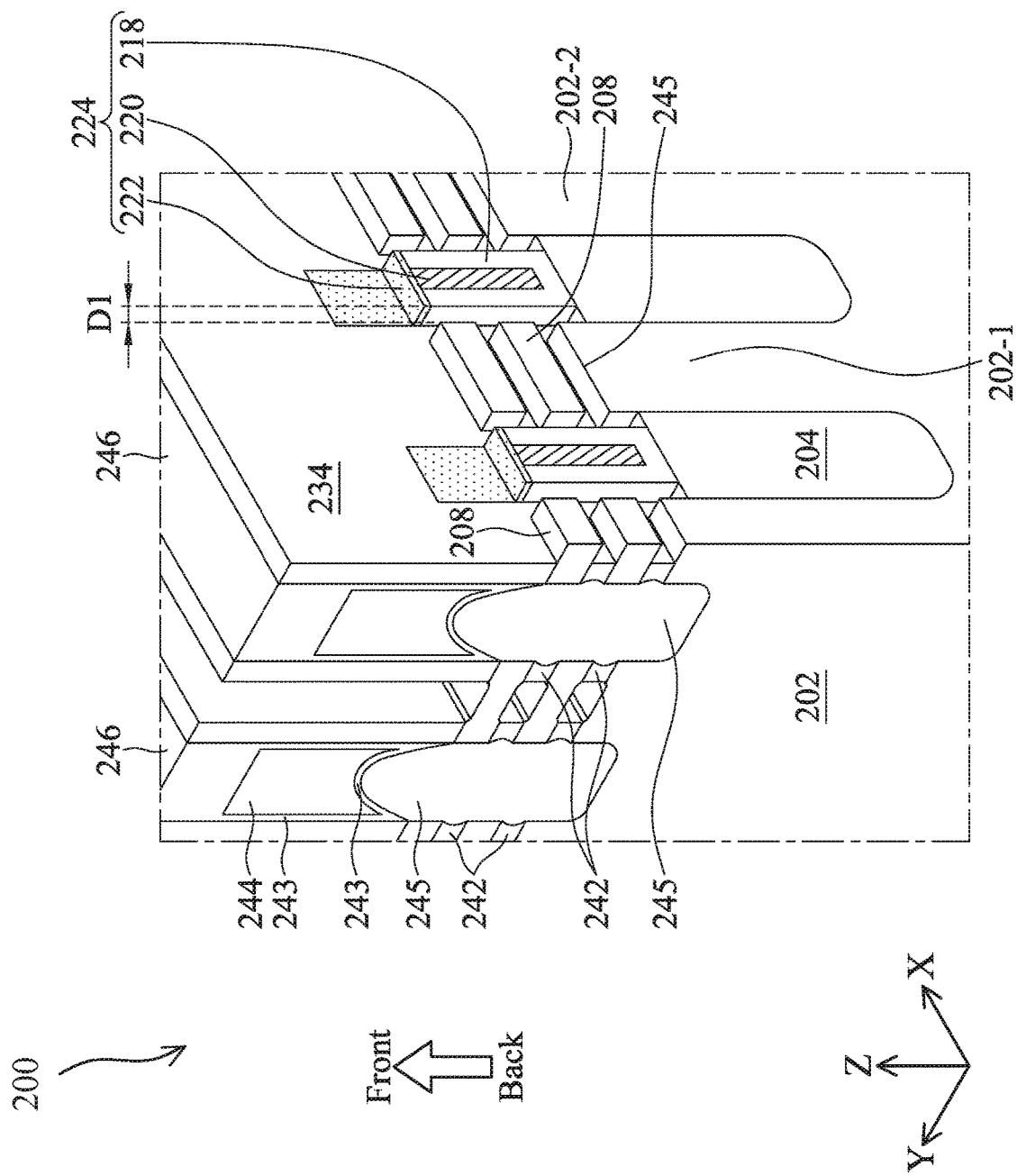

Referring to FIGS. 1B and 15, a channel release process (or sometimes referred to as the nanostructure formation process) is conducted (block 128 of FIG. 1), where the remaining portions of the cladding layer 216, as well as the sacrificial layers 206 are selectively removed without substantially damaging the channel layers 208 or the dielectric layer 222. As described above, in the depicted embodiment, the channel layers 208 may include Si, while the cladding layers 216 as well as the sacrificial layers 206 are each formed of SiGe. Accordingly, the etching parameters may be selected to accomplish the desired selectivity. Following the channel release process, the channel layers 208 are each exposed circumferentially in 360°. Moreover, in the depicted embodiments, the channel layers 208 are spaced away from the dielectric layers 218. For example, a distance between a sidewall surface of the channel layer 208 and an adjacent feature (e.g. the sidewall surface of the dielectric layer 218) is distance D1. The distance D1 may be about 5 nm to about 20 nm. In some embodiments, the distance D1 may be adjusted by tuning the thickness of the cladding layer 216. At this processing stage, the distance D1 is sometimes referred to as the endcap distance. The endcap distance at least partially controls the material access and flow into areas between the channel layers.

Figure 16:
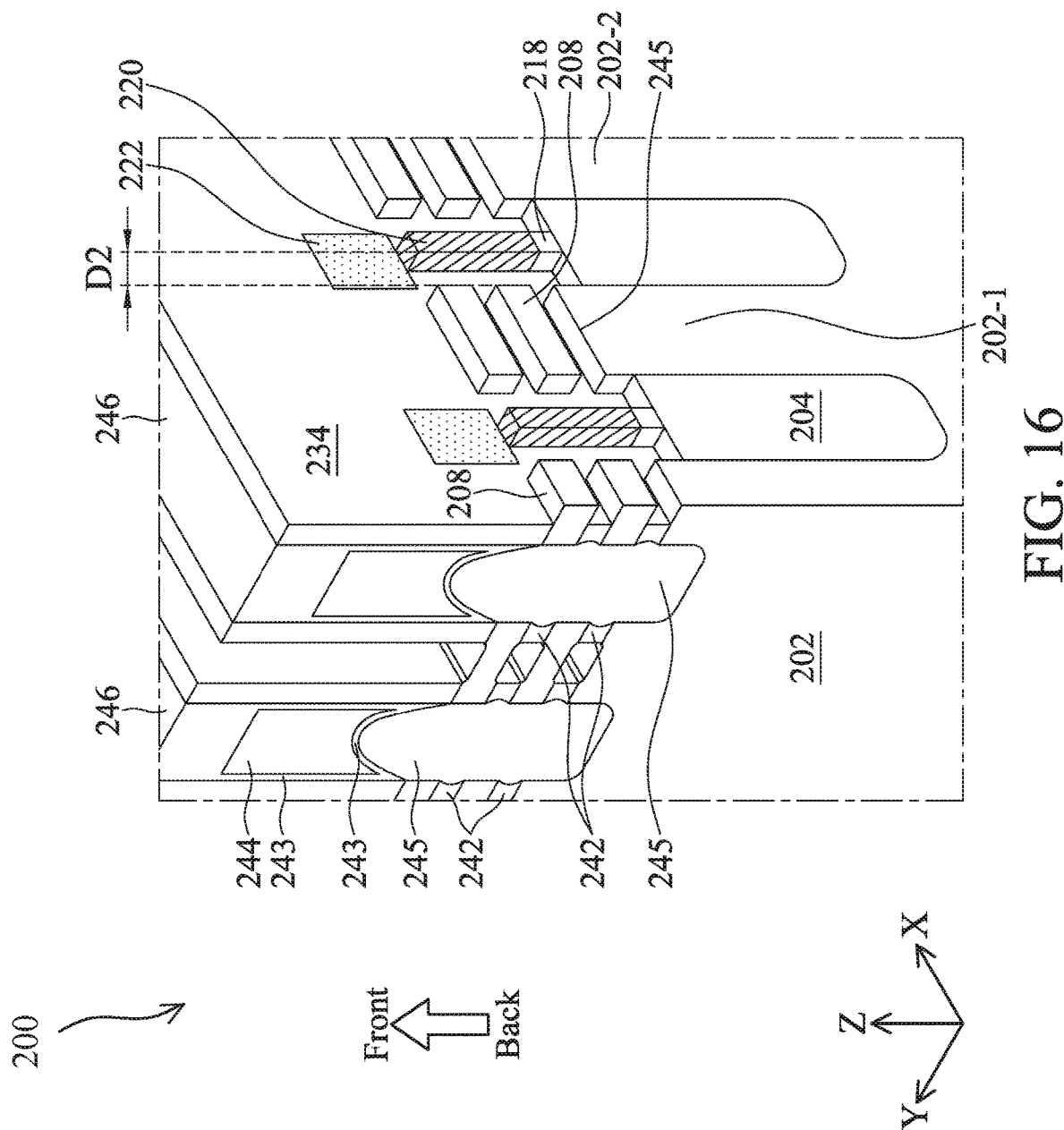

Referring to FIGS. 1B and 16, the method 100 includes a block 130 where the remaining portions of the dielectric layer 222 that are not covered, as well as the dielectric layers 218 on sidewall surfaces of the dielectric layer 220 are selectively removed, without substantially damaging the dielectric layer 220 or the channel layers 208. Any suitable methods (such as wet etching, dry chemical etching, or combinations thereof) that are capable of achieving the selectivities may be utilized. As a result, spacing between sidewall surfaces of the channel layers 208 and adjacent features (such as the dielectric layer 220) are increased. For example, at this processing stage, the distance between the sidewall surfaces of the channel layers 208 and the sidewall surfaces of the dielectric layer 220 is the distance D2. Moreover, a distance between the sidewall surface of the base portion (e.g. base portions 202-1 or 202-2) and a sidewall surface of the dielectric layer 218 is the distance D2. In some embodiments, the distance D2 is determined by the sum of the thickness of the dielectric layer 218 and the thickness of the cladding layer 216. Therefore, the distance D2 may be adjusted by tuning the thickness of the dielectric layer 218 and/or the cladding layer 216. In some embodiments, the distance D2 may be about 7 nm to about 22 nm. In other words, the endcap distance is reduced from D1 to D2. In some embodiments, a difference between the distances D1 and D2 may be about 2 nm to about 10 nm. If the difference is too small, such as less than about 2 nm, any improvement to the material flow or access in the area between adjacent channel layers may be insignificant. If the difference is too large, such as greater than about 10 nm, the benefit may not justify the increased chip space footprint. In some embodiments, the etching operation may be configured to further preserve the portion of the dielectric layer 218 under the dielectric layer 220 (e.g. the portion between the dielectric layer 220 and the isolation feature 204) are substantially preserved. Moreover, in some alternative embodiments, the etching operation may further be configured to preserve the portion of the dielectric layer 222 directly above the dielectric layers 220 (e.g. on an opposite end of the dielectric layer 220 as the remaining portions of the dielectric layer 218.

Figure 17:
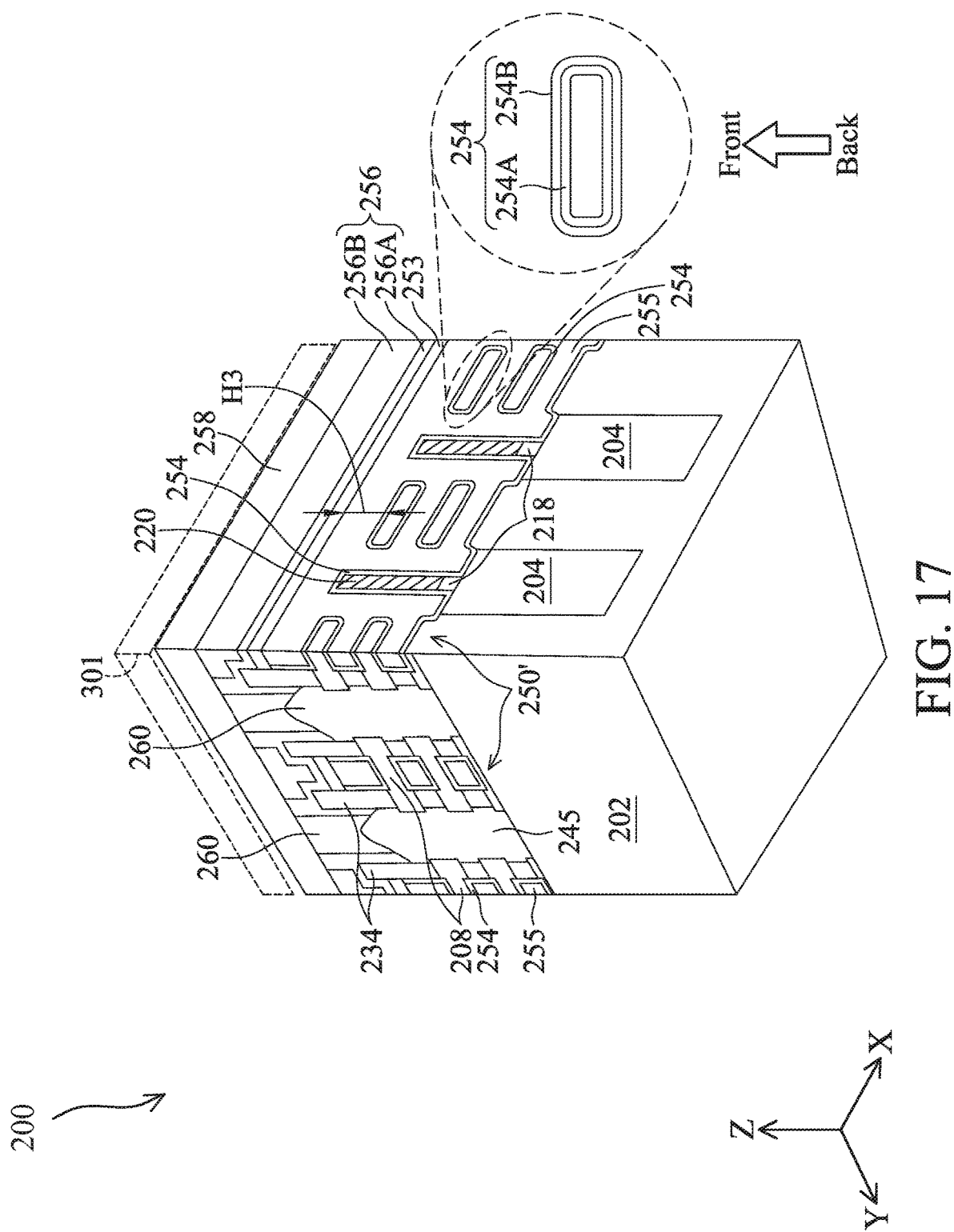

Referring to FIGS. 1B and 17, the method includes a block 132 where replacement gate stacks (such as high-k metal gate stacks) are formed within the gate trenches thereby replacing the removed dummy gate stacks 230. It is noted that FIG. 17 illustrates the workpiece 200 in an alternative view (as defined by the axes), for the purpose of clearly depicting the substrate 202 of the workpiece 200 (as described in detail below). As illustrated in FIG. 17, a gate dielectric layer 254 is formed on and surrounding (or wrapping around) each of the channel layers 208. In the depicted embodiments, the gate dielectric layer 254 includes an interfacial layer 254A on and wrapping around the channel layers 208, as well as a high-k gate dielectric layer 254B on and wrapping around the interfacial layer 254A. In some embodiments, the interfacial layer 254A includes silicon oxide. The gate dielectric layer 254B may include a high-k dielectric material, such as include hafnium oxide. Alternatively, the gate dielectric layer 254B may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The gate dielectric layer 254 may be formed by any suitable methods, such as CVD, ALD, PVD, other suitable techniques, or combinations thereof. At this processing stage, the dielectric layer 220 is wrapped around on at these three sides by the gate dielectric layer 254 and on another side by the dielectric layer 222. The gate dielectric layer 254 may have a thickness of about 1.5 nm to about 3 nm.

Moreover, a gate electrode layer 255 is formed on and wrapping around the gate dielectric layer 254. The gate electrode layer 255 may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer 255 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

In some embodiments, the gate electrode layer 255 may be recessed. In some embodiments, the height dimension H3 of the gate electrode 255 between the top surface of the gate dielectric layer 254 of the topmost channel layer 208 and the bottom surface of the gate electrode cap layer 253 may be about 8 nm to about 30 nm. If the height dimension H3 is too small, resistance within the gate electrode layer 255 may be high; while if the height dimension is too large, the benefit may not justify the cost of the material. A gate electrode cap layer 253 may be formed thereon, for example, by depositing one or more conductive materials over the recessed gate electrode layer 255, and subsequently performing a CMP process to the one or more conductive materials. The gate electrode cap layer 253 may reduce the gate resistance, protect the gate electrode layer 255, and in some instances serve as an etch stop layer during a subsequent via trench formation. In one embodiment, the gate electrode cap layer 253 includes tungsten.

The gate dielectric layer 254 and the gate electrode 255 collectively form a high-k metal gate stack. The high-k metal gate stack and the gate spacers 234 collectively form the replacement gate structures 250', which replaces the original gate structure 250 described above with respect to FIG. 8. In some embodiments, one or more gate self-aligned contact (SAC) dielectric layers, such as SAC dielectric layers 256A and 256B are formed to cover the gate structures 250' and the gate spacers 234. In some embodiments, the gate SAC dielectric layers 256A and/or 256B may include silicon oxide, silicon nitride, silicon carbide, silicon oxynitride, silicon carbonitride, silicon oxycarbide, silicon oxycarbonitride, and/or combinations thereof.

Furthermore, source/drain contacts 260 are formed over the source/drain features 230. The source/drain contacts 260 may include titanium nitride (TiN), tantalum (Ta), titanium (TiN), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof. In some embodiments, silicides are formed between the source/drain contacts 260 and the source/drain features 230. Additionally, further ILD layers, via features, intermetal dielectric (IMD) layers, and/or passivation layers may be formed on the workpiece 200, for example, electrically connected to the source/drain contacts 260. These layers or features are collectively referred to as the MEOL/BEOL features 258.

Figure 18:
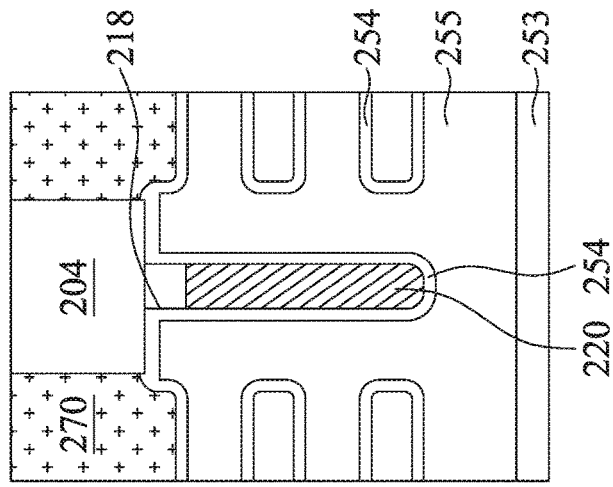
Figure 18:
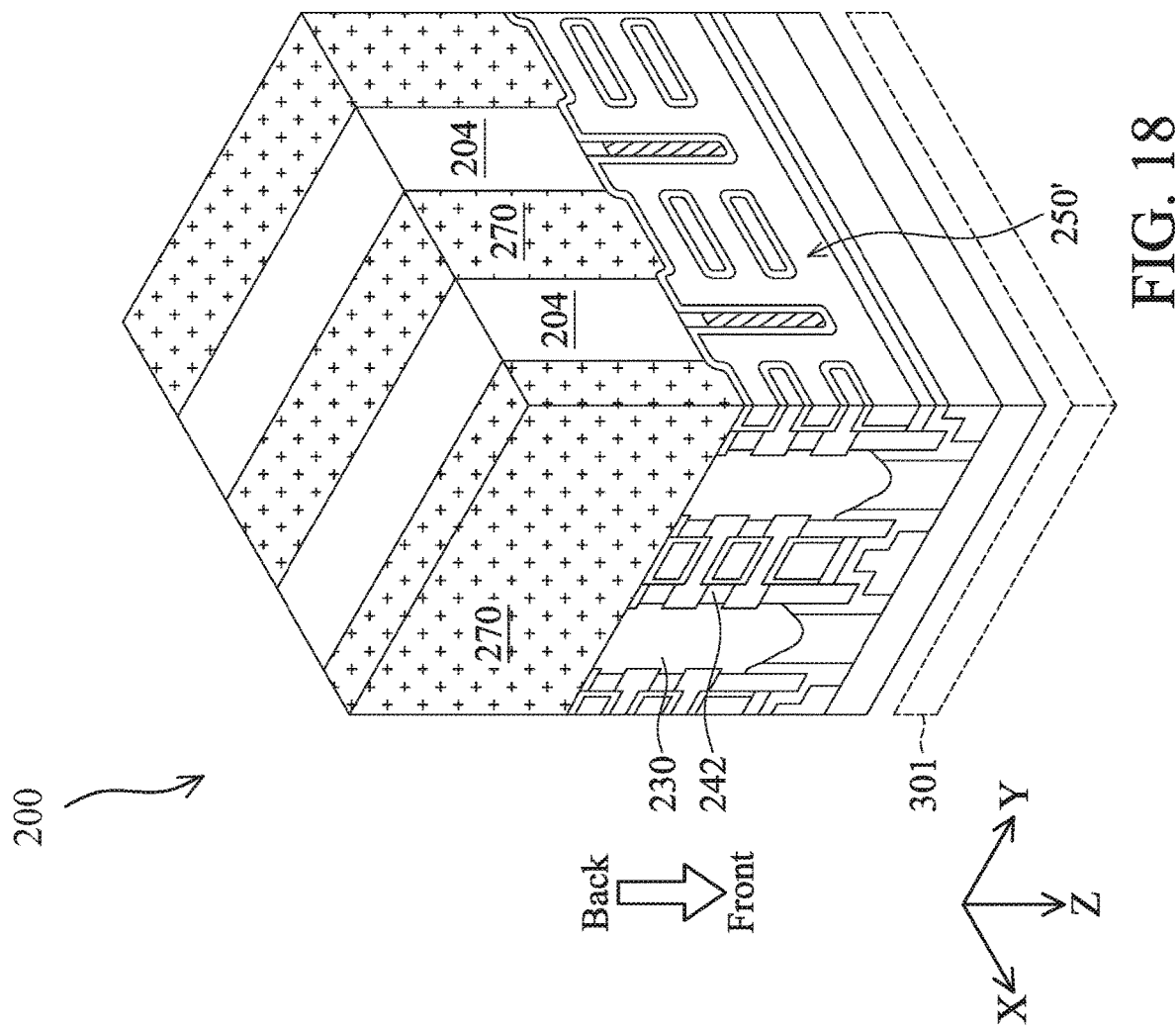

Referring to FIGS. 17 and 18, method 100 includes flipping the workpiece 200 upside down for processing from the backside thereof, as indicated by the change in the coordination axes on the FIG. 18 compared to FIGS. 2-16. To flip the workpiece 200 up-side-down, a carrier wafer 301 may be bonded to a frontside of the workpiece 200 away from the substrate 202. In some embodiments, the carrier wafer 301 may be bonded to the workpiece 200 by fusion bonding, by use of an adhesion layer, or a combination thereof. In some instances, the carrier wafer 301 may be formed of semiconductor materials (such as silicon), sapphire, glass, polymeric materials, or other suitable materials. In embodiments where fusion bonding is used, the carrier wafer 301 includes a bottom oxide layer and the workpiece 200 includes a top oxide layer. After both the bottom oxide layer and top oxide layer are treated, they are placed in plush contact with one another for direct bonding at room temperature or at an elevated temperature. Once the carrier wafer 301 is bonded to the workpiece 200, the workpiece 200 is flipped over, as shown in FIG. 18 and subsequent figures. For simplicity, FIGS. subsequent figures omit some features that are already shown in FIG. 18, such as the carrier wafer 301.

After the workpiece 200 is flipped over, referring to FIGS. 1C and 18, method 100 includes a block 134 the backside of the workpiece 200 is planarized using chemical mechanical polishing (CMP) until the isolation features 204 are exposed on the backside of the workpiece 200, which is now facing up. The first base portion 202-1 and the second base portion 202-2 (not shown) are also exposed on the backside of the workpiece 200, which are then selectively etched to form trenches exposing the backside of the gate structure 250' (e.g., the gate dielectric layer 254). The trenches also expose surfaces of the source/drain features 230 and sidewalls of the isolation features 204. In some embodiments, operations at block 134 applies an etching process that is tuned to be selective to the materials of the semiconductor material (e.g. silicon) in the base portions 202-1/202-2 and with no (or minimal) etching to the gate structure 250' (e.g., the gate dielectric layer 254), the isolation feature 204, the CESL 243, and the inner spacer features 242. In the illustrated embodiment, the etching process terminates when the gate dielectric layers 254 are reached. Accordingly, the source/drain features 230 are not substantially recessed. For example, a now-top surface (i.e. the original bottom surface) of the source/drain features 230 aligns with a surface of the inner spacer features 242. In some other alternative embodiments, the source/drain features 230 may further be recessed such that the now-top surface of the source/drain features 230 extends below the now-top surface of the inner spacer features 242. Operations at block 134 may apply one or more etching processes, such as a dry etching, a wet etching, a reactive ion etching, other etching methods, or combinations thereof.

Still referring to FIGS. 1C and 18, method 100 includes a block 136 where a backside dielectric layer 270 with one or more dielectric materials is deposited to fill the trenches and cover the exposed bottom surfaces of the gate structure 250' and the source/drain features 230. In some embodiments, the backside dielectric layer 270 may include one or more of $SiO_2$, SiN, SiCN, SiOC, SiOCN, $SiO_xN_yC_z$, other suitable material(s), or combinations thereof. In some embodiments, the backside dielectric layer 270 may be formed by PE-CVD, F-CVD or other suitable methods. Subsequently, the backside dielectric layer 270 is planarized by a CMP process to expose the isolation feature 204. In some embodiments, the backside dielectric layer 270 and the isolation feature 204 may include different materials so that the isolation feature 204 may act as a CMP stop. At this processing stage, the source/drain features 245 are vertically sandwiched between the source/drain contact 260 and the backside dielectric layer 270.

Figure 19A:
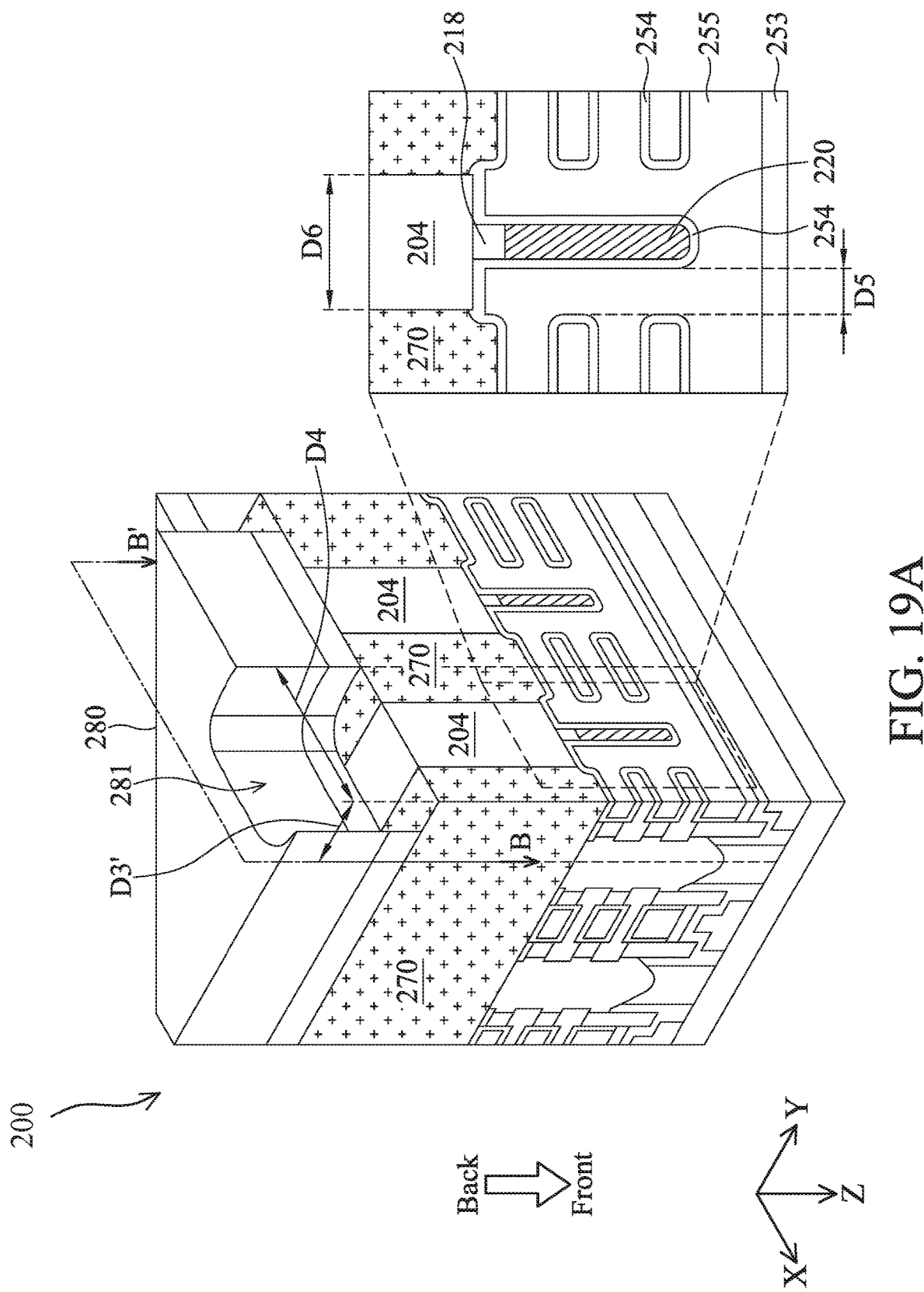
Figure 19B:
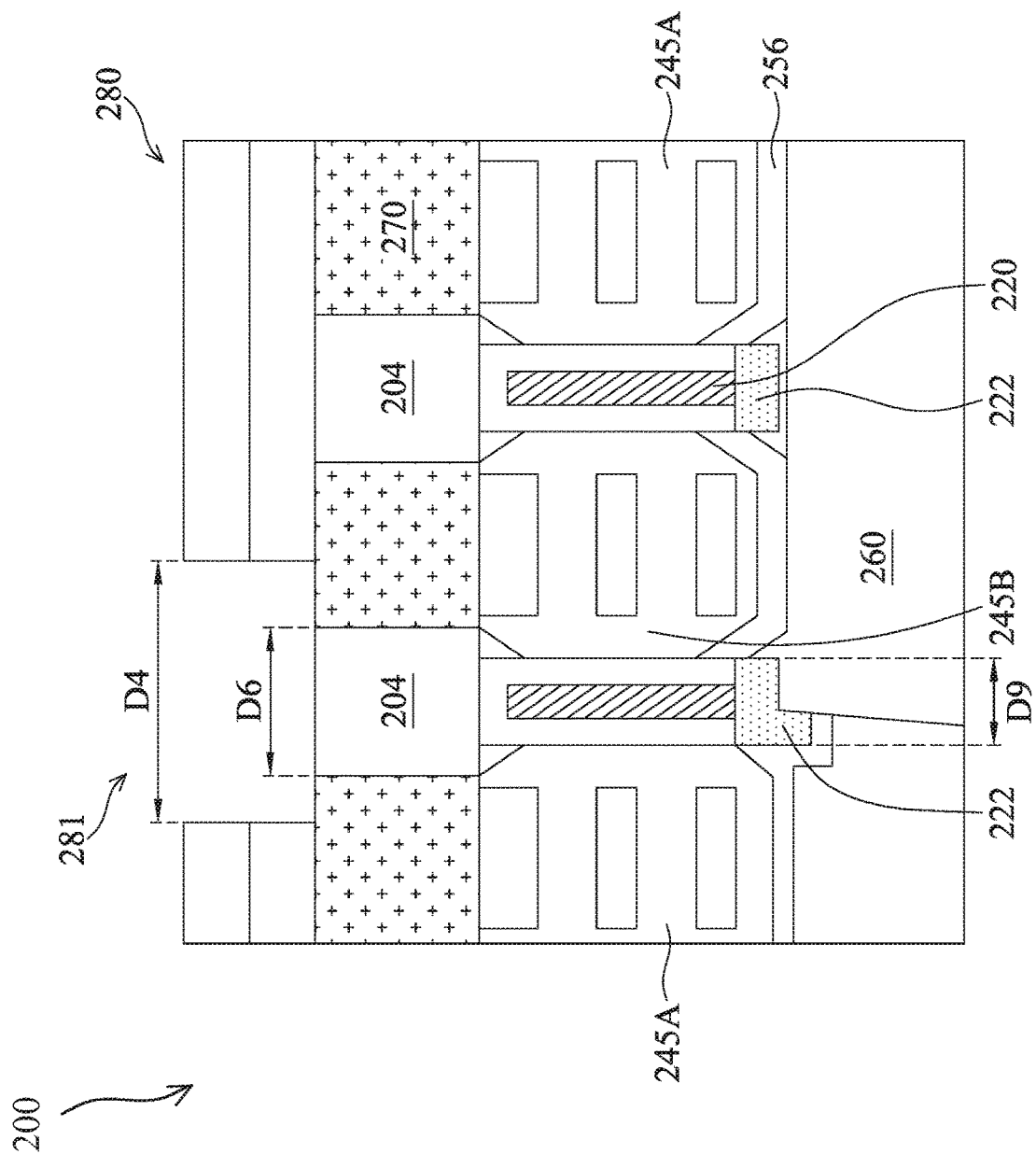

Referring to FIGS. 1C and 19A-19B, method 100 includes a block 138 at which a patterned hard mask 280 that covers the backside of the workpiece 200 while exposing areas a cut feature is formed. In an example process, a hard mask layer is blanketly deposited over the backside of the workpiece 200 using CVD. The hard mask layer may be a single layer or a multi-layer. When the hard mask layer is a multi-layer, the hard mask layer may include a titanium nitride (TiN) layer interfacing with the backside dielectric layer 270 and the isolation feature 204, and silicon nitride (SiN) layer interfacing with the TiN layer. Subsequently, photolithography and etch processes may be performed to pattern the hard mask layer to form the patterned hard mask 280. In some instances, a photoresist layer is deposited over the hard mask layer. To pattern the photoresist layer, the photoresist layer is exposed to radiation reflected from or transmitting through a photomask, baked in a post-exposure bake process, and developed in a developer. The patterned photoresist layer is then applied as an etch mask to etch the hard mask layer, thereby forming the patterned hard mask 280. As illustrated, the patterned hard mask 280 includes a mask opening 281 that is substantially aligned with the to-be-formed pilot opening 282. In some embodiments, the patterned hard mask 280 functions to mask portions of the isolation feature 204 that are not to be etched. In some embodiments, the etch process is configured to be selective to the isolation feature 204 and does not substantially etch the backside dielectric layer 270. Accordingly, the mask opening 281 may or may not expose a portion of the backside dielectric layer 270. In other words, even when the mask opening 281 is larger than the width of the isolation feature 204 or is misaligned, the pilot opening 282 may still be successfully formed.

In some embodiments, the mask opening 281 may have a dimension D3 along the Y-direction and a dimension D4 along the X-direction. In the depicted embodiments, the dimension D3 is configured to extend across the entire width of the gate structure along the Y-direction (in other words, the dimension D3 is greater than the width of the gate structure 250' along the Y-direction) and extend into areas above the source/drain features 245. In the depicted embodiments, the mask opening 281 extends above a p-type source/drain feature 245A and an n-type source/drain feature 245B (which are collectively referred to as the source/drain features 245). It is noted that FIG. 19A illustrates a portion of the gate structure 250' and a portion of the mask opening 281. Accordingly, the illustrated dimension D3' is less than the dimension D3. Moreover, in the depicted embodiments, the dimension D4 is configured to extend across the entire width of the isolation feature 204 (denoted as the width D6) along the X-direction (in other words, the dimension D4 is greater than the width of the isolation feature 204 along the X-direction) and extend into areas vertically above the channel layers 208. At this processing stage, the endcap distance on both sides of the dielectric layers 220 are each distance D5. The distance D5 may be determined by the distance D2 and the thickness of the gate dielectric layers 254. On the other hand, hybrid fin structures 224 (e.g. including the dielectric layer 220, the dielectric layer 222, and the dielectric layer 218), may have a width D9 along the X-direction. The width D9 is determined by the sum of twice the thickness of the dielectric layer 218 and the thickness t1 of the dielectric layer 220 (see FIG. 4).

Figure 20A:
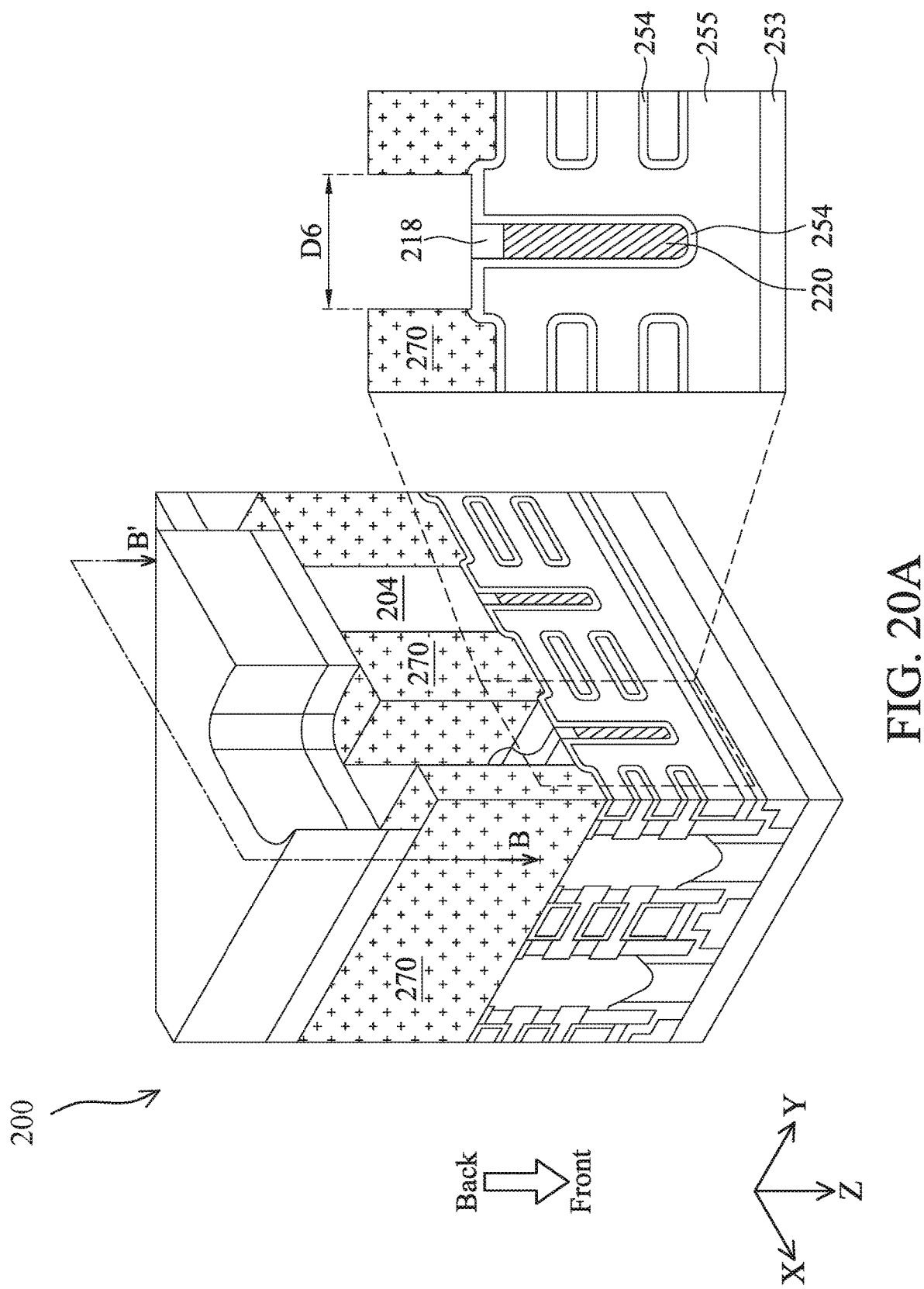
Figure 20B:
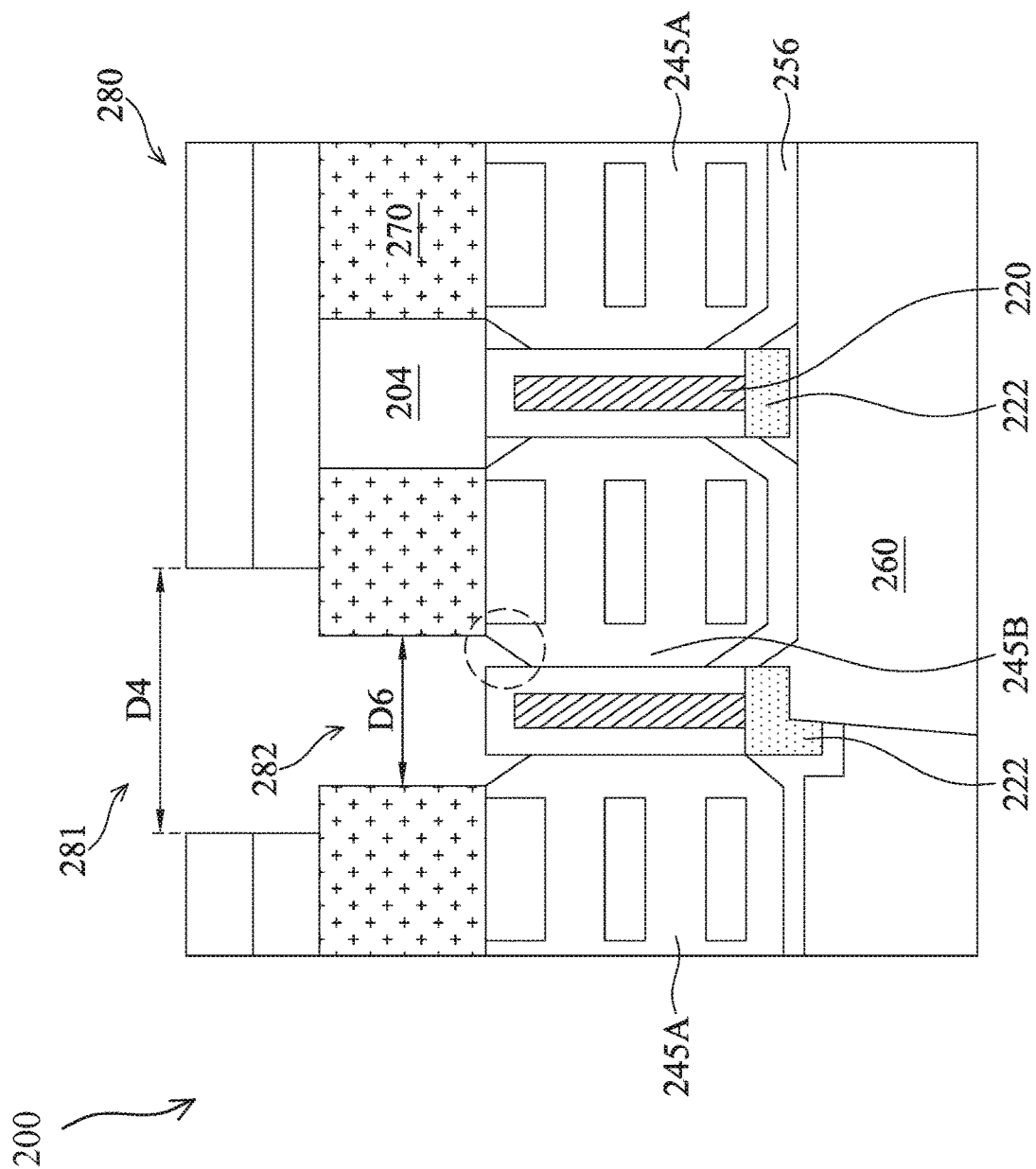

Referring to FIGS. 1C and 20A-20B, method 100 includes a block 140 where pilot opening 282 is formed. In some embodiments, the isolation feature 204 is selectively and anisotropically etched to form the pilot opening 282. In some embodiments, the isolation feature 204 may be etched using a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIGS. 20A-20B, the pilot opening 282 may terminate on top-facing (or backside-facing) surfaces of the gate dielectric layer 254, the gate spacer 234, and the CESL 243, without extending into the gate electrode layer 255 of the gate structure 250'. As described above, the pilot opening 282 has a width along the X direction that is substantially determined by the width D6 of the isolation features 204, and is less than the width D4 of the mask opening 281; and a width along the Y-direction substantially determined by the width D3 of the mask opening 281. In some embodiments, the pilot opening 282 exposes the backside-facing surface of the dielectric layer 218 above the dielectric layer 220 as well as portions of the source/drain features 245. As illustrated in FIG. 20B, in the depicted embodiments, the pilot opening 282 exposes portions of the source/drain features 245A and 245B.

Figure 21A:
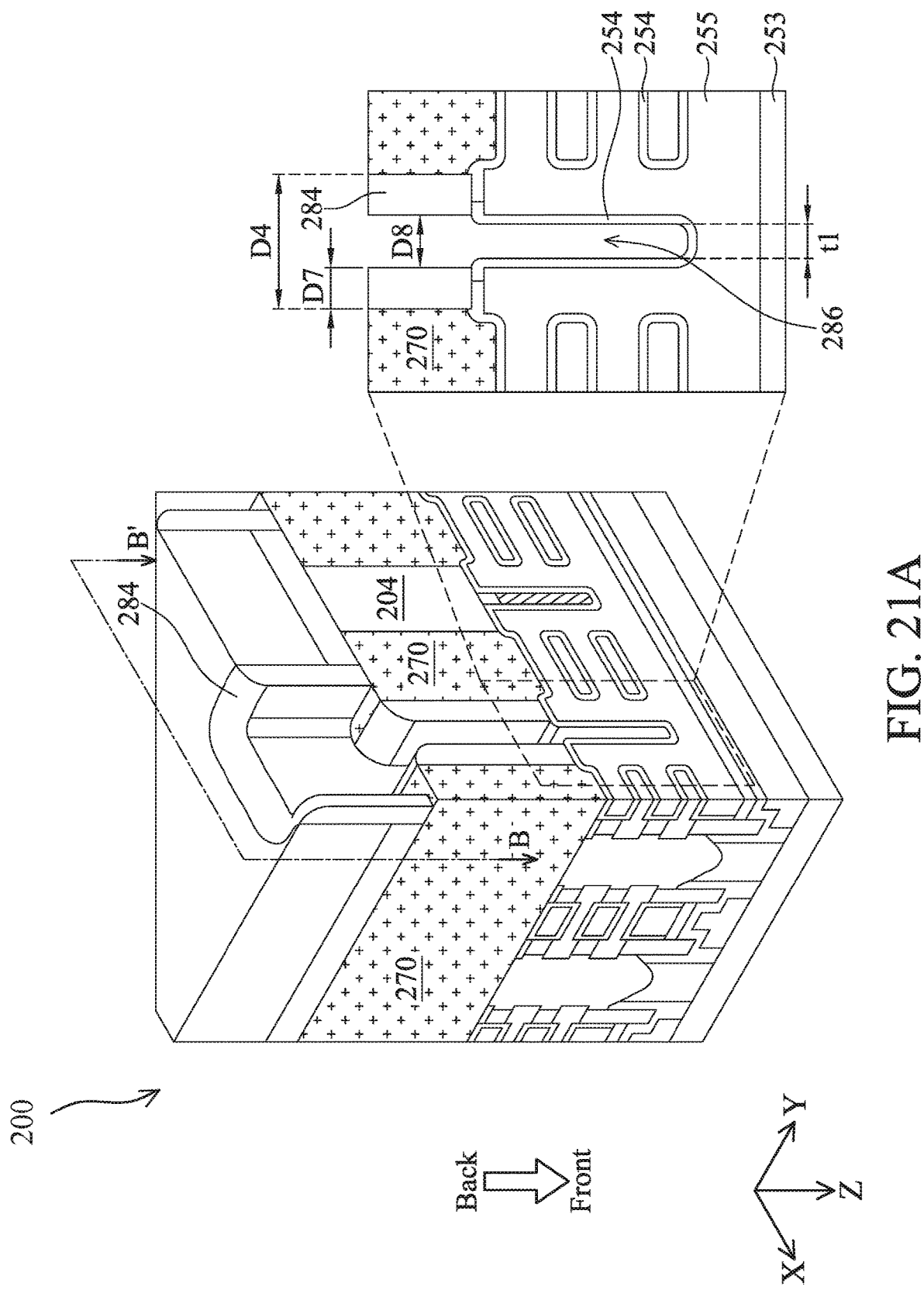
Figure 21B:
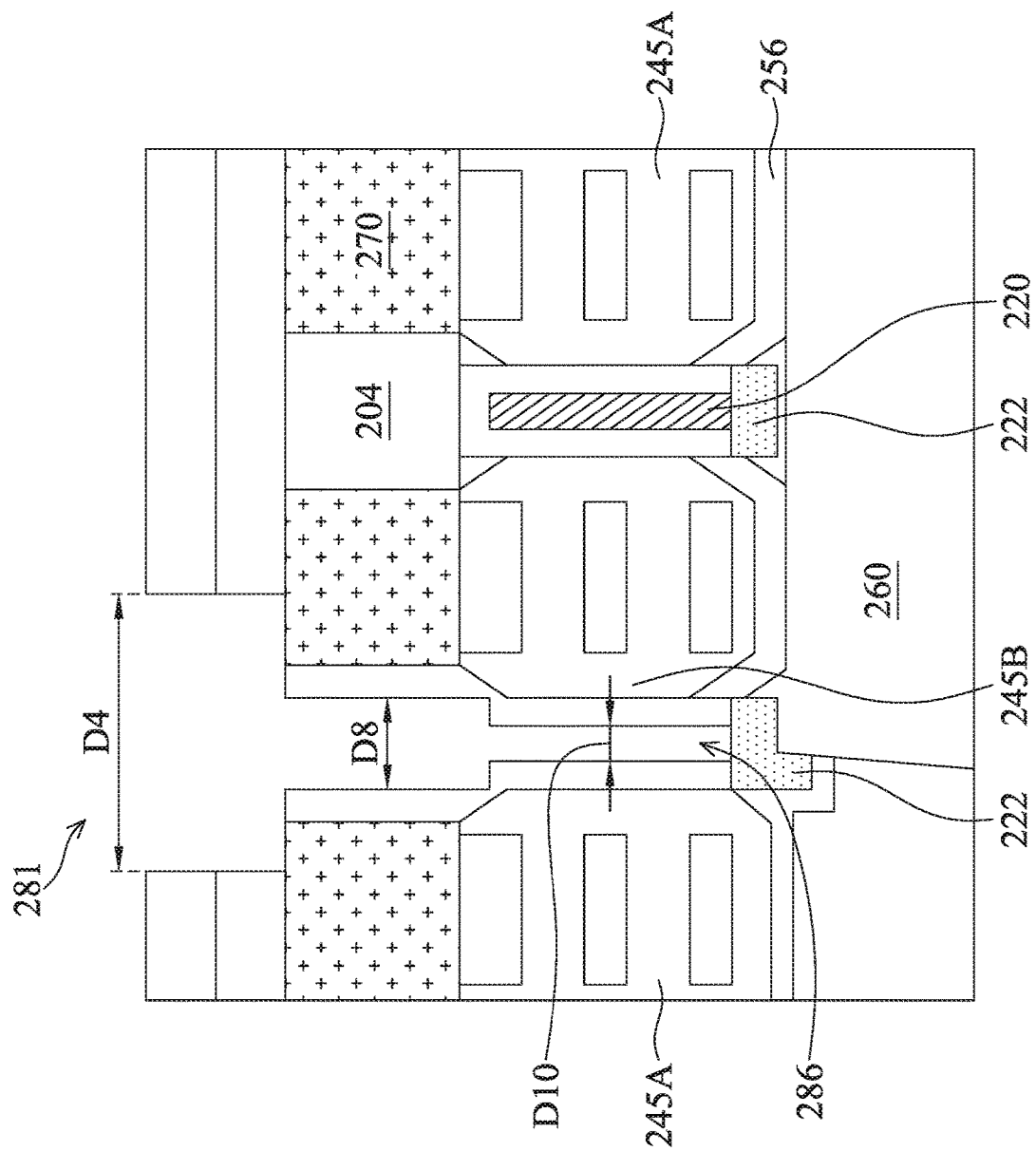

Referring to FIGS. 1C and 21A-21B, method 100 includes a block 142 where a liner 284 is deposited along sidewalls of the pilot opening 282 and reduces the size of the pilot opening 282, for example, from D4 to D8 along the X-direction. The liner 284 defines a distance between the to-be-formed gate cut feature and the channel layer 208. The liner 284 may be referred to as a cut metal gate end cap layer. The liner 284 also functions to protect the source/drain features 245 from a subsequent etch process. The liner 284 may be a single layer or a multi-layer. In an example process, at least one dielectric material is deposited over the backside of the workpiece 200 and then the deposited dielectric material is anisotropically etched back to expose the gate dielectric layer 254. In some instances, the at least one dielectric material for the liner 284 may include silicon, oxygen, nitrogen, or carbon. For example, the at least one dielectric material may include silicon nitride, silicon carbonitride, silicon oxycarbonitride, silicon oxycarbide, or silicon oxynitride. After the etch back process, the liner 284 may have a thickness D7 between about 2 nm and about 12 nm. If the thickness D7 is too small, inadvertent etching of excessive amount of gate electrode material may occur in some circumstances; while if D7 is too large, subsequent formation and extension of the gate cut opening may be difficult. In some embodiments, the thickness D7 may equal half of the difference between D4 and D8. In the depicted embodiments, the liner 284 covers the otherwise exposed portions of the source/drain features 245A and 245B (compare FIG. 20B). Moreover, the liner 284 are not formed on the backside-facing surface of the dielectric layer 218, but rather are formed exclusively on the top surfaces of the gate dielectric layer 254. In some embodiments, the liner 284 further assists defining and tuning of the endcap distance, as described in detail later.

Still referring to FIGS. 1C and 21A-21B, the method 100 includes a block 144 where, with the liner 284 in place, the dielectric layer 218 still exposed in the pilot opening 282 (see FIG. 20A), as well as the dielectric layer 220 therebeneath, is removed, thereby forming the gate cut opening 286. In some embodiments, this may be a multi-step etching operation. In some embodiments, the removal of the dielectric layer 220 may implement parameters that selectively removes the materials of the dielectric layer 220 without substantially damages the gate dielectric layer 254. Accordingly, following the removal, the gate cut opening 286 has a gap width that is substantially determined by the width t1 of the dielectric layer 220 (see FIG. 4), and therefore is also referred to as the gap width t1. In some embodiments, the gap width t1 is less than the distance D8. In some embodiments, the gate cut opening 286 extends into the source/drain regions, as illustrated in FIG. 21B. Accordingly, the dielectric layer 222 are exposed in the gate cut openings 286.

Figure 22A:
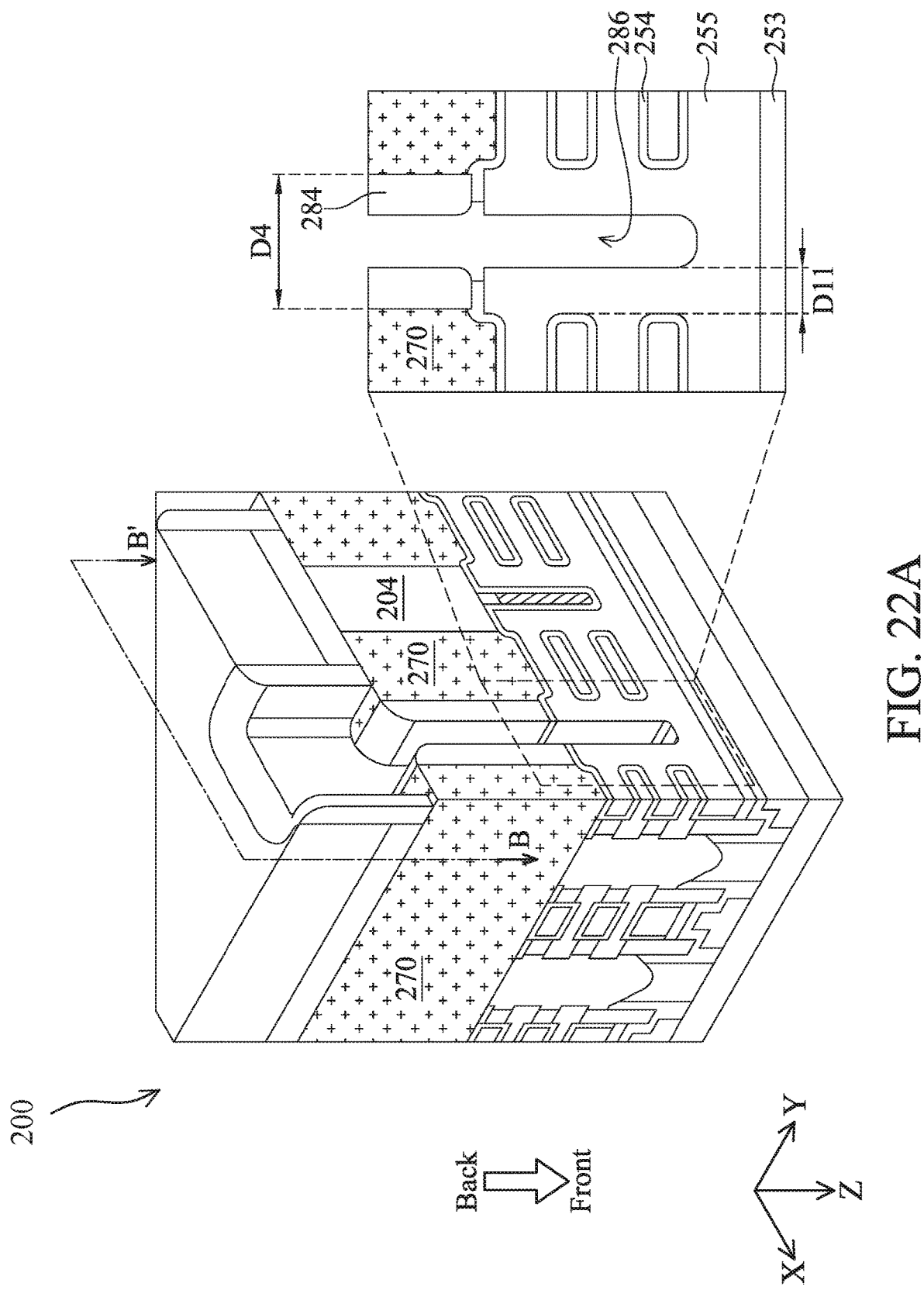
Figure 22B:
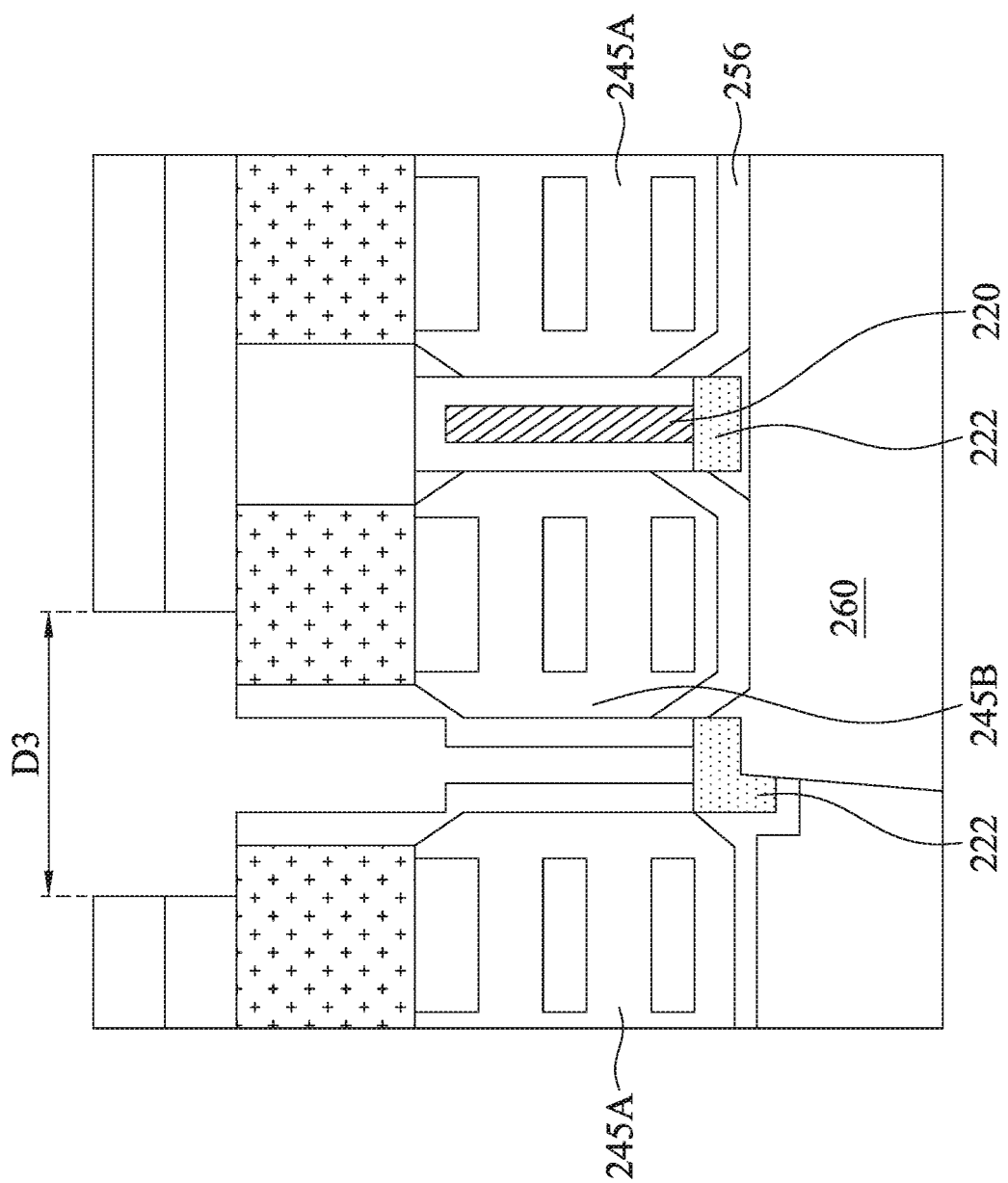
Figure 23A:
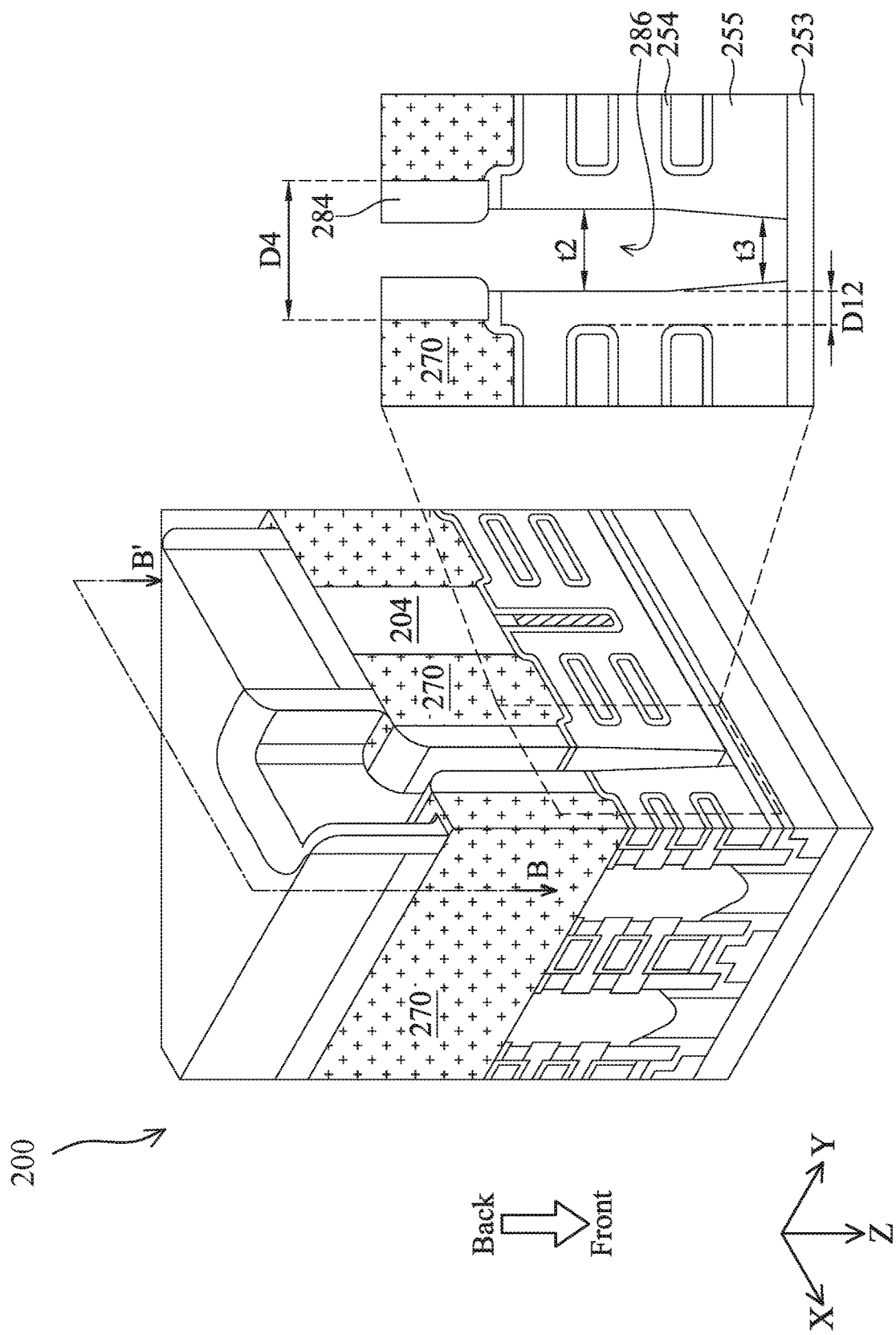
Figure 23B:
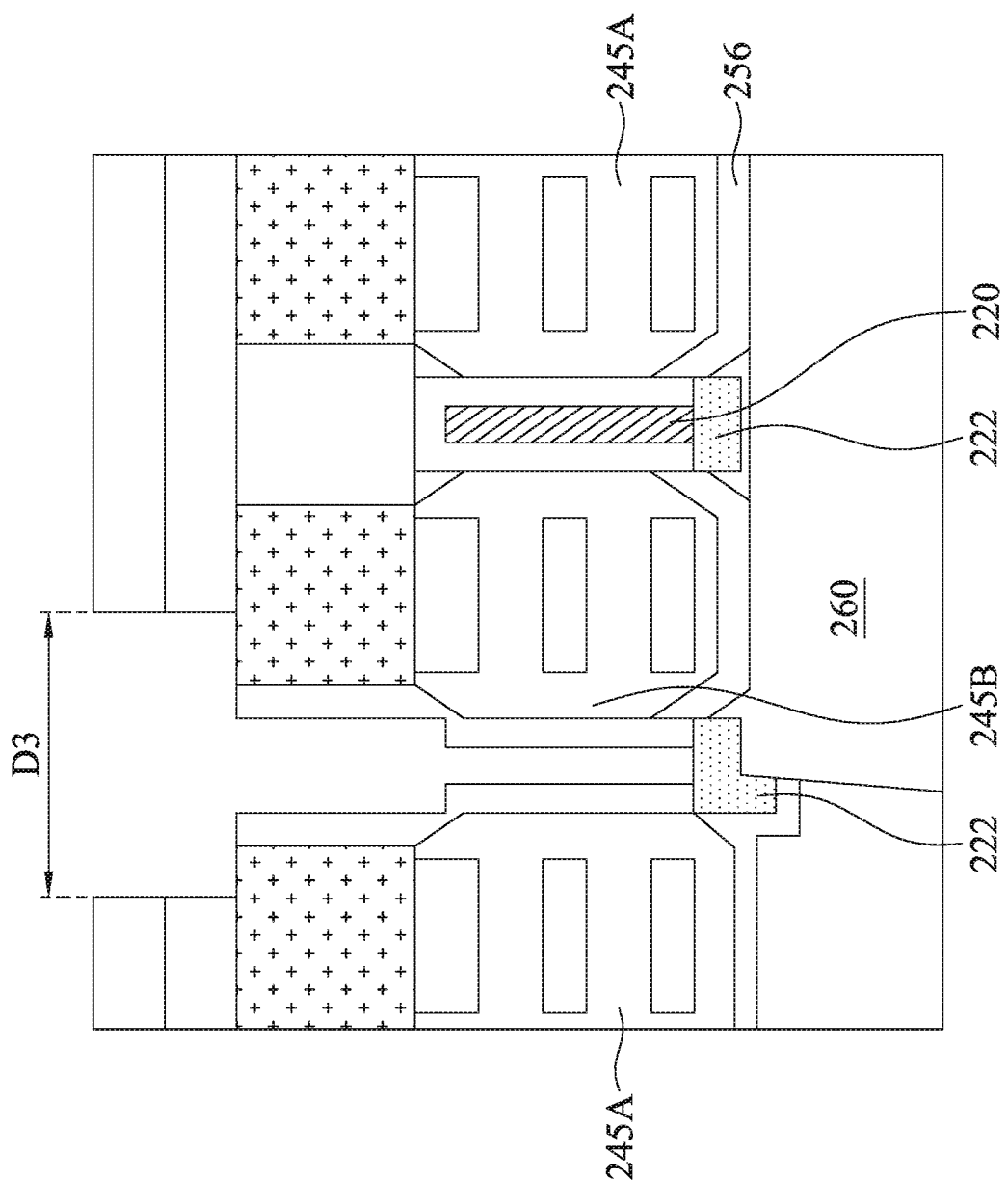

The method proceeds to extend the gate cut opening 286 through the gate structure 250'. In the depicted embodiments, the extension is a multi-step process. Referring to FIGS. 1C and 22A-22B, method 100 includes a block 146 where the gate dielectric layer 254 is removed, thereby exposing surfaces of the underlying gate electrode layer 255. For example, an anisotropic etch (e.g. dry plasma etching) may be implemented to remove the gate dielectric layer 254. Alternatively, an isotropic etch (e.g. wet etching or dry chemical etching) may be implemented to remove the gate dielectric layer 254. Meanwhile, gate dielectric layer 254 surrounding the channel layers 208 are not exposed at this processing stage, such that they are not affected by this removal process. At this processing stage, the end cap distance, referred to as distance D11 may be similar to the distance D5.

At this processing stage, the surfaces of the gate electrode layer 255 are exposed in the gate cut openings 286. Referring to FIGS. 1C and 23A-23B, method 100 includes a block 148 where the gate electrode layer 255 may be recessed. For example, as illustrated in FIG. 23A, the gate electrode layers 255 are laterally recessed and the gate cut openings 286 are laterally widened. Accordingly, the width of the gate opening 286 along the X-direction increases to distance t2, and the endcap distance between the sidewall surface of the gate dielectric layer 254 and the sidewall surface of the gate electrode layer 255 (or the sidewall surfaces of the gate cut opening 286) is reduced from D11 to D12. In some embodiments, the reduced endcap distance leads to reduced capacitance between gate electrodes and reduced capacitance between gate electrode and the source/drain features 245, thereby improving device performances (such as speed). Moreover, the gate electrode layers 255 are vertically recessed and the gate cut openings 286 are vertically deepened to reach the backside-facing surface of the gate electrode capping layer 253. In some embodiments, the gate electrode cap layer 253 may serve as an etching stop layer during the vertical recessing process. In the depicted embodiments, the newly-formed bottom portion of the gate cut opening 286 may have a width t3 that is less than the width t2. Meanwhile, the dielectric layer 222 at the bottom of the gate cut opening 286 in the source/drain regions (see FIG. 23B), protects the source/drain contacts 260 below the dielectric layer 222, such that damages to the source/drain contacts 260 are minimized, if any.

Figure 24A:
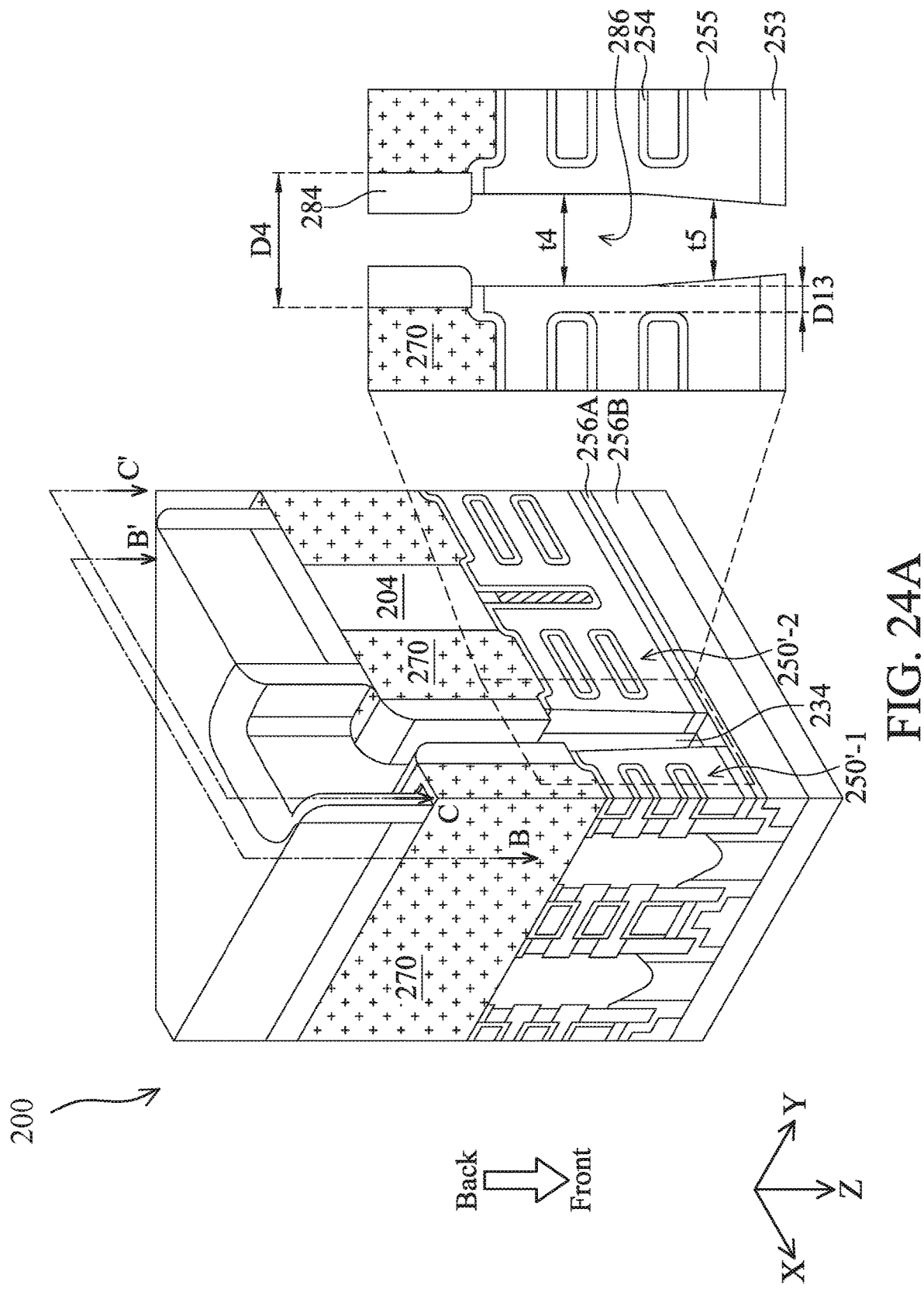
Figure 24B:
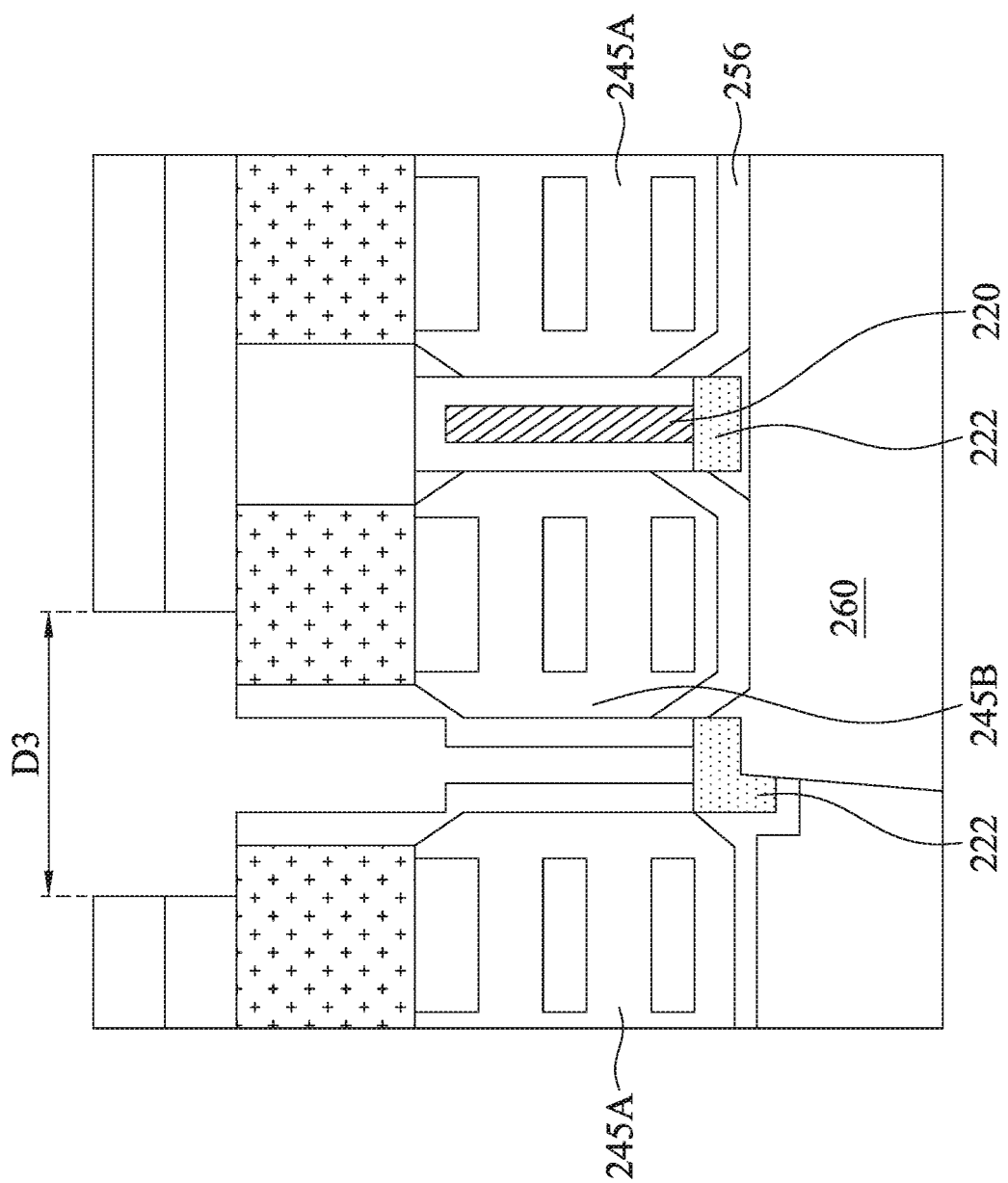
Figure 24C:
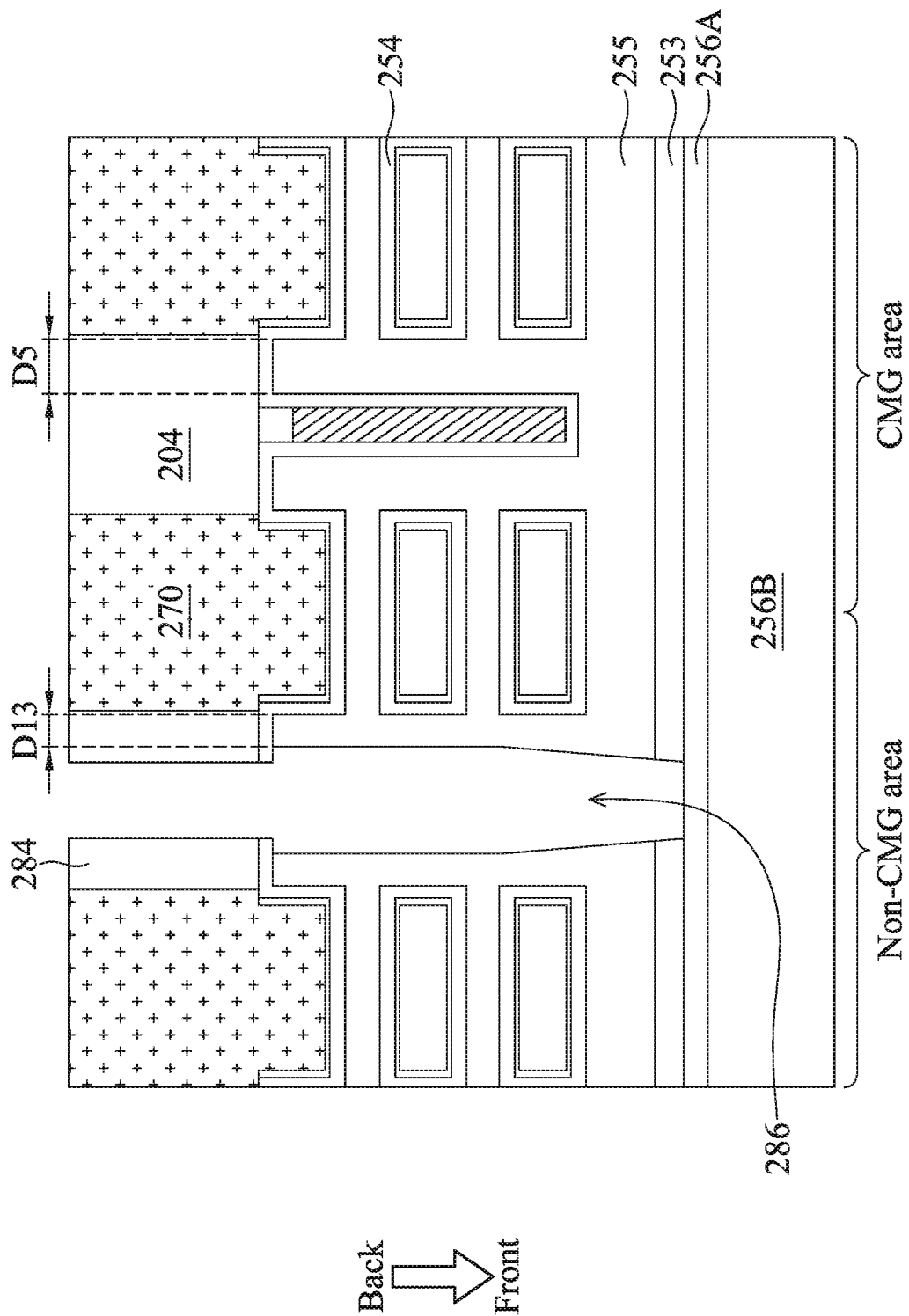

Referring to FIGS. 1C and 24A-24B, method 100 includes a block 150 where the gate cut opening 286 is further extended to go through the gate electrode capping layer 253, in other words, to reach the surface of the gate SAC dielectric layers 256. In some embodiments, the gate electrode cap layer 253 is etched with the gate SAC dielectric layer 256A as an etch stop layer. In some embodiments, etching parameters implemented may differ from that of the previous vertical recessing operation described above with respect to FIG. 23A. Meanwhile, the gate electrode layer 255 may be further recessed laterally during the process, such that the gate cut opening 286 is still further widened (e.g. to a width t4), and the endcap distance is still further reduced (e.g. to distance D13). In some embodiments, the width t4 may be about 6 nm to about 42 nm. In some embodiments, the distance D13 is about 4 nm to about 15 nm. In some embodiments, the width t4 may be significantly larger, and the distance D13 may be significantly smaller than in structures obtained from approaches not implementing methods of the present disclosure. As compared to those approaches, the present structure provides improved gate isolation without compromising the material flow or access at the channel release stage or the gate replacement stage. At this processing stage, the gate cut opening 286 is completed, which separates the otherwise continuous gate structure 250' (and the otherwise continuous gate electrode layer 255) into electrically isolated portions, such as into gate structures 250'-1 and 250'-2.

The area where the gate cut opening 286 is formed is referred to as the gate cut region; while areas along the gate structures 250' other than where the gate cut opening 286 is formed is referred to as the non-gate cut region. FIG. 24C is a cross-sectional view of the workpiece 200 along the X-Z plane in the gate electrode region. As illustrated, the end cap distance in the gate cut regions is the distance D13; while that in the non-gate cut regions is the distance D5. The distance D13 is substantially less than the distance D5. In some embodiments, a ratio of the distance D5 to the distance D13 is about 1:0.2 to about 1:0.9. As compared to approaches where all dielectric layers 220 are replaced with gate cut features having a larger width, the gate resistances are reduced. Furthermore, as compared to some other approaches where the dielectric layers 222 are not removed (which remains between the top surface of the dielectric layer 220 and the gate electrode capping layer 253), the gate resistance is also reduced due to the continuous presence and larger volume of conductive pathway.

In the illustrated embodiment, operations at block 150 expose the gate spacer 234 in the lower portion of the gate cut opening 286. Alternatively, the gate spacer 234 may be further removed in a selective etching process, such that the CESL 243 may be exposed in the gate cut opening 286. In yet another embodiment, the CESL 243 may be further removed in a selective etching process, such that the ILD layer 244 is exposed in the gate cut opening 286. One benefit of removing the gate spacer 234 and/or the CESL 243 is that the lower portion of the gate cut opening 286 can be expanded along the X direction, allowing a larger volume of air gap(s) to be formed in the gate cut feature subsequently formed in the gate cut opening 286. As described below, the air gap(s) further improves isolation between gate segments, as described below.

Referring to FIGS. 1C and 25A-25C, method 100 includes a block 152 where a dielectric material is deposited in the gate cut opening 286 to form a gate cut feature 288. In some embodiments, the gate cut feature 288 is formed of a low-k dielectric material to reduce parasitic capacitance. The dielectric material for the gate cut feature 288 may be deposited using plasma-enhanced CVD (PECVD), high-density-plasma CVD (HDPCVD), or CVD. In some instances, the dielectric material for the gate cut feature 288 may include silicon nitride, silicon carbonitride, silicon oxycarbonitride, silicon oxycarbide, or silicon oxynitride. The gate cut feature 288 may be a single layer or a multilayer. When the gate cut feature 288 is a multilayer, the gate cut feature 288 may include a dielectric liner 288A in contact with the gate segments and a dielectric filler 288B spaced apart from the gate segments by the dielectric liner (see FIGS. 25B-1 and 25C-1). The dielectric liner and the dielectric filler may be formed of different materials. For example, the dielectric liner is oxygen-free while the dielectric filler includes oxygen. For another example, the dielectric liner may have a dielectric constant greater than that of the dielectric filler. When the gate cut feature 288 is a multilayer, the dielectric liner may have a thickness between about 1 nm and about 6 nm. Operations at block 152 may include performing a planarization process, such as a CMP process, to the gate cut feature 288 to remove excessive dielectric materials from the backside of the workpiece 200 and expose the backside dielectric layer 270, the isolation feature 204, and the liner 284.

At this processing stage, the workpiece includes a hybrid fin structure 224 (having a width D6 in the upper region and a width D9 in the lower region) in the source/drain region separating adjacent source/drain features 245; and have a gate cut feature 288 (having a width t4 in the upper region and a width t5 in the lower region) in the gate region separating adjacent gate portions 250'-1 and 250'-2. The width t4 is greater than the D9. And the width D9 is about the same as the sum of D10 and twice the thickness of the dielectric layer 218. Although not explicitly depicted, the gate cut features 288 of the present disclosure may span across more than one joint gate structures.

Figure 25A:
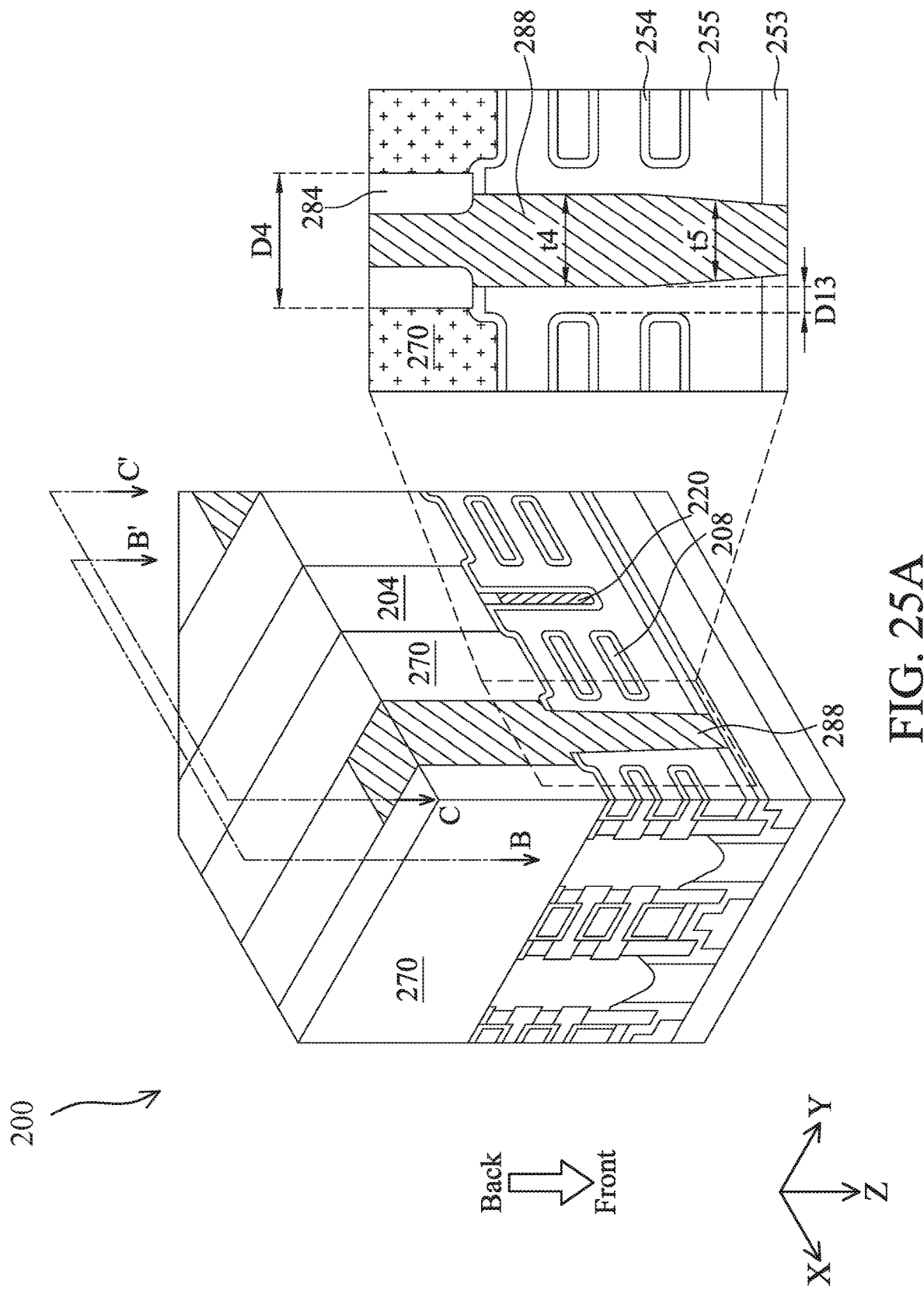
Figure 25B:
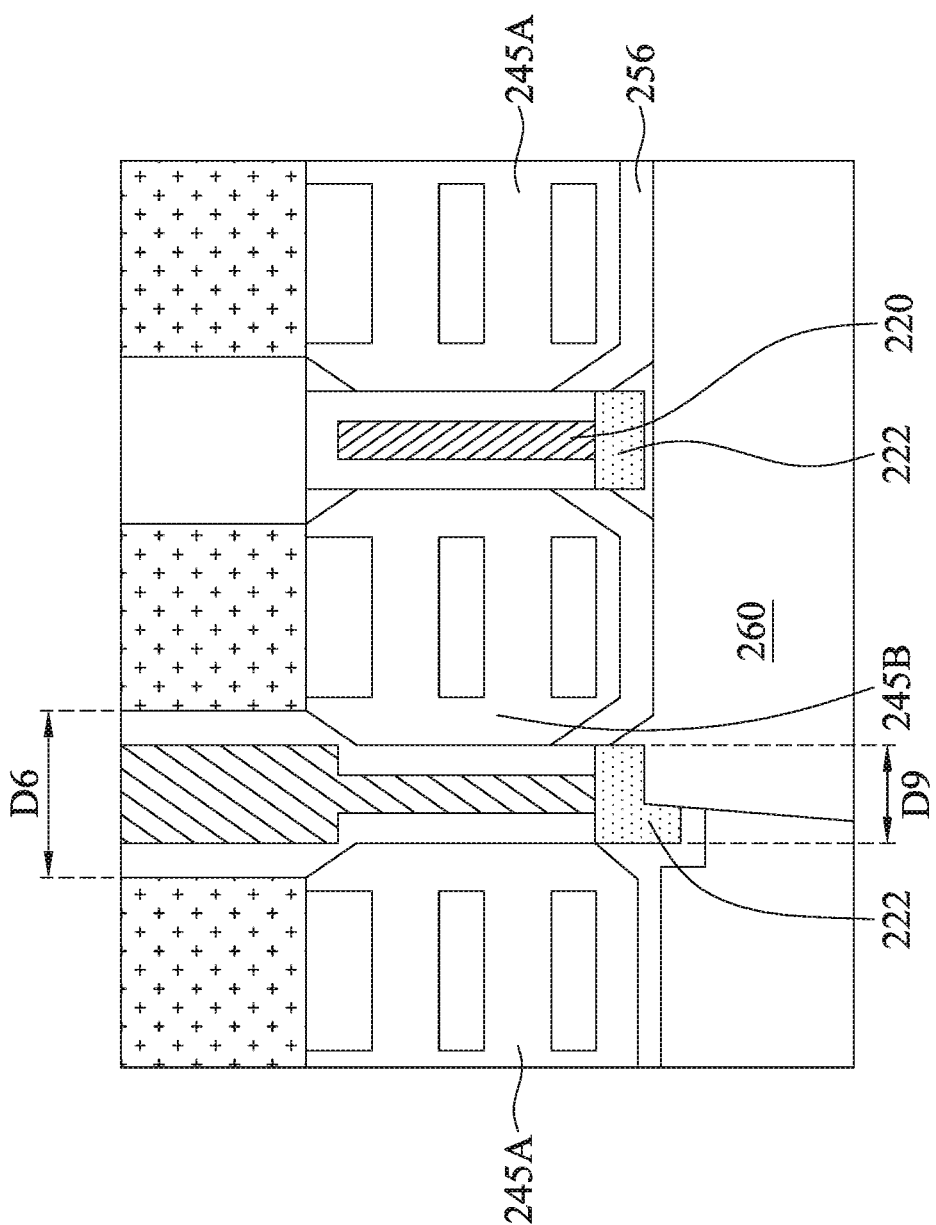
Figures 1, 25B:
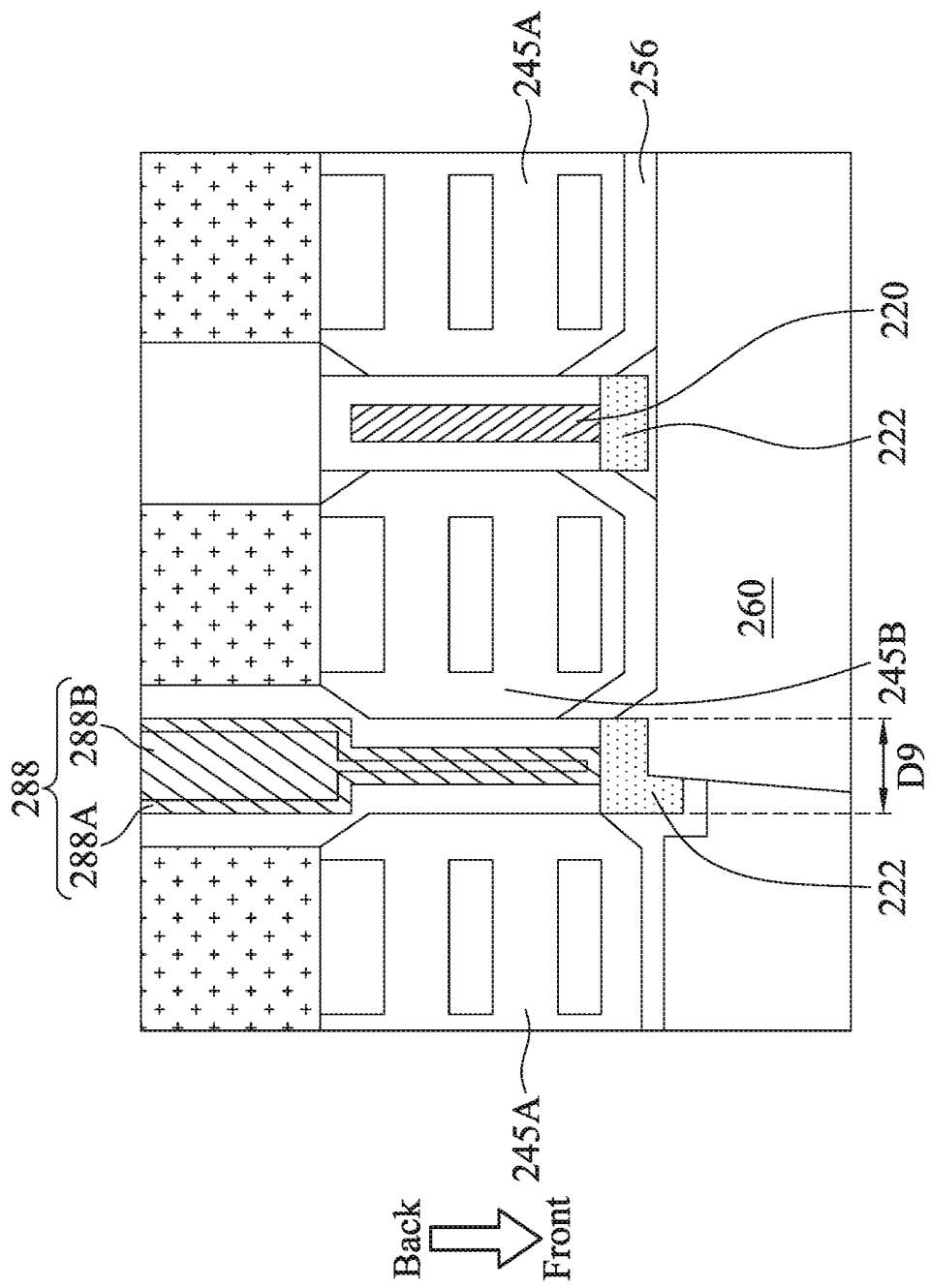
Figures 2, 25B:
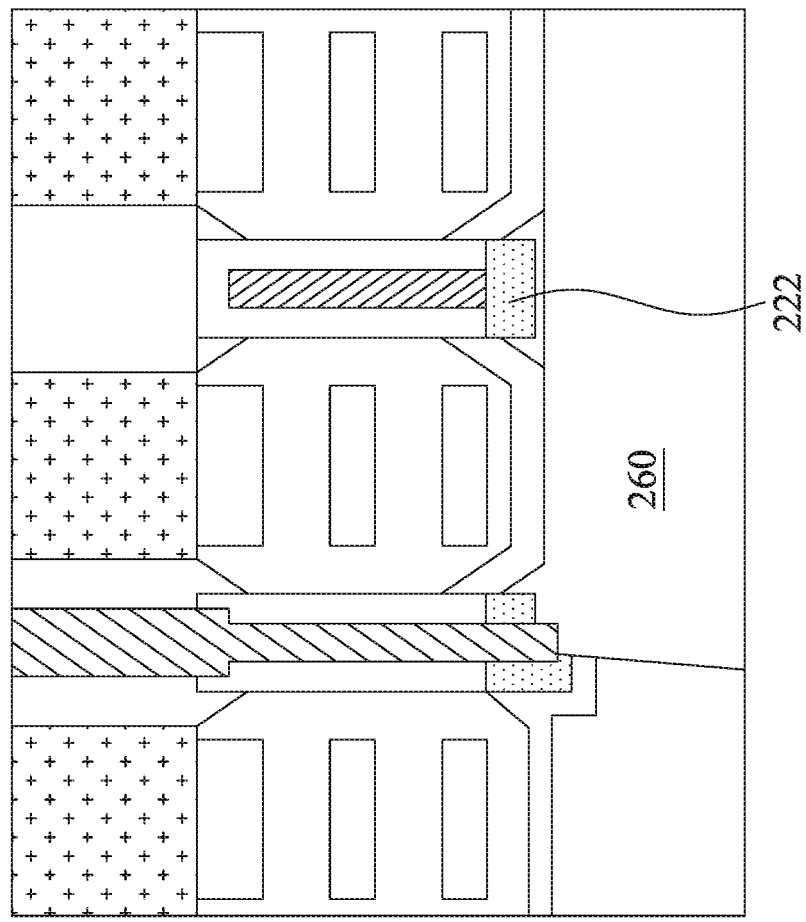
Figures 3, 25B:
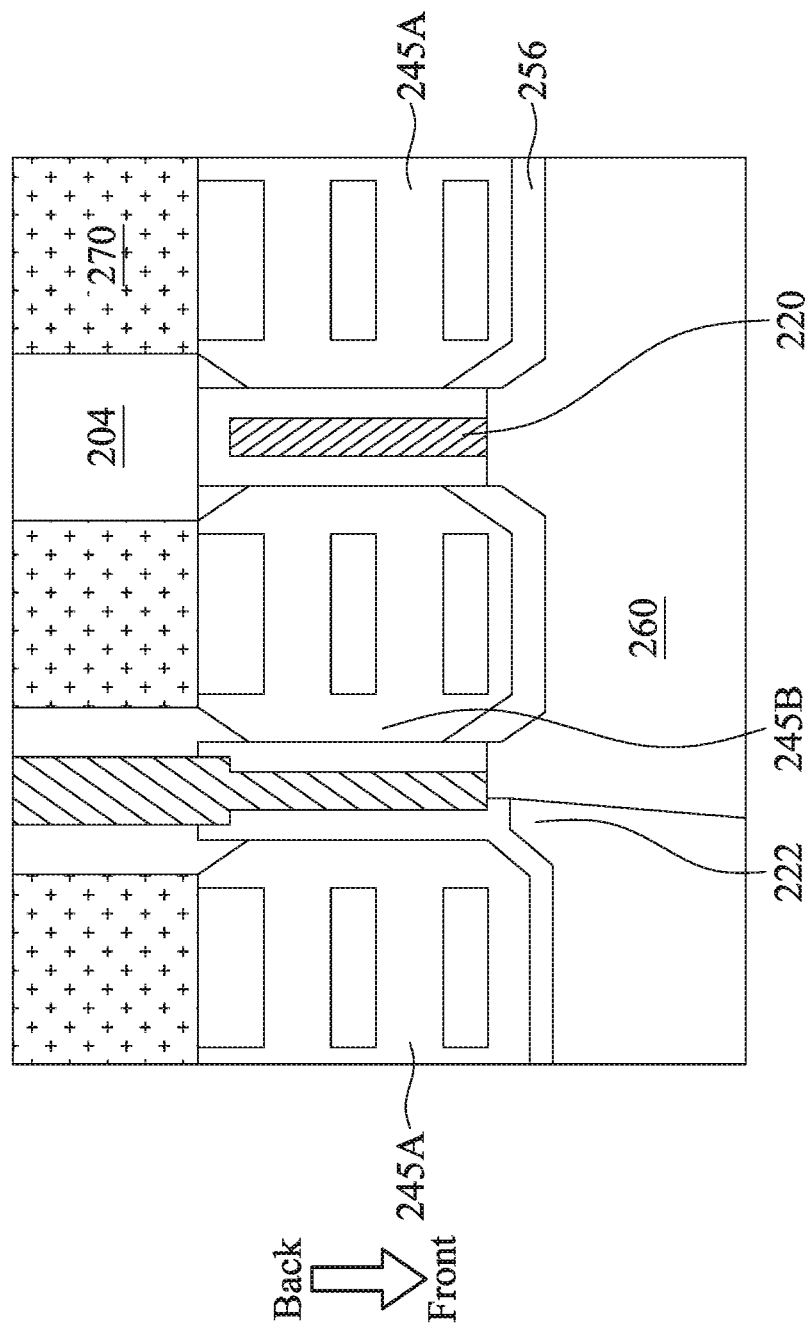
Figures 4, 25B:
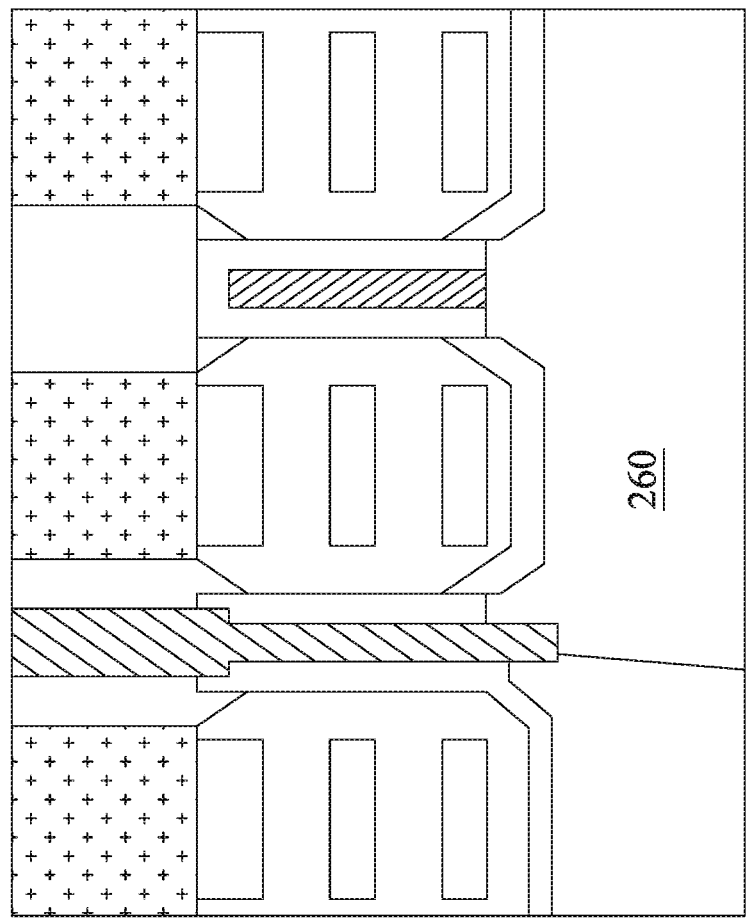
Figure 25C:
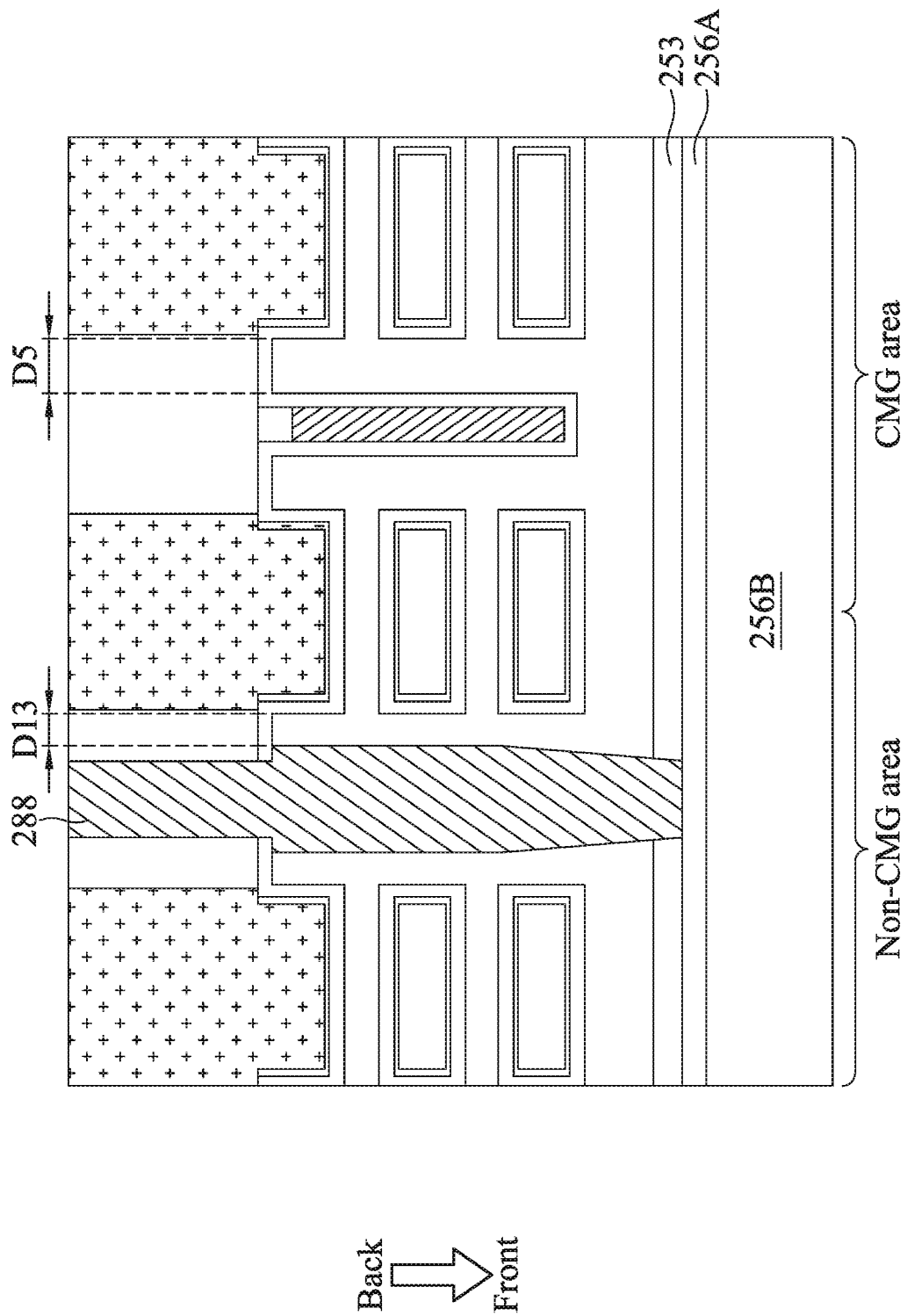
Figures 1, 25C:
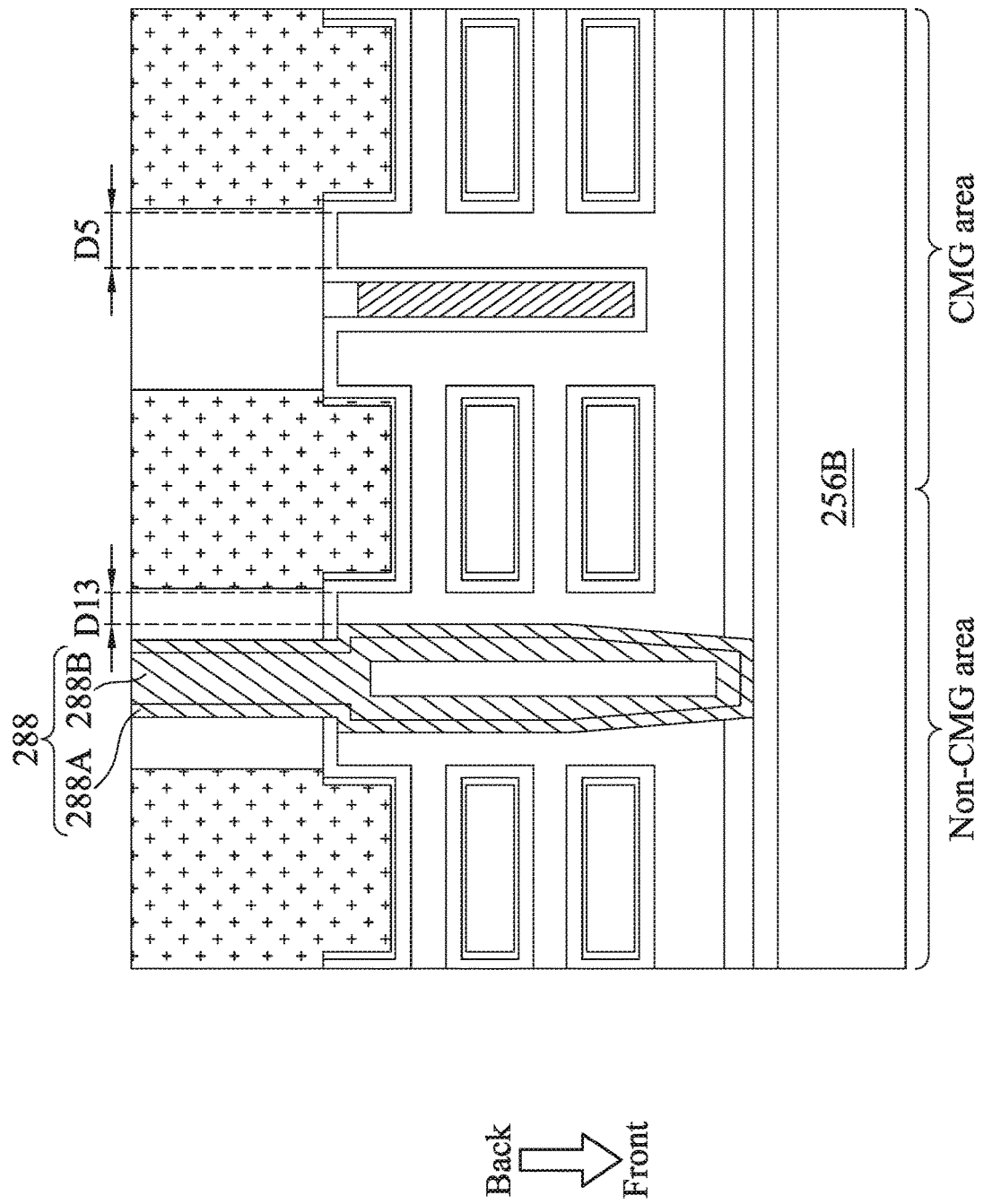
Figures 2, 25C:
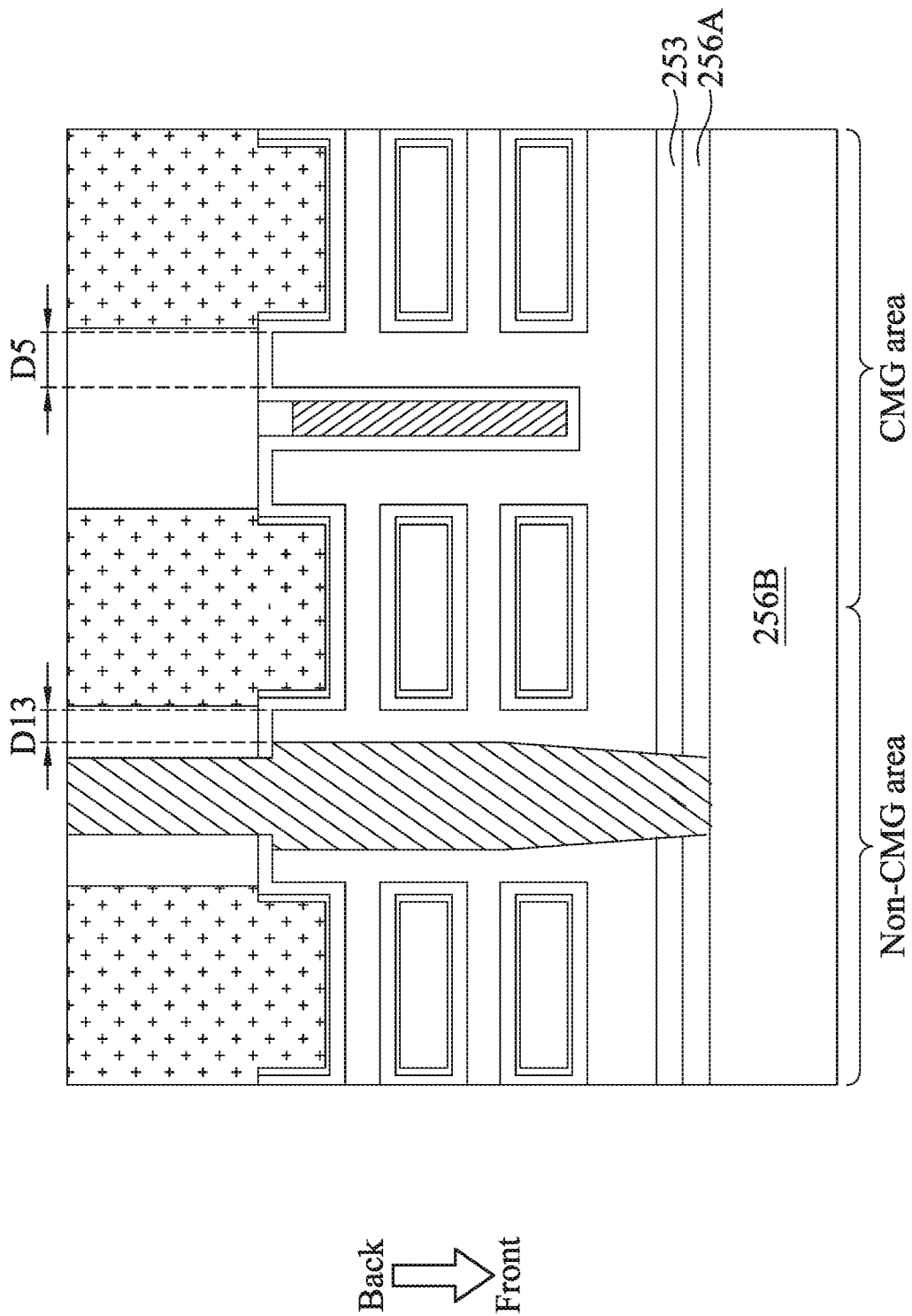
Figures 3, 25C:
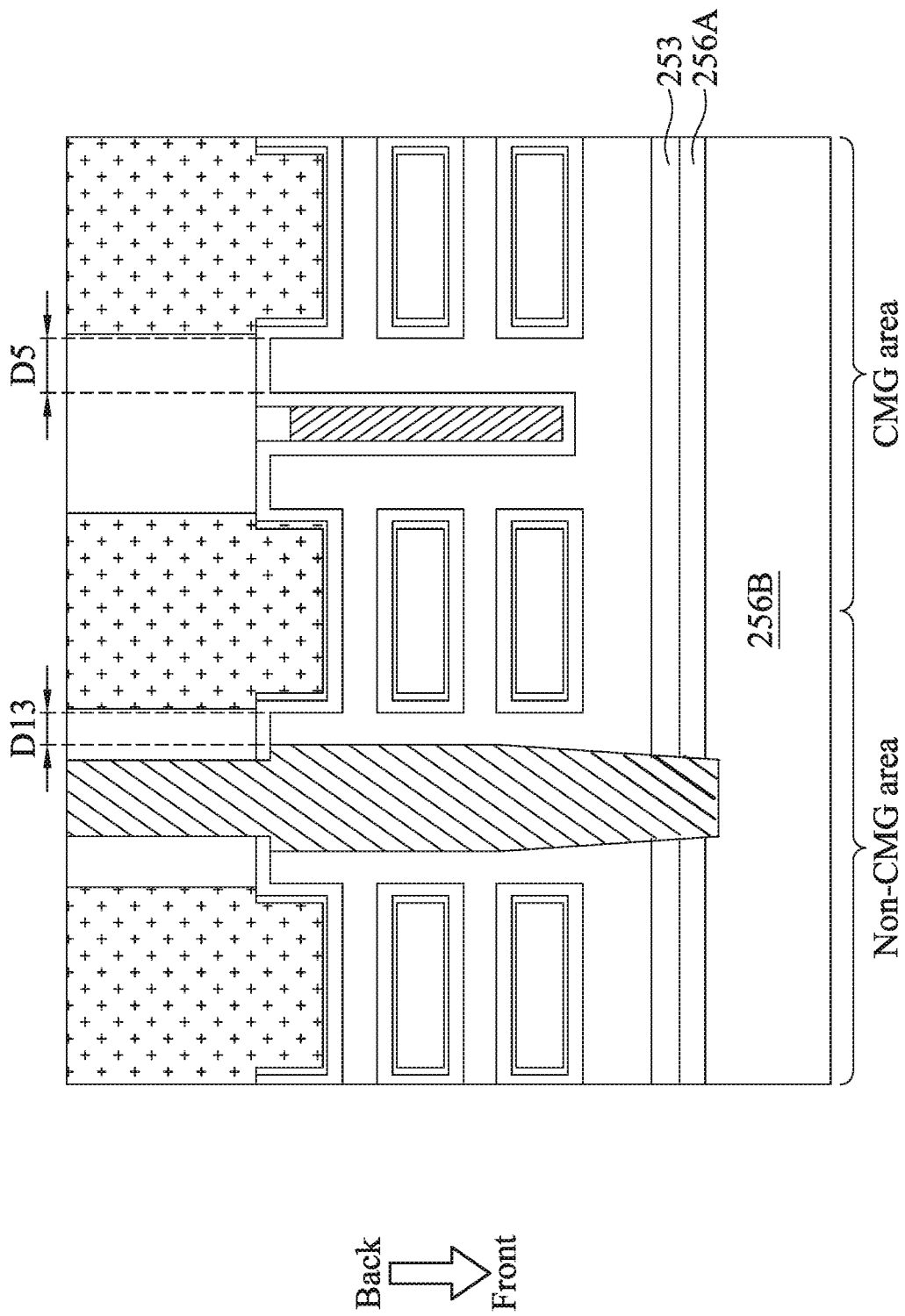

In some alternative embodiments, the gate cut opening 286 may have been further extended prior to the block 152 of FIG. 1C. For example, referring to FIGS. 25C-2 and 25C-3, the gate cut opening 286 may have been extended such that after the deposition of dielectric material, the gate cut feature 288 extends through the gate SAC dielectric layer 256A to reach the front-facing surface of the gate SAC layer 256A (FIG. 25C-2) or to further extend into the gate SAC layer 256B (FIG. 25C-3). These schemes further ensure electric isolation between the adjacent gate portions 250'-1 and 250'-2 for the proper functioning of the device. In some embodiments, the forming of the gate cut openings 286 in the source/drain regions include extending through the dielectric layers 222 to expose a backside-facing surface of the contact feature 260. Accordingly, the gate cut feature 288 extends through to reach the contact feature 260. In some alternative embodiments, the dielectric layers 222 in the source/drain regions have been removed entirely (see FIGS. 25B-3 and 25B-4), such as at the processing stage associated with FIG. 10. Accordingly, the gate cut feature 288 similarly extend to reach a back-facing surface of the contact feature 260 (FIG. 25B-3) or further extend into the contact feature 260 (FIG. 25B-4).

Figure 26A:
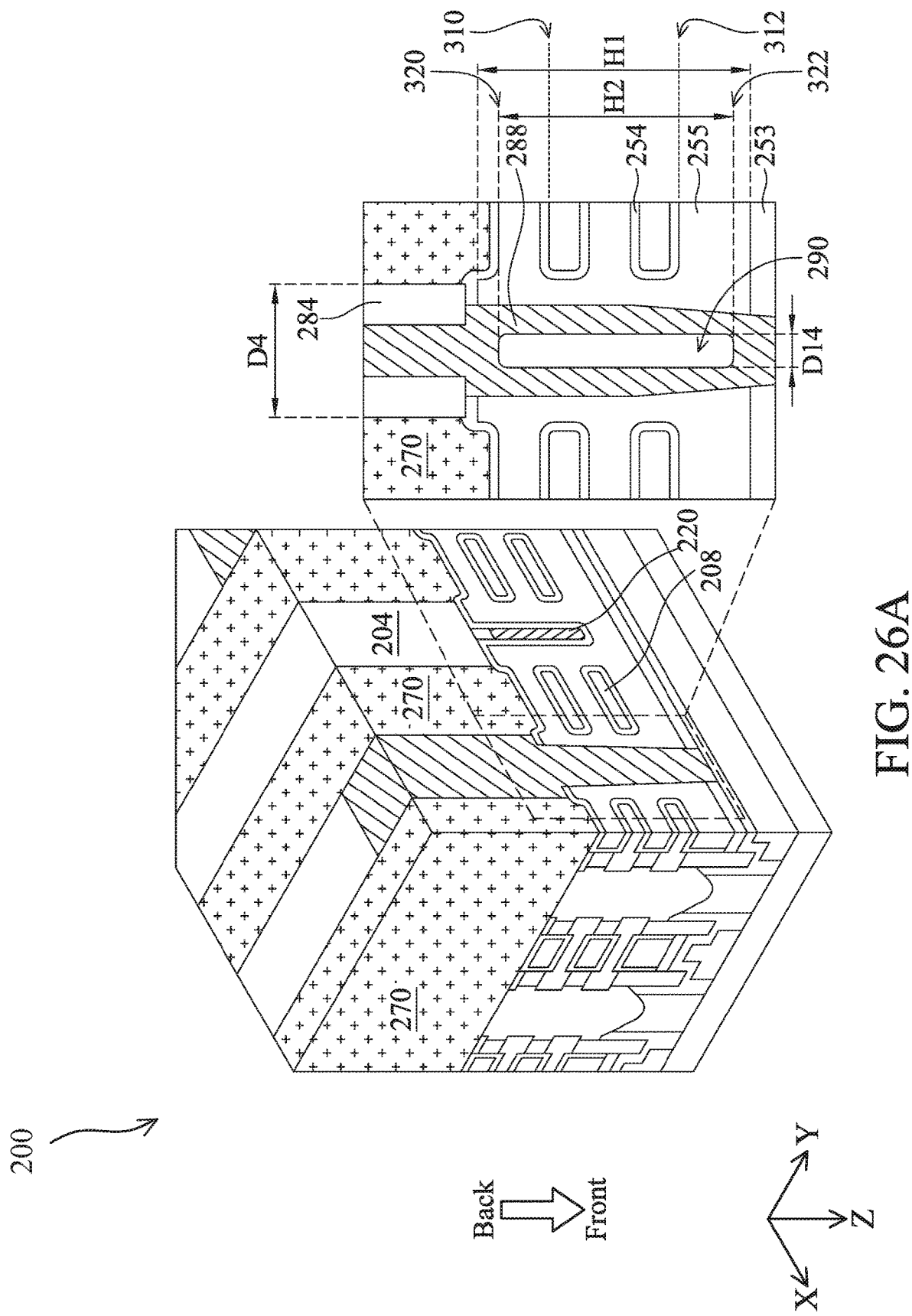
Figure 26B:
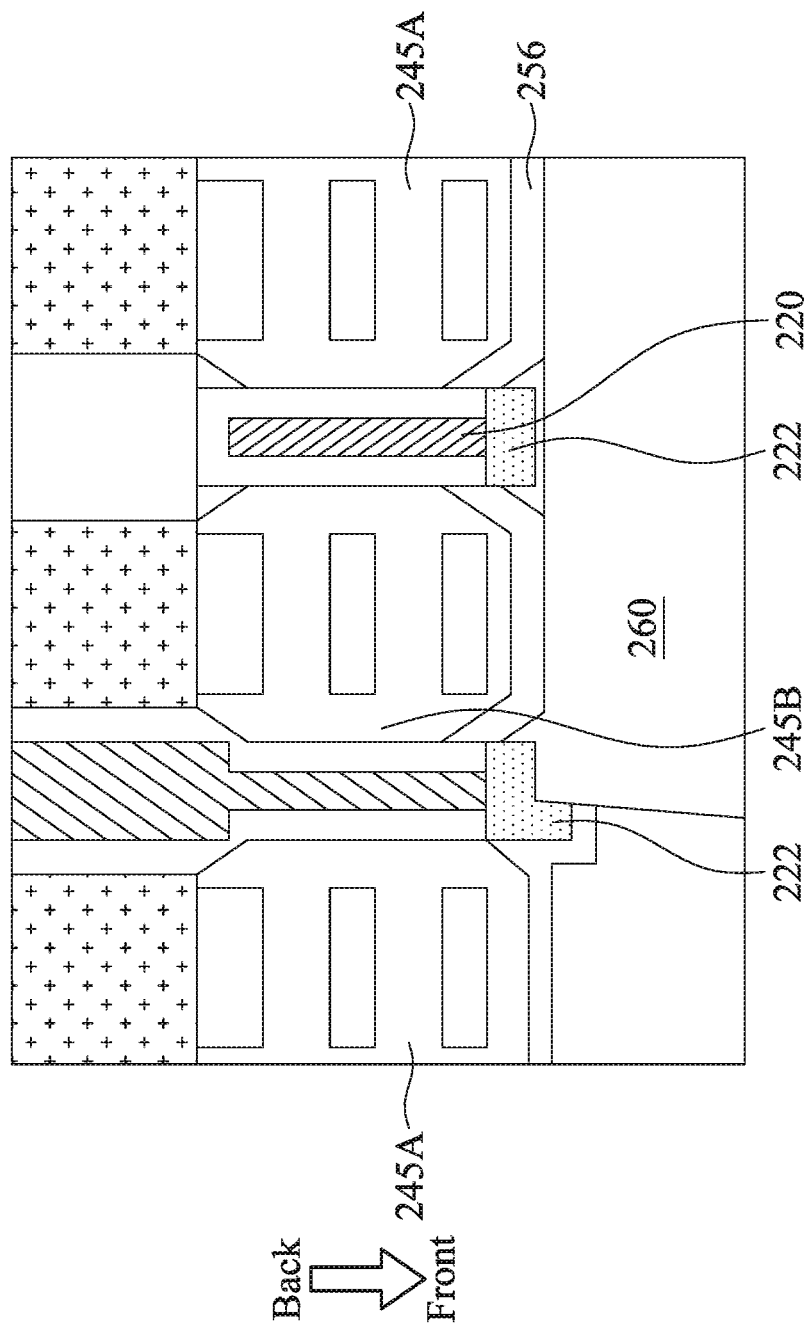
Figures 1, 26B:
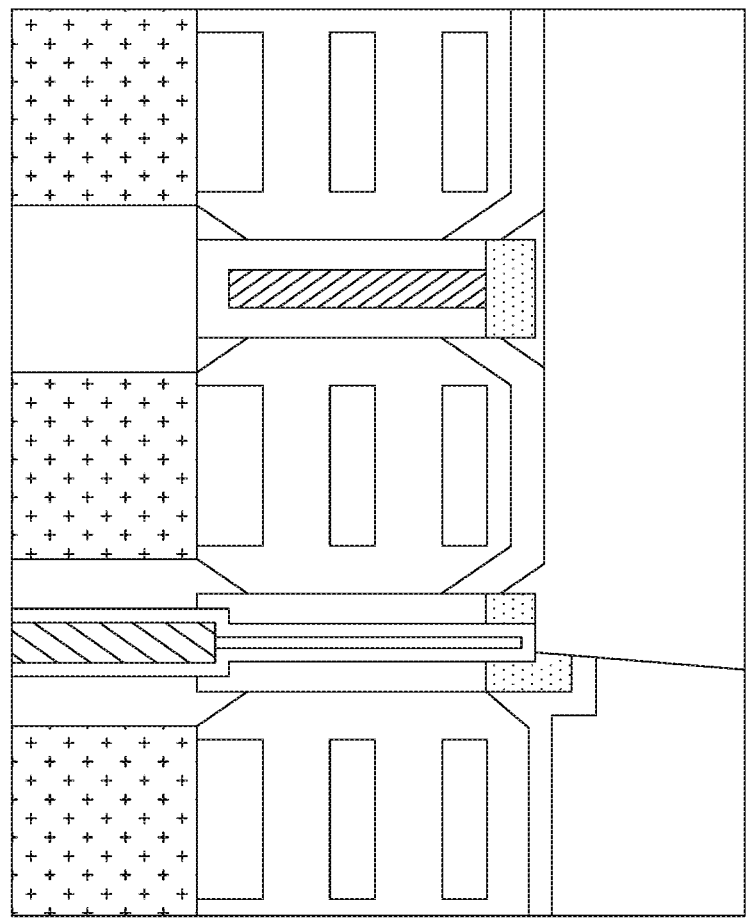
Figure 26C:
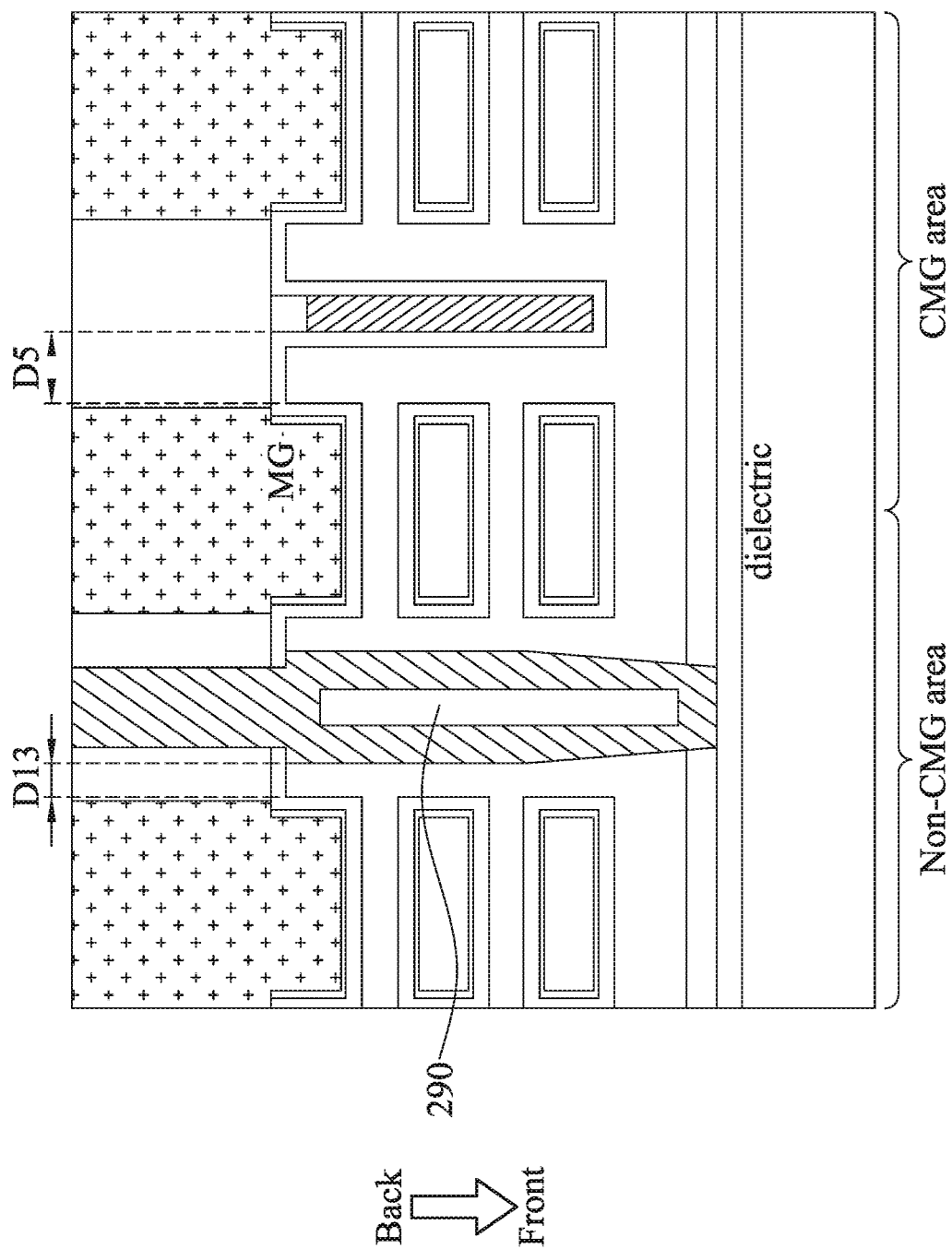

In some embodiments, referring to FIGS. 26A-26C, the dielectric material of the gate cut feature 288 caps an air gap (or void) 290 within the gate cut feature 288. The deposition of the dielectric material of the gate cut feature 288 may also be referred to as a capping process. In an embodiment, the dielectric material of the gate cut feature 288 is deposited by a PECVD process, which is easier to have depositing dielectric materials merge on top of a narrow opening. The parameters in the PECVD process (e.g., pressure, temperature, and gas viscosity) are tuned in a way such that the gap fill behavior of depositing dielectric materials maintains the air gap 290 without entirely filling the gate cut opening 286. In the present embodiment, the PECVD process employs a setting with pressure less than about 0.75 torr and temperature higher than about 75° C. Hence, the dielectric material of the gate cut feature 288 may enclose the gate cut opening 286 without entirely filling a lower portion of the cut opening 286, thereby forming the air gap 290. In some embodiments, the air gap 290 may have a width D14. For example, the width D14 may be about 0.1 nm to about 5 nm. In some embodiments, a ratio of the width D14 of the air gap 290 to the width t4 of the cut feature 288 may be about 1:50 to about 1:1.2. The air gap 290 may extend continuously from a channel region to abutting source/drain regions, providing isolation between adjacent gate segments 250-1/250-2 and also between adjacent source/drain features. A gas, such as a gas(es) used during the deposition of the dielectric material of the gate cut feature 288 or any other species that can diffuse into the air gap 290, may be in the air gap 290. Alternatively, in some embodiments, the air gap 290 may be omitted, for example, to provider stronger structural support.

In some embodiments, the air gap 290 vertically extend across majority of the height of the gate electrode layer 255. For example, as described above, the gate electrode layer 255 may have a height H1 (as measured between the vertical distance between the bottom surface of the gate dielectric layer 254 and the bottom surface of the gate electrode capping layer 253). In some embodiments, the height H1 may be about 28 nm to about 60 nm. The air gap may have a height H2. In some embodiments, the height H2 may be about 15 nm to about 60 nm. A ratio of the height H2 to the height H1 may be about 50% to about 95%. In some embodiments, the air gap 290 extends across the height dimensions of all the suspended channel layers. For example, the bottommost channel layer 208 may have a bottom surface 310, and the topmost channel layer 208 may have a top surface 312. Both the surfaces 310 and 312 are between the bottom surface 320 and the top surface 322 of the air gaps 290. As compared to other approaches where the air gap 290 has smaller heights, the depicted configuration of FIG. 26A further reduces the capacitance and improves device performances. In some embodiments, referring to FIG. 26B, the air gap 290 is confined within the gate regions. Alternatively, referring to FIG. 26B-1, the air gap 290 further extend into the source/drain regions. In some embodiments, this configuration reduces the capacitance in the source/drain regions and also improves device characteristics.

Figure 27:
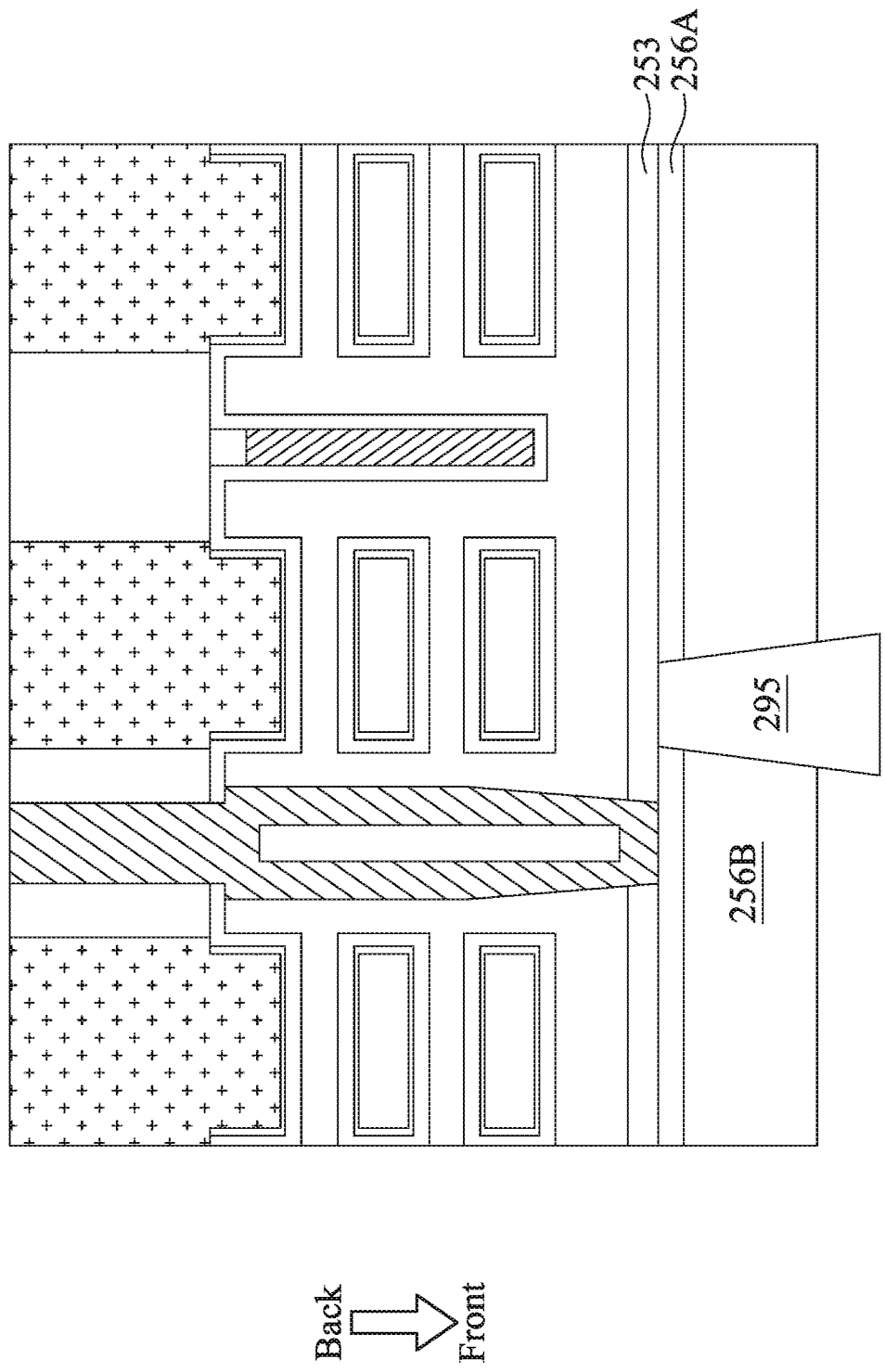

Referring to FIGS. 1C and 27, the method 100 includes a block 154 where a gate via 295 is formed from the front side of the device. For example, the gate via 295 extends through the gate SAC dielectric layers 256B, 256A to reach the gate electrode cap layer 253. Referring to FIG. 1C, the method 100 includes a block 156 where additional device features may be formed. For example, source vias, drain vias, metal lines, passivation layers may be formed to complete the fabrication of the device 200.

As can be seen from the disclosure above, a semiconductor device is provided which includes a gate cut feature 288 that isolates adjacent gate structure portions 250'-1 and 250'-2. The gate cut feature 288 has increased width as compared to hybrid fin structures 224, and in some embodiments may cap an air gap. These characteristics allows reduction in parasitic capacitance. The gate cut feature may extend to or beyond the gate SAC dielectric layers, and may have different profiles. The hybrid fin structure between adjacent channel layers are laterally recessed such that endcap distance between the recessed hybrid fin structure and the channel layers are increased. This improves material flow and reduces defects. Moreover, in some embodiments, the recessed hybrid fin structure has a front-facing surface that directly interfaces with the gate structure. Accordingly, the height of the gate portion at the hybrid fin structure location is increased as compared to some other approaches. This maximizes the conductive pathway and reduces gate resistance. Furthermore, methods of the present disclosure form gate cut features from a backside of a workpiece. Using structures on the backside of the workpiece, the formation of the gate cut opening of the present disclosure is self-aligned and does not rely on high resolution or high overlay precision of the photolithography process. Additional advantages may include increased processing window and easy integration with power rail on the backside of the cell. Performance gains are thereby achieved by implementing the methods described herein. For example, in some embodiments, the power efficiency (Peff) gain is greater than 5%.

In one exemplary aspect, the present disclosure is directed to a semiconductor device. The semiconductor device includes nanostructures vertically arranged and spaced apart from one another along a first direction. The semiconductor device also includes a dielectric fin structure of a dielectric material of uniform composition and an isolation structure on opposite sides of the nanostructures. Moreover, the semiconductor device also includes a gate structure wrapping around the nanostructures. The gate structure extends between the nanostructure and the dielectric fin structure, and extends between the nanostructures and the isolation structure. Furthermore, the nanostructures are spaced apart from the dielectric fin structure along a second direction perpendicular to the first direction by a first distance, and from the isolation structure along the second direction by a second distance, where the first distance is greater than the second distance. Additionally, the gate structure interfaces with the dielectric fin structure on a surface extending perpendicular to the first direction.

In some embodiments, the isolation structure extends from above a top surface of the gate structure to below a bottom surface of the gate structure along the first direction. In some embodiments, the dielectric material has a k constant less than about 7, and the surface is a surface of the dielectric material. In some embodiments, the semiconductor device further includes a dielectric layer that interfaces with the isolation structure and on a first surface of the gate structure. In some embodiments, the isolation structure includes an air gap. In some embodiments, the air gap extends a first vertical height along the first direction, the gate structure extends a second vertical height along the first direction, and a ratio of the first vertical height to the second vertical height is about 50% to about 95%. In some embodiments, the gate structure includes a gate dielectric layer and a gate electrode layer, where the gate electrode layer interfaces with the isolation structure but not with the dielectric fin structure. In some embodiments, the semiconductor device further includes a source/drain feature connected to the nanostructures. The source/drain feature is vertically between a conductive material and a dielectric base layer, where the dielectric base layer is aligned with the nanostructures along the first direction.

In one exemplary aspect, the present disclosure is directed to a method. The method includes receiving a workpiece having a frontside and a backside. The workpiece includes a first plurality of semiconductor layers over a first base portion on a frontside surface of a substrate and a second plurality of semiconductor layers over a second base portion on the frontside surface of the substrate. The workpiece also includes a first dielectric feature and a second dielectric feature. The first dielectric feature is on a first side of the first plurality of the semiconductor layers and between the first plurality of the semiconductor layers and the second plurality of the semiconductor layers. The second dielectric feature is on a second side of the first plurality of the semiconductor layers, the second side being opposite to the first side, and the second dielectric feature having a feature surface facing the frontside. The method also includes forming a gate structure engaging the first plurality of semiconductor layers and the second plurality of semiconductor layers and interfacing with the first dielectric feature on the feature surface. The method further includes replacing the first base portion and the second base portion to form a first backside dielectric and a second backside dielectric, respectively. Moreover, the method includes removing the first dielectric feature but not the second dielectric feature, thereby forming an opening between the first plurality of semiconductor layers and the second plurality of semiconductor layers. Furthermore, the method includes recessing the gate structure from the opening to form a gate cut opening, where the gate cut opening extends from a front surface of the gate structure to a back surface of the gate structure. Additionally, the method includes forming a third dielectric feature in the gate cut opening.

In some embodiments, the workpiece includes sacrificial layers interposing between vertically adjacent layers of the first plurality of semiconductor layers and between vertically adjacent layers of the second plurality of semiconductor layers. The workpiece also incldues a fourth dielectric feature on the first dielectric feature. Moreover, the method further includes forming a sacrificial gate structure covering the first plurality of the semiconductor layers and the second plurality of the semiconductor layers and a portion of the fourth dielectric feature. The method also includes forming source/drain features on both sides of the sacrificial gate structure, recessing the sacrificial gate structure to expose a top and side surfaces of the fourth dielectric feature, recessing an exposed portion of the fourth dielectric feature to expose a top surface of the first dielectric feature, removing the sacrificial layers to form gaps between adjacent layers of the first plurality of semiconductor layers and between adjacent layers of the second plurality of semiconductor layers, and forming the gate structure in the gaps. In some embodiments, the receiving of the workpiece includes receiving the workpiece having a fifth dielectric feature on a first sidewall of the first dielectric feature and a sixth dielectric feature on a second sidewall of the second dielectric feature. Moreover, the method further includes removing the fifth dielectric feature and the sixth dielectric feature, where the forming of the gate structure includes forming the gate structure on the first sidewall and on the second sidewall. In some embodiments, the first dielectric feature and the second dielectric feature include a first dielectric material, and the fourth dielectric feature include a second dielectric material. The first dielectric material has a k value less than about 7, and the second dielectric material has a k value greater than about 7. In some embodiments, the forming of the sacrificial gate structure includes forming a sacrificial dielectric layer on a front-facing surface of the first plurality of semiconductor layers. Moreover, the recessing of the sacrificial gate structure includes removing a first portion of the sacrificial gate structure without exposing the front-facing surface. Furthermore, the method includes removing a remaining portion of the sacrificial gate structure after the recessing of the fourth dielectric feature. In some embodiments, the forming of the third dielectric feature includes configuring the third dielectric feature to include an air gap. In some embodiments, the forming of the gate structure includes forming a gate dielectric layer surrounding the semiconductor layers and surrounding the first and the second dielectric features, and forming a gate electrode surrounding the gate dielectric layer. Moreover, the recessing of the gate structure includes recessing a portion of the gate dielectric layer surrounding the first dielectric feature thereby exposing a side surface of the gate electrode, and recessing the gate electrode from the exposed side surface. In some embodiments, the removing of the first dielectric feature includes forming a patterned mask element on a back-facing surface of the workpiece with an opening aligned with the first dielectric feature, removing an isolation feature between the first backside dielectric and the second backside dielectric to form a backside trench, forming a liner layer on sidewall surfaces of the backside trench, and etching the first dielectric feature using the liner layer as a mask. In some embodiments, the receiving of the workpiece includes receiving the workpiece having a contact feature interfacing with one of the source/drain features. The method further includes recessing the fourth dielectric feature to expose a back-facing surface of the contact feature. The forming of the third dielectric feature includes forming the third dielectric feature on the exposed back-facing surface of the contact feature.

In one exemplary aspect, the present disclosure is directed to a method. The method includes receiving a workpiece having a frontside and a backside facing away from each other along a vertical direction. The workpiece includes a first stack of semiconductor layers over a first base portion on a frontside surface of a substrate and a second stack of semiconductor layers over a second base portion on the frontside surface of the substrate, where the first stack and the second stack each include first semiconductor layers and second semiconductor layers vertically arranged interleavingly. The first stack and the second stack each extend lengthwise along a first direction. An isolation feature interposes between the first base portion and the second base portion. The method also includes forming a hybrid structure between sidewall surfaces of the first stack and the second stack and on a first surface of the isolation feature, where the hybrid structure includes a first low-k dielectric layer wrapped by a first high-k dielectric layer, and a second high-k dielectric layer on the first low-k dielectric layer and on the first high-k dielectric layer. The method further includes forming a first gate stack on the first stack and the second stack along a second direction perpendicular to the first direction, where the first gate stack covers a portion of the second high-k dielectric layer. Moreover, the method includes forming source/drain features on both sides of the first gate stack, recessing a portion of the second high-k dielectric layer not covered by the first gate stack, selectively removing the second semiconductor layers, and recessing the first high-k dielectric layer on sidewall surfaces of the first low-k dielectric layer. Furthermore, the method includes forming a gate dielectric layer surrounding the first semiconductor layers and surrounding the first low-k dielectric layer, a gate electrode layer surrounding the gate dielectric layer, and a gate cap covering the gate electrode layer. Additionally, the method includes replacing the first base portion and the second base portion from the backside to form a backside dielectric layer, and forming a gate cut feature extending vertically through the backside dielectric layer, through the gate electrode layer, and through the gate cap.

In some embodiments, the method further includes, after the selectively removing of the second semiconductor layers, removing the recessed portion of the second high-k dielectric layer. Moreover, the forming of the gate cut feature includes removing the isolation feature thereby exposing sidewalls of the backside dielectric layer, removing the first low-k dielectric layer to form a gate cut opening, where the gate cut opening exposes a portion of the gate dielectric layer, recessing the exposed portion of the gate dielectric layer thereby exposing a portion of the gate electrode layer, laterally and vertically recessing the gate electrode layer to expand and extend the gate cut opening, where the gate cut opening extending through the gate cap, and forming a second low-k dielectric layer in the extended gate cut opening. In some embodiments, the method further includes, after the forming of the gate dielectric layer, the gate electrode layer and the gate cap, bonding a frontside of the workpiece to a carrier wafer, and before the recessing of the backside of the workpiece, flipping the workpiece upside down.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first dielectric layer;
    a stack of semiconductor layers disposed over the first dielectric layer;
    a gate structure wrapping around each of the semiconductor layers and extending lengthwise along a direction; and
    a dielectric fin structure and an isolation structure disposed on opposite sides of the stack of semiconductor layers and embedded in the gate structure,
    wherein the dielectric fin structure has a first width along the direction smaller than a second width of the isolation structure along the direction,
    wherein the isolation structure includes:
        a second dielectric layer extending through the gate structure and the first dielectric layer, and
        a third dielectric layer extending through the first dielectric layer and disposed on a bottom surface of the gate structure and a sidewall of the first dielectric layer.

2. The semiconductor device of claim 1, wherein a first distance between the stack of semiconductor layers and the dielectric fin structure is greater than a second distance between the stack of semiconductor layers and the isolation structure along the direction.

3. The semiconductor device of claim 1, further comprising a fourth dielectric layer disposed over the gate structure, wherein the second dielectric layer further extends into the fourth dielectric layer.

4. The semiconductor device of claim 1, wherein the gate structure includes a gate dielectric layer disposed over the each of the semiconductor layers and a gate electrode disposed over the gate dielectric layer,
    wherein the dielectric fin structure is in direct contact with the gate dielectric layer, and
    wherein the isolation structure is in direct contact with the gate electrode.

5. The semiconductor device of claim 1, wherein the second dielectric layer includes a first sublayer and a second sublayer,
    wherein the first sublayer directly contacts the gate structure and the third dielectric layer, and
    wherein the second sublayer is separated from the gate structure and the third dielectric layer by the first sublayer.

6. The semiconductor device of claim 1, wherein the isolation structure further includes a fourth dielectric layer disposed over the second dielectric layer and the third dielectric layer.

7. The semiconductor device of claim 6, further comprising:
    a conductive feature disposed over and in contact with a top surface of the fourth dielectric layer.

8. The semiconductor device of claim 1, wherein the stack of semiconductor layers is a first stack of semiconductor layers,
    wherein the semiconductor device further comprises:
        a second stack of semiconductor layers adjacent the first stack of semiconductor layers, a first source/drain feature connected to the first stack of semiconductor layers, and a second source/drain feature connected to the second stack of semiconductor layers, wherein the isolation structure is disposed between the first stack of semiconductor layers and the second stack of semiconductor layers, wherein the second width of the isolation structure expand between the gate structure, and wherein the isolation structure has a third width expanding between the first source/drain feature and the second source/drain feature, the third width being smaller than the second width.

9. A semiconductor device, comprising:

a stack of nanostructures;

a dielectric fin structure and an isolation structure sandwiching the stack of nanostructures along a direction; and a gate structure wrapping around the stack of nanostructures and extending between the dielectric fin structure and the isolation structure, wherein the isolation structure includes a first dielectric layer and two second dielectric layers, wherein the first dielectric layer includes a first portion interposed between the two second dielectric layers along the direction and a second portion extending through the gate structure, and wherein the first portion has a first width, the second portion has a second width greater than the first width, the first width and the second widths being along the direction.

10. The semiconductor device of claim 9, wherein the gate structure includes a gate dielectric layer and a gate electrode disposed over the gate dielectric layer, wherein a sidewall of the isolation structure directly contacts both the gate dielectric layer and the gate electrode.

11. The semiconductor device of claim 9, wherein the second portion includes a top section having a third width along the direction and a bottom section having the second width, and wherein the third width is smaller than the second width.

12. The semiconductor device of claim 9, wherein a first distance between the dielectric fin structure and the stack of nanostructures is greater than a second distance between the isolation structure and the stack of nanostructures.

13. The semiconductor device of claim 9, wherein the two second dielectric layers each directly contact a bottom surface of the gate structure and a bottom surface of the second portion of the first dielectric layer.

14. The semiconductor device of claim 9, wherein the isolation structure further includes an air gap embedded in the first dielectric layer.

15. The semiconductor device of claim 9, further comprising a third dielectric layer disposed over a top surface of the gate structure, wherein the isolation structure extends through the third dielectric layer.

16. A semiconductor device, comprising:

a stack of semiconductor layers;

a gate structure wrapping around each layer of the stack of semiconductor layers and extending lengthwise along a direction; and a dielectric fin structure and an isolation structure disposed on opposite sides of the stack of semiconductor layers and in contact with the gate structure, wherein the isolation structure includes a top portion extending through the gate structure and a bottom portion contacting a bottom surface of the gate structure, wherein the top portion has a first width and a second width along the direction, the second width being greater than the first width, and wherein the bottom portion has a third width along the direction, the third width being greater than the second width.

17. The semiconductor device of claim 16, wherein the isolation structure includes an air gap within the isolation structure.

18. The semiconductor device of claim 16, wherein the bottom portion of the isolation structure includes a first dielectric layer and a second dielectric layer disposed on sidewalls of the first dielectric layer, and wherein the first dielectric layer of the bottom portion of the isolation structure and the top portion of the isolation structure includes a same dielectric material.

19. The semiconductor device of claim 16, further comprising a dielectric layer disposed directly under the stack of semiconductor layers and in direct contact with the gate structure.

20. The semiconductor device of claim 16, wherein the gate structure includes a gate dielectric layer and a gate electrode disposed over the gate dielectric layer, and wherein the top portion of the isolation structure is in contact with a top surface of the gate dielectric layer.

* * * * *